(12) United States Patent
Fukasawa et al.

(10) Patent No.: US 9,960,120 B2
(45) Date of Patent: May 1, 2018

(54) WIRING SUBSTRATE WITH BURIED SUBSTRATE HAVING LINEAR CONDUCTORS

(71) Applicant: SHINKO ELECTRIC INDUSTRIES CO., LTD., Nagano-shi, Nagano (JP)

(72) Inventors: Ryo Fukasawa, Nagano (JP); Sumihiro Ichikawa, Nagano (JP); Michio Horiuchi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days. days.

(21) Appl. No.: 15/083,926

(22) Filed: Mar. 29, 2016

(65) Prior Publication Data

US 2016/0293535 A1    Oct. 6, 2016

(30) Foreign Application Priority Data

Mar. 31, 2015 (JP) .................................. 2015-070694
Jan. 28, 2016 (JP) .................................. 2016-014736

(51) Int. Cl.
*H01L 23/538* (2006.01)
*H01L 23/498* (2006.01)
(Continued)

(52) U.S. Cl.
CPC ........ *H01L 23/5385* (2013.01); *H01L 23/145* (2013.01); *H01L 23/15* (2013.01); *H01L 23/49827* (2013.01); *H01L 23/49838* (2013.01); *H01L 23/538* (2013.01); *H01L 23/5384* (2013.01); *H01L 23/5386* (2013.01); *H01L 23/3677* (2013.01); *H01L 23/49816* (2013.01);
(Continued)

(58) Field of Classification Search
CPC ......... H01L 23/49827; H01L 21/76831; H01L 23/49833; H01L 23/15; H01L 23/145; H01L 23/5385; H01L 23/5384; H01L 23/498; H01L 23/538
See application file for complete search history.

(56) References Cited

U.S. PATENT DOCUMENTS 9,305,877 B1 * 4/2016 Yu ....................... H01L 23/5226
2010/0300602 A1 * 12/2010 Ichiyanagi ............. H01G 4/232
156/89.12
(Continued)

FOREIGN PATENT DOCUMENTS

JP     2012-074536     4/2012

*Primary Examiner* — Daniel Luke
(74) *Attorney, Agent, or Firm* — Rankin, Hill & Clark LLP

(57) ABSTRACT

A wiring substrate includes a buried substrate disposed within a through-hole penetrating through a resin substrate of a core layer and including a plate-like body and a plurality of linear conductors penetrating the plate-like body, a first insulating layer covering a first surface of the resin substrate, a first wiring layer including a first pad pattern formed on a first surface of the buried substrate and a first wiring pattern formed on a first surface of the first insulating layer, and a third wiring pattern formed on the first surface of the resin substrate and covered by the first insulating layer. In the plurality of linear conductors, a gap between the adjacent linear conductors is smaller than a diameter of each of the linear conductors. The third wiring pattern is formed so as to have a thickness thicker than a thickness of the first wiring pattern.

10 Claims, 32 Drawing Sheets

(51) Int. Cl.
  *H01L 23/15* (2006.01)
  *H01L 23/14* (2006.01)
  *H01L 23/544* (2006.01)
  *H01L 23/367* (2006.01)
  *H01L 25/065* (2006.01)

(52) U.S. Cl.
  CPC .. *H01L 23/49822* (2013.01); *H01L 23/49833* (2013.01); *H01L 23/5387* (2013.01); *H01L 23/544* (2013.01); *H01L 25/0657* (2013.01); *H01L 2223/54426* (2013.01); *H01L 2224/08113* (2013.01); *H01L 2224/1312* (2013.01); *H01L 2224/13111* (2013.01); *H01L 2224/13116* (2013.01); *H01L 2224/13139* (2013.01); *H01L 2224/13147* (2013.01); *H01L 2224/16141* (2013.01); *H01L 2224/16227* (2013.01); *H01L 2224/16238* (2013.01); *H01L 2224/32141* (2013.01); *H01L 2224/32225* (2013.01); *H01L 2224/73204* (2013.01); *H01L 2225/06506* (2013.01); *H01L 2225/06517* (2013.01); *H01L 2225/06548* (2013.01); *H01L 2225/06572* (2013.01); *H01L 2924/15311* (2013.01); *H01L 2924/15321* (2013.01)

(56) References Cited

U.S. PATENT DOCUMENTS

| | | | |
|---|---|---|---|
| 2011/0018144 A1* | 1/2011 | Horiuchi | H01L 23/49827 257/784 |
| 2011/0175235 A1* | 7/2011 | Horiuchi | H01L 23/49811 257/774 |
| 2011/0220404 A1* | 9/2011 | Yamasaki | H01L 21/486 174/261 |
| 2013/0074332 A1* | 3/2013 | Suzuki | H05K 3/4602 29/834 |
| 2013/0264101 A1* | 10/2013 | Furuichi | H05K 1/115 174/251 |

* cited by examiner

WIRING SUBSTRATE WITH BURIED SUBSTRATE HAVING LINEAR CONDUCTORS

CROSS-REFERENCE TO RELATED APPLICATION

The present application claims priorities from Japanese Patent Application No. 2015-070694 filed on Mar. 31, 2015 and Japanese Patent Application No. 2016-014736 filed on Jan. 28, 2016, the entire contents of which are incorporated herein by reference.

BACKGROUND

Technical Field

The present invention relates to a wiring substrate and a semiconductor package.

Related Art

There is known a wiring substrate in which a through-hole is provided in a core substrate, and a ceramic substrate is buried within the through-hole. In this wiring substrate, a build-up layer in which a wiring layer and an insulating layer are alternately provided can be formed on the upper and lower surfaces of the core substrate and the ceramic substrate, and a semiconductor chip can be mounted on the uppermost wiring layer. In the ceramic substrate, plural through-wirings are formed, and the wiring layer on the upper surface side and the wiring layer on the lower surface side are connected to each other via the through-wiring.

[Patent Document 1] Japanese Patent Application Publication No. 2012-74536A

However, it is difficult to realize pitch-narrowing of the through-wiring formed in the ceramic substrate. In addition, assuming that the pitch-narrowing could be realized, it would be needed to achieve position adjustment with high precision on the occasion of disposing the ceramic substrate in the through-hole of the core substrate.

SUMMARY

Exemplary embodiments of the invention provide a wiring substrate which does not require the position adjustment of a buried substrate relative to a core substrate.

A wiring substrate according to an exemplary embodiment, comprises:

a core layer including a resin substrate and a through-hole penetrating through the resin substrate in a thickness direction;

a buried substrate including a plate-like body and a plurality of linear conductors penetrating the plate-like body in a thickness direction, the buried substrate being disposed within the through-hole of the core layer;

a first insulating layer covering a first surface of the resin substrate;

a first pad pattern formed on a first surface of the buried substrate; and a third wiring pattern formed on the first surface of the resin substrate and covered by the first insulating layer, wherein in the plurality of linear conductors, a gap between the adjacent linear conductors is smaller than a diameter of each of the linear conductors, and the third wiring pattern is formed so as to have a thickness thicker than a thickness of the first pad pattern.

According to the disclosed technologies, it is possible to provide a wiring substrate which does not require the position adjustment of a buried substrate relative to a core substrate.

DETAILED DESCRIPTION

Embodiments for carrying out the present invention are hereunder described by reference to the accompanying drawings. It is to be noted that in the respective drawings, the same constituent portions are designated with the same symbols, and there may be the case where redundant explanations are omitted.

First Embodiment

[Structure of Wiring Substrate According to First Embodiment]

Figure 1A:
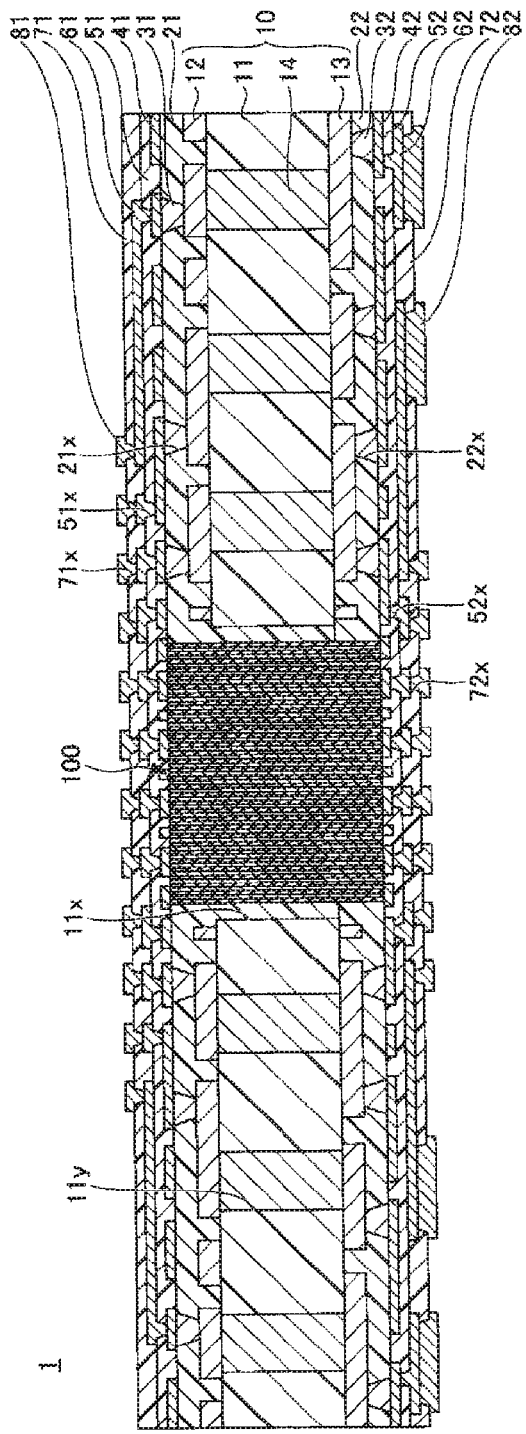
FIGS. 1A to 1B are cross-sectional views illustrating a wiring substrate according to a first embodiment.
Figure 1B:
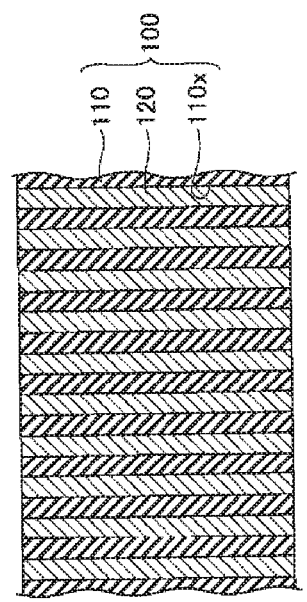

First of all, a structure of a wiring substrate according to a first embodiment is described. FIGS. 1A to 1B are cross-sectional views illustrating a wiring substrate according to the first embodiment, in which FIG. 1B is an enlarged view of a buried substrate 100 of FIG. 1A.

Reference is made to FIGS. 1A to 1B. A wiring substrate 1 includes a core layer 10, insulating layers 21 and 22, via wirings 31 and 32, wiring patterns 41 and 42, insulating layers 51 and 52, wiring layers 61 and 62, insulating layers 71 and 72, wiring layers 81 and 82, and a buried substrate 100.

It is to be noted that in the present embodiment, for the sake of convenience, the side of the wiring layer 81 of the wiring substrate 1 is positioned on the upper side or first surface side, and the side of the wiring layer 82 is positioned on the lower side or the second surface side. In addition, the surface of the side of the wiring layer 81 of each site is positioned on the upper surface or first surface, and the surface of the side of the wiring layer 82 is positioned on the lower surface or second surface. However, the wiring substrate 1 may be used in a top/bottom reversed state, or it may be disposed at an arbitrary angle. In addition, the planar view refers to the matter that an object is viewed from a normal direction of the upper surface of the core substrate 10, and the planar shape refers to a shape in which the object is viewed from the normal direction of the upper surface of the core substrate 10.

The core substrate 10 includes a resin substrate 11, a wiring pattern 12, a wiring pattern 13, and a through-wiring 14. In the core substrate 10, the resin substrate 11 is, for example, formed in a rectangular shape in terms of its planar shape, and a through-hole 11x penetrating in a thickness direction is formed. The through-hole 11x is a portion in which the buried substrate 100 is disposed. In addition, the wiring pattern 12 is formed on the upper surface of the resin substrate 11, and the wiring pattern 13 is formed on the lower surface thereof. The wiring pattern 12 and the wiring pattern 13 are electrically connected to each other via the through-wiring 14 in which a through-hole 11y penetrating through the resin substrate is filled. The wiring pattern 12 is one of representative examples of a third wiring pattern according to the present invention, and the wiring pattern 13 is one of representative examples of a fourth wiring pattern according to the present invention.

It is to be noted that an arbitrary number of layers of multi-layered wiring layers including the wiring patterns 12 and 13 may be formed on the upper surface and the lower surface of the resin substrate 11, respectively. Though the number of wiring layers on the upper surface side of the core substrate 10 and the number of wiring layers on the lower surface side thereof may not be identical with each other, it is preferred that the number of wiring layers on the upper surface side of the core substrate 10 and the number of wiring layers on the lower surface side thereof are identical with each other from the standpoint of suppression of a warp of the core substrate 10 or easiness of manufacture. The number of wiring layers of the core substrate 10 can be freely chosen within the range satisfying a relation: (thickness of the core substrate 10)+(thickness of the insulating layer required on the core substrate 10)×2 (for the both surfaces)=(thickness of the buried substrate 100).

As the resin substrate 11, for example, a so-called glass-epoxy substrate in which a thermosetting epoxy-based resin or the like is impregnated in a reinforcing member, such as glass fibers, or the like may be used. A thickness of the resin substrate 11 may be, for example, about 40 to 180 μm. However, the resin substrate 11 may not have a reinforcing member. As a material of each the wiring patterns 12 and 13 and the through-wiring 14, for example, copper (Cu) or the like may be used. A thickness of each of the wiring patterns 12 and 13 may be, for example, about 10 to 20 μm.

The buried substrate 100 is disposed within the through-hole 11x of the resin substrate 11. The buried surface 100 is provided with a plate-like body 110 made of aluminum oxide and plural linear conductors 120 penetrating the plate-like 110 in a thickness direction. The linear conductors 120 are a portion formed by filling a metal material in a large number of through-holes 110x penetrating through the entirety of the plate-like body 110 in the thickness direction. A thickness of the buried substrate 100 may be, for example, about 50 to 200 μm.

It is to be noted that the plate-like body 110 may also be formed of other material than aluminum oxide. The plate-like body 110 may be, for example, formed of silicon oxide, mullite, aluminum nitride, glass ceramics (composite material of glass and ceramics), barium strontium titanate, barium titanate, strontium titanate, titanium zirconium, or the like.

It is preferred that the linear conductors 120 are densely formed to such extent that a gap between the adjacent linear conductors 120 is smaller than a diameter of each of the linear conductors 120. The linear conductors 120 may be, for example, formed in a density of $4 \times 10^6$ conductors per $mm^2$ or more and $1 \times 10^{10}$ conductors per $mm^2$ or less. However, the disposition form of the linear conductors 120 is not particularly limited, and for example, the linear conductors 120 may be disposed in a hexagonal state or may be disposed in a grid state. As the metal material capable of forming the linear conductor 120, for example, copper (Cu), silver (Ag), nickel (Ni), or the like may be used.

In the linear conductor 120, its upper end surface is exposed from the upper surface of the plate-like body 110, and its lower end surface is exposed from the lower surface of the plate-like body 110. The respective linear conductors 120 are formed approximately parallel to each other at approximately fixed intervals over the approximately entire surface of the plate-like body 110. The linear conductor 120 may be, for example, formed in a circular shape in planar view, and its diameter may be, for example, about 50 nm to 2 μm. However, it should be construed that the "circular shape in planar view" as referred to herein includes not only the case of a strictly circular shape but also the case of an approximately circular shape.

The upper surface of the plate-like body 110 and the upper end surface of the linear conductor 120 may be, for example, made flush with each other. In addition, the lower surface of the plate-like body 110 and the lower end surface of the linear conductor 120 may be, for example, made flush with each other.

The insulating layer 21 is formed on the upper surface of the resin substrate 11 and covers the wiring pattern 12. The insulating layer 21 covers peripheries of a portion, which is protruded from the core substrate 10, of the buried substrate 100. The insulating layer 21 does not cover the upper surface of the buried substrate 100, and the upper surface of the buried substrate 100 is exposed from the upper surface of the insulating layer 21. The insulating layer 21 has a via hole 21x, and the upper surface of the wiring pattern 12 is exposed within the via hole 21x.

The insulating layer 22 is formed on the lower surface of the resin substrate 11 and covers the wiring pattern 13. The insulating layer 22 covers peripheries of a portion, which is protruded from the core substrate 10, of the buried substrate 100. The insulating layer 22 does not cover the lower surface of the buried substrate 100, and the lower surface of the buried substrate 100 is exposed from the lower surface of the insulating layer 22. The insulating layer 22 has a via hole 22x, and the lower surface of the wiring pattern 13 is exposed within the via hole 22x. The insulating layer 21 is one of representative examples of a first insulating layer according to the present invention, and the insulating layer 22 is one of representative examples of a second insulating layer according to the present invention.

The insulating layer 21 is filled in a gap (space) formed by the side surface (side wall) of the buried substrate 100 and the inner wall surface of the through-hole 11x. However, the insulating layer 22 may be filled in the whole or a part of the gap formed by the side surface of the buried substrate 100 and the inner wall surface of the through-hole 11x.

As a material of each of the insulating layers 21 and 22, for example, a thermosetting insulating resin containing, as a main component, an epoxy-based resin, a phenol-based resin, a polyimide-based resin, acrylic-based resin, vinylester-based resin or the like may be used. Each of the insulating layers 21 and 22 may contain a filler, such as silica ($SiO_2$). In addition, the thermosetting insulating resin which is used for the insulating layers 21 and 22 may be a non-photosensitive insulating resin and may also be a photosensitive insulating resin. In addition, with respect to each of the insulating layers 21 and 22, for the purpose of relieving the stress, plural insulating resins having a different elastic modulus from each other may also be laminated. A thickness of each of the insulating layers 21 and 22 may be properly determined depending upon the thickness of the wiring patterns 12 and 13 to be formed on the upper surface and the lower surface of the resin substrate 11, respectively or the multi-layered wiring layer.

The via wiring 31 fills the inside of the via hole 21x and is electrically connected to the wiring pattern 12 exposing within the via hole 21x. The upper surface of the via wiring 31, the upper surface of the insulating layer 21, and the upper surface of the buried substrate 100 can be, for example, made flush with each other (in the same plane) by polishing. The via wiring 32 fills the inside of the via hole 22x and is electrically connected to the wiring pattern 13 exposing within the via hole 22x. The lower surface of the via wiring 32, the lower surface of the insulating layer 22, and the lower surface of the buried substrate 100 can be, for example, made flush with each other by polishing. As a material of each of the via wirings 31 and 32, for example, copper (Cu) or the like may be used. A height of each of the via wirings 31 and 32 may be, for example, about 10 to 20 μm.

In this way, by flattening each of the upper surface of the via wiring 31, the upper surface of the insulating layer 21, and the upper surface of the buried substrate 100 by polishing, a fine pattern can be easily formed on the flattened surface. In addition, by flattening each of the lower surface of the via wiring 32, the lower surface of the insulating layer 22, and the lower surface of the buried substrate 100 by polishing, a fine pattern can be easily formed on the flattened surface.

The wiring pattern 41 is formed on the flattened surface formed by the upper surface of the via wiring 31, the upper surface of the insulating layer 21, and the upper surface of the buried substrate 100. A part of the wiring pattern 41 is electrically connected to the wiring pattern 12 via the via wiring 31. The wiring pattern 42 is formed on the flattened surface formed by the lower surface of the via wiring 32, the lower surface of the insulating layer 22, and the lower surface of the buried substrate 100. A part of the wiring pattern 42 is electrically connected to the wiring pattern 13 via the via wiring 32. As a material of each of the wiring patterns 41 and 42, for example, copper (Cu) or the like may be used. A thickness of each of the wiring patterns 41 and 42 may be, for example, about 1 to 10 μm. The wiring pattern 41 is one of representative examples of a first wiring pattern according to the present invention, and the wiring pattern 42 is one of representative examples of a second wiring pattern according to the present invention.

The wiring pattern 41 formed on the upper surface of the buried substrate 100 and the wiring pattern 42 formed on the lower surface of the buried substrate 100 are disposed opposite to each other via the buried substrate 100. The wiring pattern 41 formed on the upper surface of the buried substrate 100 is a pad pattern (first pad pattern) and is connected directly to the upper end surfaces of the plural linear connectors 120. In addition, the wiring pattern 42 formed on the lower surface of the buried substrate 100 is a pad pattern (second pad pattern) and is connected directly to the lower end surfaces of the plural linear connectors 120. One pad constituting the wiring pattern 41 and one pad constituting the wiring pattern 42 disposed opposite thereto are electrically connected to each other via the plural linear connectors 120. It is to be noted that there may be the case where a combination of the via wiring 31 with the wiring pattern 41 including the pad pattern (first pad pattern) is called a first wiring layer. In addition, there may be the case where a combination of the via wiring 32 with the wiring pattern 42 including the pad pattern (second pad pattern) is called a second wiring layer.

In this way, by forming the pad patterns in the opposing positions on the both surfaces of the buried substrate 100, a vertical transmission path can be formed in the buried substrate 100. In the case where the pad pattern on the buried substrate 100 is made a coaxial pad pattern, by making the vertical transmission path coaxial, it is possible to suppress a cross talk. In this case, the coaxial pad pattern has only to be formed on either one surface of the buried substrate 100. It is to be noted that the details of the coaxial pad pattern are described later.

The insulating layer 51 is formed on the upper surface of the insulating layer 21 and the upper surface of the buried substrate 100 and covers the wiring pattern 41. The insulating layer 51 has a via hole 51x, and the upper surface of the wiring pattern 41 is exposed within the via hole 51x. The insulating layer 52 is formed on the lower surface of the insulating layer 22 and the lower surface of the buried substrate 100 and covers the wiring pattern 42. The insulating layer 52 has a via hole 52x, and the lower surface of the wiring pattern 42 is exposed within the via hole 52x. A thickness of each of the insulating layers 51 and 52 may be, for example, about 3 to 30 μm. A material of each of the insulating layers 51 and 52 may be, for example, the same as in each of the insulating layers 21 and 22. However, when a photosensitive insulating resin is used for the material of each of the insulating layers 51 and 52, the via holes 51x and 52x may be formed by a photolithography method, and hence, such is suitable for the formation of a fine wiring.

The wiring layer 61 is formed on the upper side of the insulating layer 51. The wiring layer 61 is configured to include a via wiring filled within the via hole 51x and a wiring pattern formed on the upper surface of the insulating layer 51. The wiring layer 61 is electrically connected to the wiring pattern 41 via the via hole 51x. The wiring layer 62 is formed on the lower side of the insulating layer 52. The wiring layer 62 is configured to include a via wiring filled within the via hole 52x and a wiring pattern formed on the lower surface of the insulating layer 52. The wiring layer 62 is electrically connected to the wiring pattern 42 via the via hole 52x. A material of each of the wiring layers 61 and 62 and a thickness of each of the wiring patterns constituting the wiring layers 61 and 62, respectively may be, for example, the same as in each of the wiring patterns 41 and 42.

The insulating layer 71 is formed on the upper surface of the insulating layer 51 and covers the wiring layer 61. The insulating layer 71 has a via hole 71x, and the upper surface of the wiring layer 61 is exposed within the via hole 71x. The insulating layer 72 is formed on the lower surface of the insulating layer 52 and covers the wiring layer 62. The insulating layer 72 has a via hole 72x, and the lower surface of the insulating layer 62 is exposed within the via hole 72x. A material and a thickness of each of the insulating layers 71 and 72 may be, for example, the same as in each of the insulating layers 51 and 52.

The wiring layer 81 is an outermost wiring layer formed on the upper side of the insulating layer 71. The wiring layer 81 is configured to include a via wiring filled within the via hole 71x and a wiring pattern formed on the upper surface of the insulating layer 71. The wiring layer 81 is electrically connected to the wiring layer 61 via the via hole 71x. The wiring layer 82 is an outermost wiring layer formed on the lower side of the insulating layer 72. The wiring layer 82 is configured to include a via wiring filled within the via hole 72x and a wiring pattern formed on the lower surface of the insulating layer 72. The wiring layer 82 is electrically connected to the wiring layer 62 via the via hole 72x. A material of each of the wiring layers 81 and 82 and a thickness of each of the wiring patterns constituting the wiring layers 81 and 82, respectively may be, for example, the same as in each of the wiring patterns 41 and 42.

Each of the wiring layer 81 and 82 functions as a pad to be electrically connected to a semiconductor chip or other wiring substrates, or the like. If desired, a metal layer may be formed on each of the upper surface of the wiring layer 81 and the lower surface of the wiring layer 82. In addition, each of the wiring layers 81 and 82 may be subjected to an anti-oxidation treatment, such as an OSP (organic solderability preservative) treatment. It is to be noted that the surface-treated layer to be formed by the OSP treatment is an organic film made of an azole compound, an imidazole compound, or the like.

Examples of the metal layer may include an Au layer, an Ni/Au layer (a metal layer obtained by providing an Ni layer and an Au layer in this order), and an Ni/Pd/Au layer (a metal layer obtained by providing an Ni layer, a Pd layer, and an Au layer in this order). In addition, an external connection terminal, such as a solder ball, may be formed on the upper surface of the wiring layer 81 or the lower surface of the wiring layer 82.

In this way, the wiring substrate 1 has such a structure that the buried substrate 100 provided with the narrow-pitched linear conductors 120 is buried in the resin substrate 11. For that reason, it is possible to provide a wiring substrate having high-density vertical transmission paths in a narrow pitch, which has been considered to be difficultly realized by using only a resin substrate, at low costs.

In addition, as described later, on the occasion of burying the buried substrate 100 in the resin substrate 11, the alignment or position adjustment is not needed, and hence, the burying can be conducted by a simple process, and the wiring substrate 1 can be manufactured at low costs.

In addition, even when the pad disposition of the semiconductor chip to be mounted on the wiring substrate 1 alters, the size or position of the vertical transmission path or the like can be freely changed at a stage of forming a wiring on the buried substrate 100. Namely, since a substrate structure having buried substrate 100 buried in the resin substrate 11 can be commoditized, various kinds of wiring substrates can be manufactured at low costs.

In addition, though the buried substrate 100 provided with the plural linear conductors 120 is fragile, the majority of the wiring substrate 1 is formed of the resin substrate 11, and the buried substrate 100 is formed as a small piece, and hence, the buried substrate 100 is hardly broken. In addition, since the buried substrate 100 is surrounded and protected by the resin substrate 11, and hence, a high strength can be obtained as the whole of the wiring substrate 1. According to this, handling in the manufacturing processes becomes easy, and the related-art manufacturing processes of organic resin substrates can be diverted. Thus, it becomes possible to realize low costs.

In addition, the buried substrate 100 is relatively expensive. However, since the buried substrate 100 is used only partially in the wiring substrate 1, the costs of the whole of the wiring substrate 1 can be suppressed.

In addition, after burying the buried substrate 100 in the resin substrate 11, the insulating layers 21 and 22 on the resin substrate 11 and the buried substrate 100 are polished, thereby forming the surface in a flat surface (same planar surface). Thus, a fine wiring layer can be formed on that flat surface, thereby enabling the planar wiring to have a high density.

In addition, by forming the wiring pattern 12 or the wiring pattern 13, or a multi-layered wiring layer including the same, on the resin substrate 11, it is possible to conduct rewiring in a small number of layers after burying the buried substrate 100. According to this, a risk in which the buried substrate 100 is damaged in the manufacturing processes is reduced. In addition, the number of connection interfaces on the transmission path of the buried substrate 100 can be decreased, and a length of the transmission path becomes short.

In addition, in order to increase the stability, a power source and a ground line are desirably low in resistance, and a wiring thickness is desirably thick. Meanwhile, in order to make the wiring fine, the wiring thickness is advantageously thin. It is needed to provide a fine pattern for connecting the wiring to the pad of the semiconductor chip on the buried substrate 100, and it is difficult to form a thick wiring layer in conformity with the power source system. However, so long as the wiring pattern 12 or the wiring pattern 13, or a multi-layered wiring layer including the same, is formed on the resin substrate 11, and a specification thereof is made suitable for the power source system, it is possible to make both wiring specifications of the power source system and the signal system compatible with each other.

That is, an optimum value in the wiring thickness or insulating layer thickness is different between the wiring of the power source system and the signal wiring. In the wiring substrate 1, it is possible to make wirings of different specifications coexistent within the same substrate in such a manner that a wiring suitable for the power source system ((thick wiring pattern)+(thick insulating layer)) is provided on the core substrate 10, whereas a fine wiring is provided on the buried substrate 100. However, a signal wiring may be formed on a part of the core substrate 10, and a wiring of the power source system may be formed on a part of the buried substrate 100. The description is hereunder made in more detail.

In order to ensure a stable power source or ground, it is needed to form a thick pattern having a wide area. For that reason, for example, the wiring pattern 12 formed on the core substrate 10 is made a thick wiring (for example, 10 to 20 μm) suitable for the power source system (power source pattern or ground pattern), and the insulating layer 21 covering the wiring pattern 12 is made a thick insulating layer (for example, 20 to 60 μm).

In this case, when the insulating layer 21 is made thin, there may be the case where a parasitic capacity is generated between the thick wiring pattern 12 having a wide area and the wiring pattern 41 disposed via the insulating layer 21, thereby acting as a capacitor; however, by making the insulating layer 21 thick, the parasitic capacity can be reduced. The same is also applicable to the wiring patterns 13 and 42 and the insulating layer 22. It is to be noted that in order to stably supply a power source, it is also preferred to increase a diameter of the through-wiring 14 that connects the wiring pattern 12 and the wiring pattern 13 to each other.

Meanwhile, since the buried substrate 100 is provided with the narrow-pitched linear conductors 120 over the entirety thereof, such is suitable for forming a fine wiring serving as a signal wiring on the buried substrate 100. In this case, what the wiring thickness is thinner is suitable for making the wiring fine, and a thickness of the wiring pattern constituting the wiring pattern 41 and the wiring layers 61 and 81 is preferably 1 to 10 μm. In addition, in order to connect the fine wiring layers to each other, the size of each of the via holes 51x and 71x to be provided in the insulating layers 51 and 71, respectively must be made small. In order to form a small-diameter via hole, the thickness of the insulating layer is suitably thin, and it is preferably 3 to 30 μm. Furthermore, by using a photosensitive insulating resin as the material of the insulating layer, the via holes 51x and 71x may be formed by a photolithography method, and it becomes possible to easily form a small-diameter via hole. The same is also applicable to the wiring pattern 42, the wiring layers 62 and 82, and the insulating layers 52 and 72.

[Method for Manufacturing Wiring Substrate According to First Embodiment]

Next, a method for manufacturing the wiring substrate according to the first embodiment is described. FIGS. 2A to 2D and FIGS. 3A to 3D are views illustrating processes for manufacturing the wiring substrate according to the first embodiment.

Figure 2A:
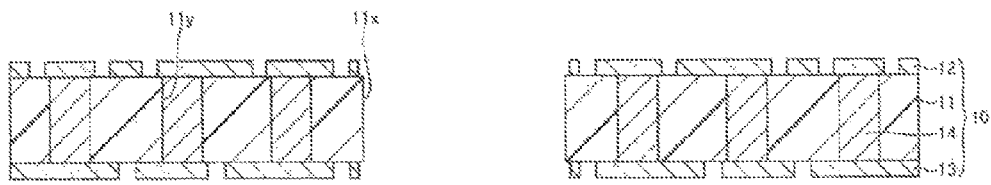
FIGS. 2A to 2D are views illustrating processes for manufacturing the wiring substrate according to the first embodiment of the present invention (part 1).

First of all, in a process shown in FIG. 2A, the core layer 10 is fabricated. In order to fabricate the core substrate 10, for example, the resin substrate 11, such as a so-called glass-epoxy substrate in which a thermosetting epoxy-based resin or the like is impregnated in a reinforcing member, such as glass fibers, or the like is prepared, and the through-hole 11x and the through-hole 11y are formed in the resin substrate 11 by a mechanical processing method, a laser processing method, or the like. Then, a conductor, such as copper (Cu), is filled in the through-hole 11y by a plating method or the like, thereby forming the through-wiring 14. Thereafter, the wiring patterns 12 and 13 each made of copper (Cu) or the like are formed on the upper surface and the lower surface of the resin substrate 11, respectively by a subtractive method, a semi-additive method, or the like. The wiring pattern 12 and the wiring pattern 13 are electrically connected to each other via the through-wiring 14. However, the resin substrate 11 may not have a reinforcing member. In addition, after forming the through-hole 11y, the through-wiring 14, and the wiring patterns 12 and 13 in the resin substrate 11, the through-hole 11x may also be formed.

Figure 2B:
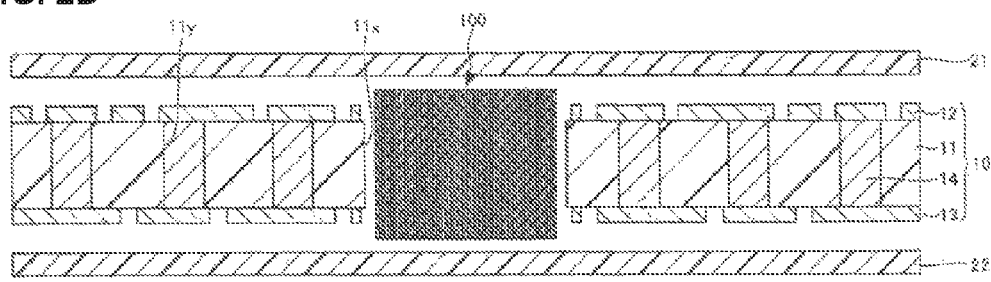

Subsequently, in a process shown in FIG. 2B, the buried substrate 100 is fabricated and disposed within the through-hole 11x of the core substrate 10. The buried substrate 100 is formed thicker than a total thickness of the core substrate 10 including the thicknesses of the resin substrate 11 and the wiring patterns 12 and 13 and disposed in such a manner that the upper and lower surfaces thereof are protruded from the upper and lower surfaces of the wiring patterns 12 and 13 of the core substrate 10, respectively. Thereafter, film-like insulating resins serving as the insulating layers 21 and 22 are laminated on the both surfaces of the core substrate 10 so as to cover the upper and lower surfaces of the buried substrate 100.

On the occasion of disposing the buried substrate 100 within the through-hole 11x of the core substrate 10, the position adjustment of the buried substrate 100 relative to the core substrate 10 is not needed. This is because the narrow-pitched linear conductors 120 penetrating in the thickness direction are formed over the entirety of the buried substrate 100. For that reason, even if the buried substrate 100 causes position deviation within the through-hole 11x, on the occasion of forming the wiring patterns 41 and 42 (pad patterns) in a process shown in FIG. 3C as described later, the wiring patterns 41 and 42 always conduct to any one of the linear conductors 120.

It is to be noted that the buried substrate 100 may be, for example, fabricated in the following manner. A flat plate made of aluminum (Al) is first prepared, and the plate-like body 110 made of aluminum oxide and having a large number of the through-holes 110x formed therein is formed from the prepared flat plate by an anodic oxidation method.

The through-hole 110x may be, for example, formed in a circular shape in planar view, and in that case, its diameter may be, for example, about 50 nm to 2 μm. In addition, it is preferred that the through-holes 110x are densely formed to such extent that a gap between the adjacent through-holes 110x is smaller than a diameter of the through-hole 110x. However, the disposition form of the through-holes 110x is not particularly limited, and for example, the through-holes 110x may be disposed in a hexagonal state or may be disposed in a grid state.

The anodic oxidation method is a method in which a flat plate made of aluminum (Al) is used as an anode and dipped in an electrolytic solution (suitably a sulfuric acid aqueous solution), and energization (impression with a pulse voltage) is performed while using an electrode to be disposed opposite thereto, such as platinum (Pt). According to this, it is possible to form the plate-like body 110 made of aluminum oxide having a large number of the through-holes 110x formed therein (anodically oxidized film of aluminum).

Thereafter, a metal material is filled in the through-holes 110x formed in the plate-like body 110 to form the linear conductors 120. According to this, the buried substrate 100 provided with the plate-like body 110 made of aluminum oxide and the plural linear conductors 120 penetrating through the plate-like body 110 in the thickness direction is fabricated. The linear conductors 12 may be, for example, formed by filling an electrically conductive paste, such as copper (Cu) or silver (Ag), by, for example, a plating method, a screen printing method, an inkjet method, or the like.

Furthermore, if desired, it is possible to expose the both end surfaces of the linear conductor 120 on the both surfaces of the plate-like body 110 by polishing the both surfaces of the plate-like body 110 by mechanical polishing, chemical mechanical polishing (CMP), or the like so that they are flattened. In this way, it is possible to fabricate the buried substrate 100 in which the minute-diameter linear conductors 120 penetrating through the plate-like body 110 in the thickness direction are highly densely provided, in the plate-like body 110. It is to be noted that the buried substrate 100 may be fabricated in parallel to the process shown in FIG. 2A or prior to the process shown in FIG. 2A.

Subsequently, in a process shown FIG. 2C, each of the insulating resins serving as the insulating layers 21 and 22 is pushed toward the side of the core substrate 10 while heating. According to this, the insulating resin flows into the periphery of the buried substrate 100 within the through-hole 11x, and the insulating resin is then cured to form the insulating layers 21 and 22, respectively. At this time, the upper surface of the buried substrate 100 is covered by the insulating layer 21, and the lower layer of the buried substrate 100 is covered by the insulating layer 22. It is to be noted that the interface between the insulating layer 21 and the insulating layer 22 on the periphery of the buried substrate 100 may be located in any position.

Figure 2C:
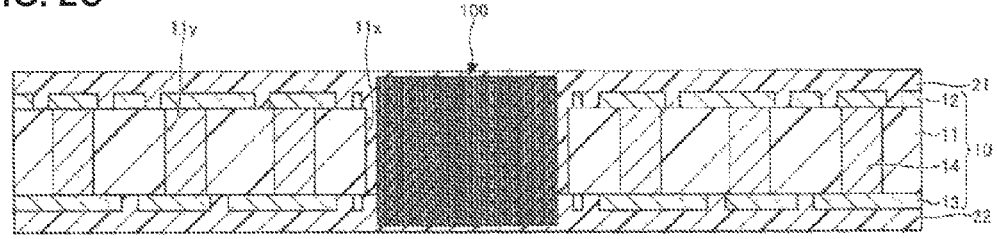

Here, an example of the thickness of each of the portions of the structure shown in FIG. 2C is as follows. For example, it is possible to regulate the thickness of the resin substrate 11 to 40 µm, the thickness of each of the wiring patterns 12 and 13 to 10 µm, the thickness of each of the insulating layers 21 and 22 on the wiring patterns 12 and 13 to 15 µm, and the thickness of the buried substrate 100 to 80 µm, respectively. The insulating layers 21 and 22 are formed in a thickness of 5 µm on the upper and lower surfaces of the buried substrate 100, respectively. In this case, a total thickness of the structure shown in FIG. 2C (thickness of from the lower surface of the insulating layer 22 to the upper surface of the insulating layer 21) is 90 µm.

Figure 2D:
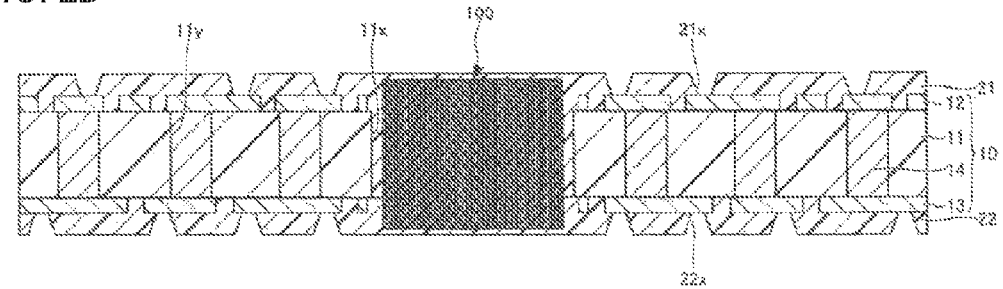

Subsequently, in a process shown in FIG. 2D, the via hole 21x penetrating through the insulating layer 21 and exposing the upper surface of the wiring pattern 12 is formed in the insulating layer 21. In addition, the via hole 22x penetrating through the insulating layer 22 and exposing the lower surface of the wiring pattern 13 is formed in the insulating layer 22. The via holes 21x and 22x may be formed by, for example, a laser processing method using a $CO_2$ laser or the like. After forming the via holes 21x and 22x, it is preferred to conduct a desmearing treatment to remove resin residues attached onto the surfaces of the wiring patterns 12 and 13 exposing the bottoms of the via holes 21x and 22x, respectively. In the case of forming the insulating layers 21 and 22 from a photosensitive insulating resin, the via holes 21x and 22x may be formed by a photolithography method.

Subsequently, in a process shown in FIG. 3A, copper (Cu) or the like is filled within each of the via holes 21x and 22x by a plating method or the like, thereby forming the via wirings 31 and 32. The via wirings 31 and 32 are electrically connected to the wiring patterns 12 and 13, respectively.

Figure 3A:
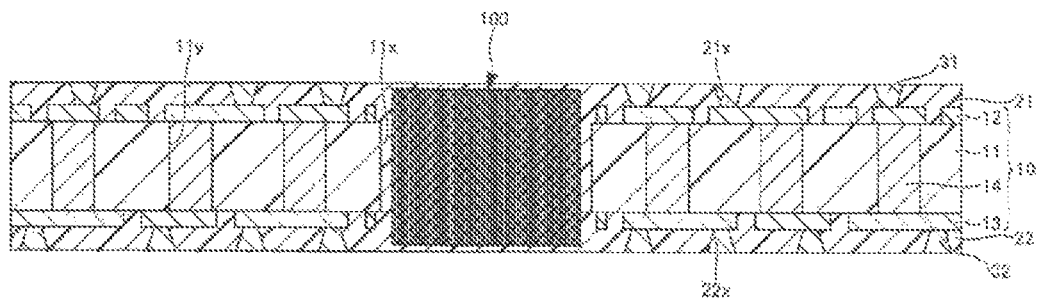
FIGS. 3A to 3D are views illustrating processes for manufacturing the wiring substrate according to the first embodiment of the present invention (part 2).

Subsequently, in a process shown in FIG. 3B, the both surfaces of the structure shown in FIG. 3A are polished by mechanical polishing, chemical mechanical polishing (CMP), or the like, thereby exposing the upper surface of the buried substrate 100 from the upper surface of the insulating layer 21 and exposing the lower surface of the buried substrate 100 from the lower surface of the insulating layer 22. The upper surface of the buried substrate 100, the upper layer of the insulating layer 21, and the upper surface of the via wiring 31 can be, for example, made flush with each other. In addition, the lower surface of the buried substrate 100, the lower layer of the insulating layer 22, and the lower surface of the via wiring 32 can be, for example, made flush with each other.

A polishing amount on each of the surfaces of the structure shown in FIG. 3A may be, for example, 5 µm. For example, in the case where a total thickness of the structure shown in FIG. 3A (thickness of from the lower surface of the insulating layer 22 to the upper surface of the insulating layer 21) is 90 µm, each of the upper surface and the lower surface is polished in a thickness of 5 µm, whereby the total thickness of the structure shown in FIG. 3B (the same as described above) becomes 80 µm. The polished surface is very high in flatness, so that it becomes easy to form a fine wiring as described later.

Subsequently, in a process shown in FIG. 3C, the wiring pattern 41 is formed on the upper surface of the insulating layer 21 and the upper surface of the buried substrate 100. In addition, the wiring pattern 42 is formed on the lower surface of the insulating layer 22 and the lower surface of the buried substrate 100. The wiring patterns 41 and 42 may be formed by adopting various wiring forming methods, such as a semi-additive method or a subtractive method.

As described above, by forming the pad patterns in the opposing positions on the both surfaces of the buried substrate 100, a vertical transmission path can be formed in the buried substrate 100. In addition, in the case where the pad pattern on the buried substrate 100 is made a coaxial pad pattern, by making the vertical transmission path coaxial, it is possible to suppress a cross talk.

In addition, in this process, an alignment mark forming process by backside power supply plating may also be adopted. In that case, the position deviation of the wiring pattern on each of the upper and lower surfaces can be reduced to a half of that in the case of not adopting the foregoing process. It is to be noted that details of the coaxial pad pattern and the alignment mark forming process by backside power supply plating are described later.

Subsequently, in a process shown in FIG. 3D, the insulating layer 51, the wiring layer 61, the insulating layer 71, and the wiring layer 81 are successively provided on the upper side of the structure shown in FIG. 3C. In addition, the insulating layer 52, the wiring layer 62, the insulating layer 72, and the wiring layer 82 are successively provided on the lower side of the structure shown in FIG. 3C. The insulating layers 51, 71, 52, and 72 may be formed by the same method as in the insulating layers 21 and 22. It is to be noted that the wiring thickness of each of the wiring layers 61, 81, 62, and 82 is thinner and narrower in wiring pitch than that in each of the wiring patterns 12 and 13.

The wiring layers 61, 81, 62, and 82 may be formed by adopting various wiring forming methods, such as a semi-additive method or a subtractive method. By using a photosensitive insulating resin for each of the insulating layers 51, 71, 52, and 72, forming each of the via holes 51x, 71x, 52x, and 72x by a photolithography method, and forming each of the wiring layers 61, 81, 62 and 82 by a semi-additive method, it is possible to make each of the wiring layers fine. According to the foregoing processes, the wiring substrate 1 shown in FIGS. 1A to 1B is accomplished.

Here, the coaxial pad pattern and the alignment mark forming process by backside power supply plating are described.

(Coaxial Pad Pattern)

Figure 4A:
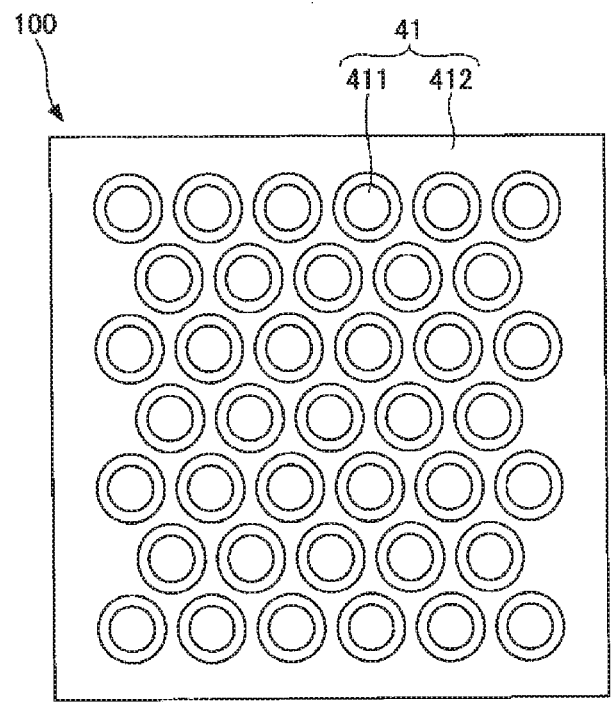
FIGS. 4A to 4B are views explaining a coaxial pad pattern.
Figure 4B:
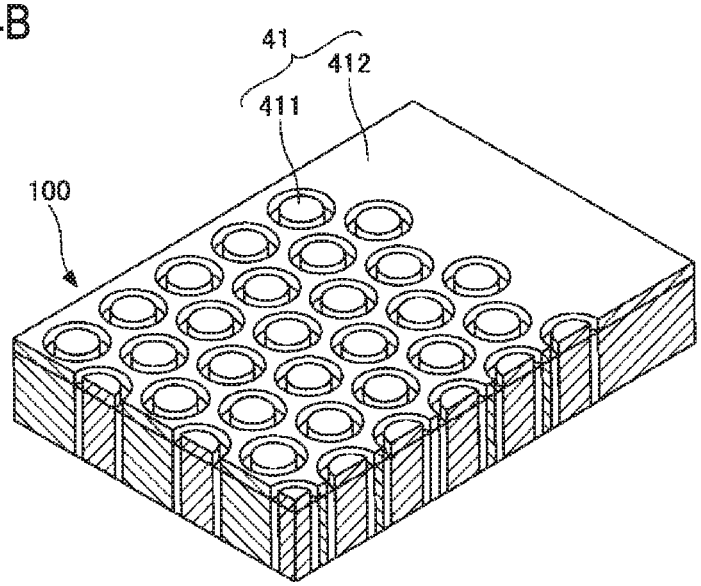

As shown in FIGS. 4A to 4B, in the case where the upper surface of the buried substrate 100 is exposed from the insulating layer 21, the wiring pattern 41 formed on the upper surface of the buried substrate 100 may be configured to have a structure having a pad pattern 411 and a ground pattern 412. In FIGS. 4A to 4B, the pad pattern 411 is, for example, one in which circular pads which are electrically independent upon each other are arranged vertically and horizontally in planar view. The pad pattern 411 is surrounded by the ground pattern 412 at a prescribed interval in planar view. The respective pads constituting the pad pattern 411 are electrically connected to the plural linear conductors 120.

That is, vertical transmission paths extending to the lower sides of the respective pads are formed by the plural linear conductors 120 connected to the respective pads constituting the pad pattern 411. Then, the peripheries of the respective pads constituting the pad pattern 411 and the vertical transmission paths extending to the lower sides of the respective pads are surrounded by the ground pattern 412 and the plural linear conductors 120 connected to the ground pattern 412. According to this, a coaxial structure can be realized, and even in the case of forming the vertical transmission paths in a narrow pitch, it becomes possible to suppress a cross talk between the adjacent vertical transmission paths. It is to be noted that though the same coaxial pad pattern may also be formed on the lower surface of the buried substrate 100, so long as the coaxial pad pattern is formed on either one of the upper and lower surfaces of the buried substrate 100, the above-described effect is brought.

(Alignment Mark Forming Process by Backside Power Supply Plating)

In the case where the both surfaces of the buried substrate 100 are exposed from the insulating layers 21 and 22, respectively, as shown in FIGS. 5A to 5C to FIGS. 10A to 10C, on the occasion of forming the wiring patterns 41 and 42 on the both surfaces of the buried substrate 100, respectively, an alignment mark forming process by a backside power supply plating method may be applied. In the case of adopting this process, the position deviation of each of the wiring patterns formed on the upper and lower surfaces can be reduced to a half of that in the case of not adopting the foregoing process. In addition, even in the case where at the time of burying the buried substrate 100, the linear conductor 120 of the buried substrate 100 is inclined against the core substrate 10, a deviation due to the inclination can be corrected. The description is hereunder made in more detail.

Figure 3B:
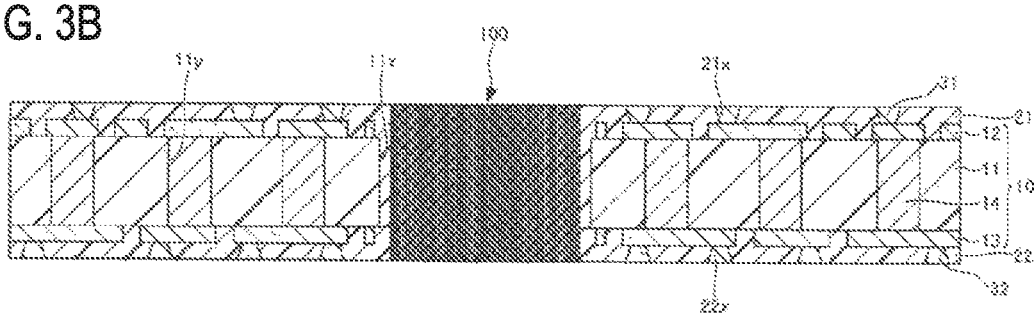
Figure 5A:
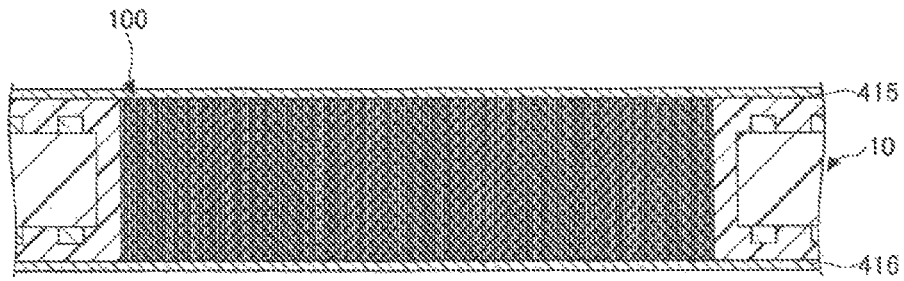
FIGS. 5A to 5C are views explaining an alignment mark forming process by backside power supply plating (part 1).

First of all, as shown in FIG. 5A, after the process shown in FIG. 3B, seed layers 415 and 416 are formed on the upper layer and the lower layer of the buried substrate 100, respectively.

Figure 5B:
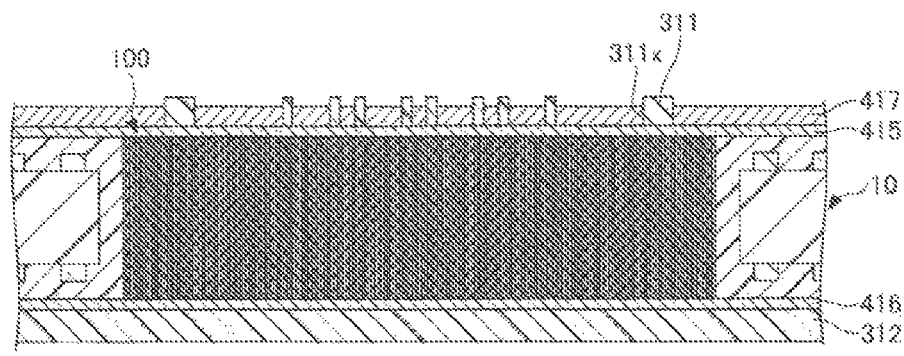

Subsequently, as shown in FIG. 5B, a resist 311 having an opening portion 311x is formed on the seed layer 415, and a resist 312 not having an opening portion is formed on the seed layer 416 while using an alignment mark (not illustrated) previously provided in the core substrate 10 as a standard. Then, an electrolytic plating layer 417 made of copper (Cu) or the like is formed on the seed layer 415 exposing within the opening portion 311x by an electroplating method using the seed layer 415 as a power supply layer.

Figure 5C:
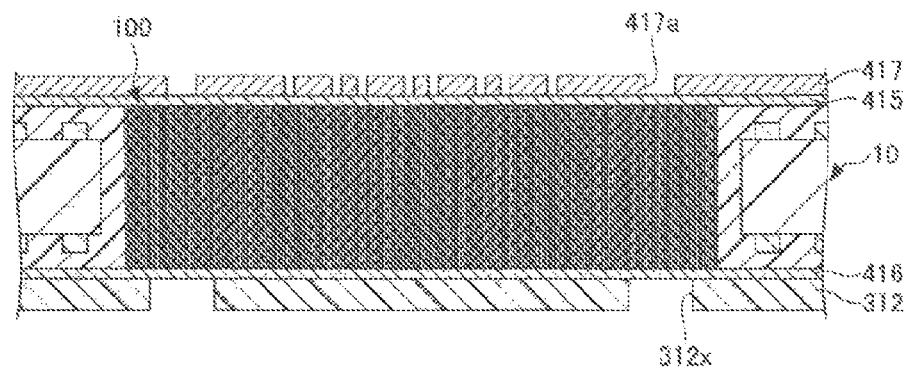

Subsequently, as shown in FIG. 5C, the resist 311 shown in FIG. 5B is removed. 417a becomes an alignment mark on the upper surface of the buried substrate 100. Then, in the resist 312, an opening portion 312x having a larger planar shape than they alignment mark 417a is formed in a position overlapping with the alignment mark 417a in planar view, thereby exposing the seed layer 416 within the opening portion 312x.

Figure 6A:
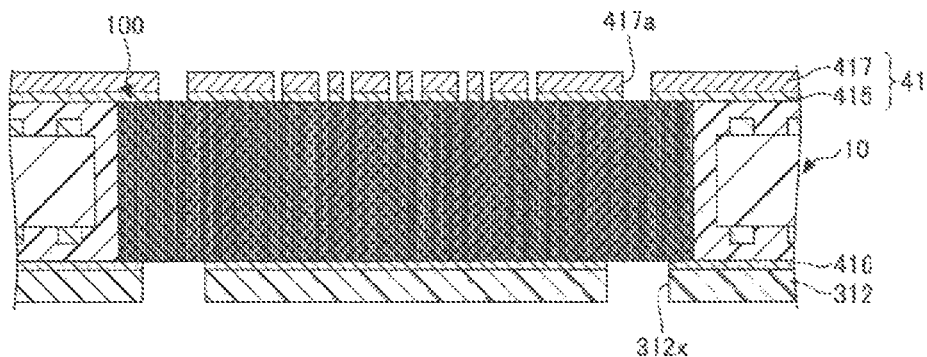
FIGS. 6A to 6C are views explaining an alignment mark forming process by backside power supply plating (part 2).
Figure 6B:
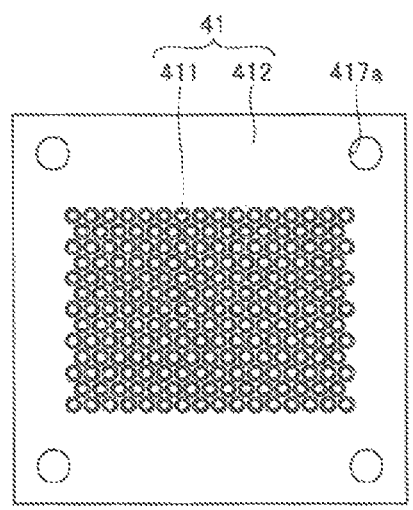
Figure 6C:
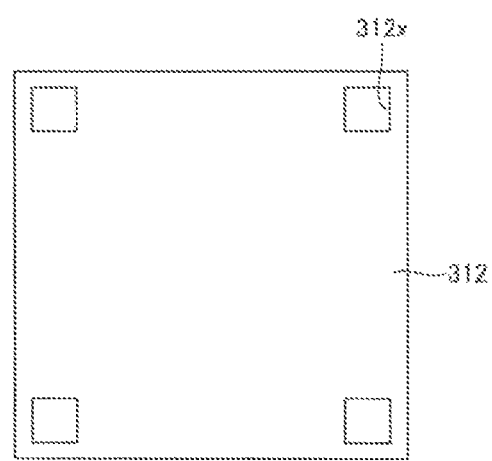

Subsequently, as shown in FIGS. 6A to 6C, the seed layer 415 not covered by the electrolytic plating layer 417 and the seed layer 416 not covered by the resist 312 (the seed layer 416 exposing within the opening portion 312x) are removed by etching. Here, FIG. 6B is a partial plan view of FIG. 6A, and FIG. 6C is a partial bottom view of FIG. 6A, and FIGS. 6B and 6C are drawn by reducing FIG. 6A (the same is also applicable to FIGS. 7A to 7C to FIGS. 9A to 9C).

In this process, the wiring pattern 41 having the electrolytic plating layer 417 provided on the seed layer 415 is formed. The wiring pattern 41 includes the pad pattern 411 having the electrolytic plating layer 417 provided on the seed layer 415 and the ground pattern 412 having the electrolytic plating layer 417 on the seed layer 415. The ground pattern 412 surrounds the periphery of the pad pattern 411 in planar view.

In this example, the four alignment marks 417a are formed outside a region where the pad pattern 411 is formed on the upper surface of the buried substrate 100. Then, the four opening portions 312x having a larger planar shape than the alignment marks 417a are formed in a position overlapping with the alignment marks 417a in planar view on the lower surface of the buried substrate 100. However, each of the numbers of the alignment marks 417a and the opening portions 312x is not limited thereto.

Figure 7A:
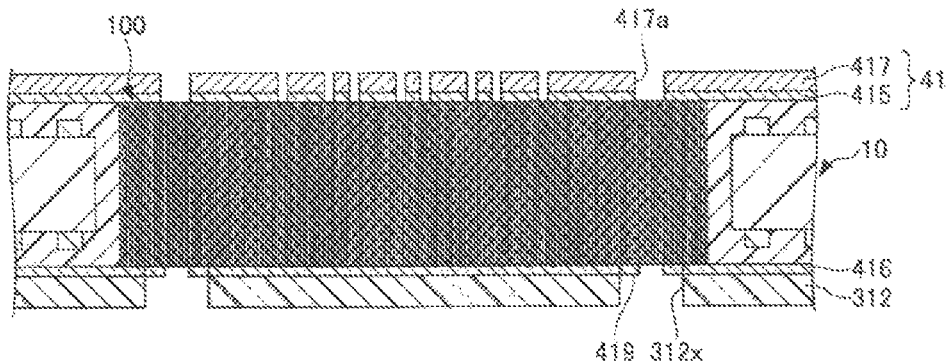
FIGS. 7A to 7C are views explaining an alignment mark forming process by backside power supply plating (part 3).
Figure 7B:
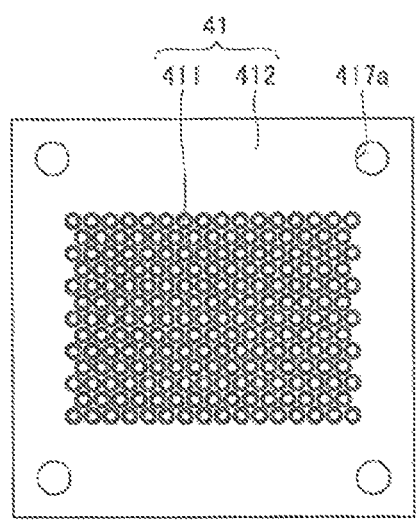
Figure 7C:
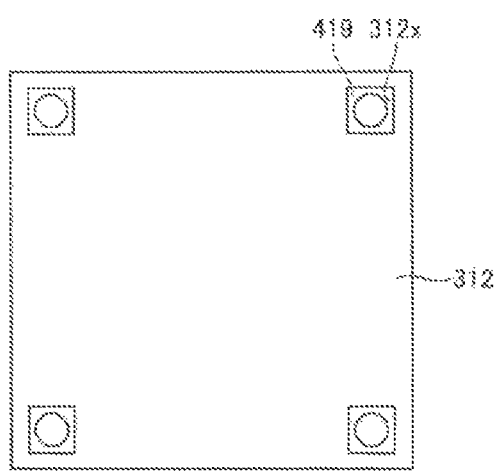
Figure 8A:
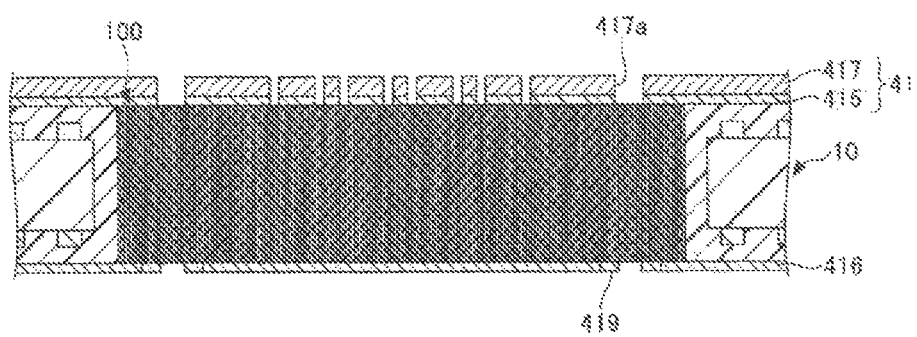
FIGS. 8A to 8C are views explaining an alignment mark forming process by backside power supply plating (part 4).
Figure 8B:
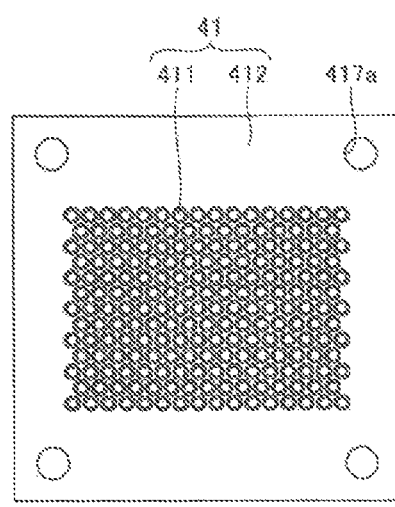
Figure 8C:
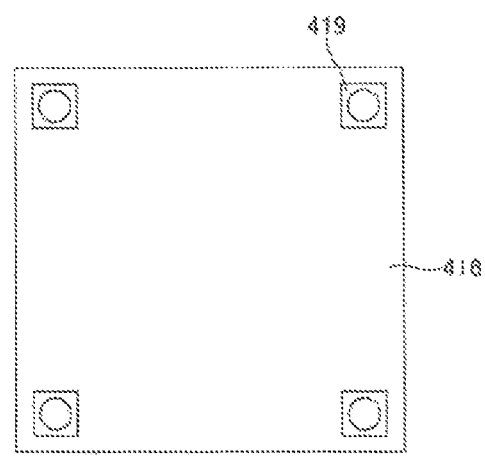

Subsequently, as shown in FIGS. 7A to 7C, an electric power is supplied from the upper surface side of the buried substrate 100 via the wiring pattern 41 and the linear conductor 120 to subject the lower surface of the buried substrate 100 to electrolytic plating, and a plating of copper (Cu) or the like is deposited within the opening portion 312x, thereby forming an alignment mark 419. Since the alignment mark 419 is formed in only a portion where the wiring pattern 41 is existent on the upper surface of the buried substrate 100 (a portion overlapping with the wiring pattern 41 in planar view), the alignment mark 417a is accurately transferred. Subsequently, as shown in FIGS. 8A to 8C, the resist 312 is removed.

Figure 9A:
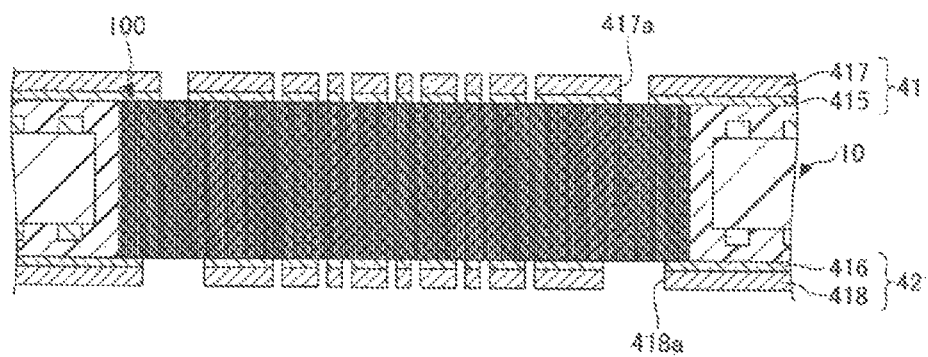
FIGS. 9A to 9C are views explaining an alignment mark forming process by backside power supply plating (part 5).
Figure 9B:
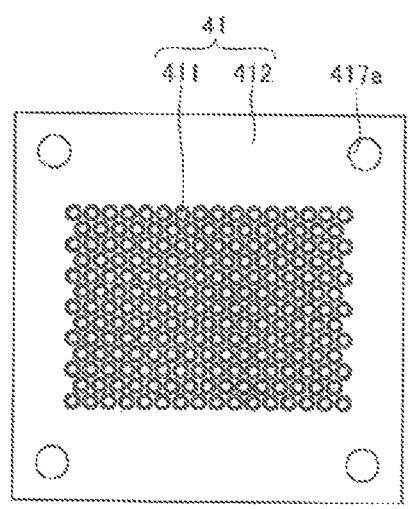
Figure 9C:
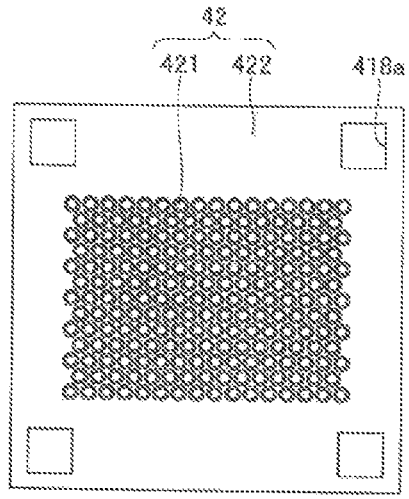

Subsequently, as shown in FIGS. 9A to 9C, the wiring pattern 42 is formed on the lower surface of the buried substrate 100 while using the transferred alignment mark 419 as a standard. Specifically, a resist having an opening portion is formed on the seed layer 416 while using the alignment mark 419 as a standard. Then, an electrolytic plating layer 418 made of copper (Cu) or the like is formed on the seed layer 416 exposing within the opening portion by an electrolytic plating method using the seed layer 416 as a power supply layer. Subsequently, the resist is removed, and the seed layer 416 not covered by the electrolytic plating layer 418 is removed by etching.

According to this, the wiring pattern 42 having the electrolytic plating layer 418 provided on the seed layer 416 is formed. The wiring pattern 42 includes a pad pattern 421 having the electrolytic plating layer 418 provided on the seed layer 416 and a ground pattern 422 having the electrolytic plating layer 418 provided on the seed layer 416. The ground pattern 422 surrounds the periphery of the pad pattern 421 in planar view.

It is to be noted that in the case where adhesion of the alignment mark 419 to the buried substrate 100 is low, in order to prevent exfoliation in the subsequent processes, the alignment mark 419 may be removed together at the time of etching of the seed layer 416 without forming a plating film. In that case, the alignment mark 419 is removed, and an opening portion 418a remains.

In general, in forming a wiring pattern, an actually exposed pattern causes position deviation against a designed value depending upon superposition position accuracy of an exposure device to be used at the time of resist patterning. For example, in the case of an exposure device having a superposition position accuracy of ±5 µm, as for the position of the actually exposed pattern, the exposure is conducted in a different position every time within the range of 5 µm even if the same alignment mark is used as a standard.

In the case of forming a wiring pattern on the upper surface and the lower surface of the buried substrate 100, the exposure of two times is needed. For that reason, in the case where the same alignment mark previously provided in the core substrate 10 is used as a standard, there is a concern that in the exposure of one time on each of the upper surface and the lower surface of the buried substrate 100, a position deviation of the wiring pattern of at most 5 µm on each surface and 10 µm on the both surfaces against the desired value is caused.

Meanwhile, even in the case of the alignment mark forming process by backside power supply plating as explained by referring to FIGS. 6A to 6C to FIGS. 9A to 9C, when the exposure is conducted while using the alignment mark previously provided in the core substrate at the time of exposure on the upper surface side of the buried substrate 100 as a standard, the position of the wiring pattern 41 is deviated by at most 5 µm. However, the alignment mark 417a existent within the same pattern is also deviated together with the wiring pattern 41. Namely, the position deviation between the wiring pattern 41 on the upper surface side of the buried substrate 100 and the alignment mark 417a is 0.

Subsequently, the alignment mark 417a is transferred onto the lower surface side of the buried substrate 100, thereby forming the alignment mark 419. Then, the exposure on the lower surface side of the buried substrate 100 is conducted while using the alignment mark 419 as a new standard. Though there is a concern that a position deviation of at most 5 µm is caused at the exposure on the lower surface side of the buried substrate 100, the position deviation on the upper surface side is 0, and hence, the position deviation between the wiring pattern 41 on the upper surface and the wiring pattern 42 on the lower surface is at most 5 µm. Namely, by adopting the alignment mark forming process by backside power supply plating, the position deviation between the wiring patterns on the upper and lower surfaces can be reduced to a half as compared with the case of not adopting the subject process.

Next, the case where on the occasion of burying the buried substrate 100 in the core substrate 10, the upper surface of the buried substrate 100 does not become parallel to the upper surface of the core substrate 10 but is inclined is assumed. In this case, a cross-sectional structure after exposing the buried substrate 100 in the process shown in FIG. 3B is one shown in FIG. 10A, and the linear conductors 120 are not vertical but are in an inclined state against the core substrate 10. In this state, even when the pad patterns 411 and 421 are formed in completely opposing positions to each other sandwiching the buried substrate 100, the linear conductors 120 are inclined, and hence, the pad pattern 411 and the pad pattern 421 are not thoroughly connected to each other.

Figure 10A:
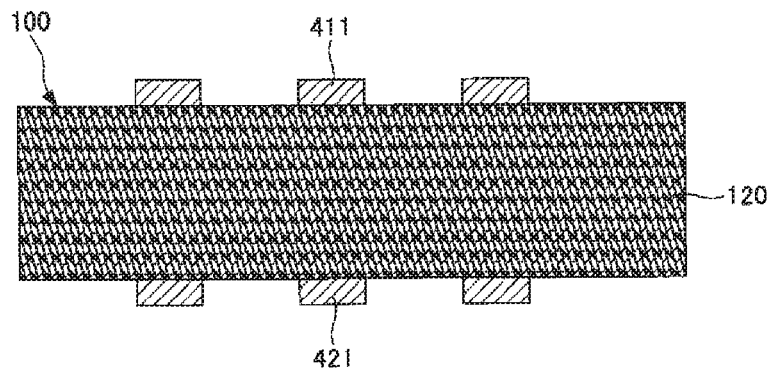
FIGS. 10A to 10C are views explaining an alignment mark forming process by backside power supply plating (part 6).
Figure 10B:
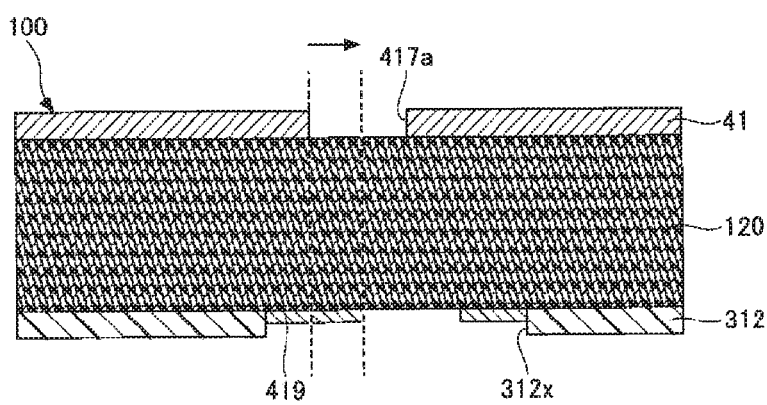
Figure 10C:
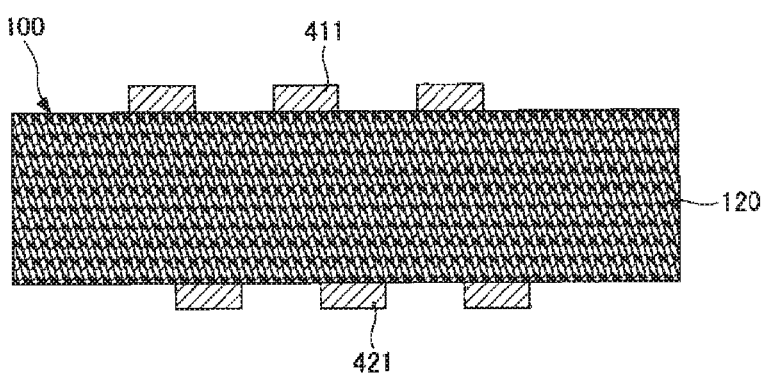

On the other hand, in the case of adopting the alignment mark forming process by backside power supply plating, as shown in FIG. 10B, the position onto which the alignment mark 419 is transferred moves in an arrow direction according to the inclination of the linear conductor 120. Accordingly, by forming the pad pattern 421 while using the transferred alignment mark 419 as a standard, as shown in FIG. 10C, the position of the pad pattern 421 moves in the same direction as the arrow shown in FIG. 10B at the same distance. According to this, the inclination of the linear conductor 120 is corrected, and the pad pattern 411 on the upper surface and the pad pattern on the lower surface can be surely connected to each other.

Second Embodiment

In a second embodiment, other example of the manufacturing method of the wiring substrate 1 according to the first embodiment is described. It is to be noted that in the second embodiment, with respect to the same constituent portions as those in the embodiment described already, there may be the case where their explanations are omitted.

Figure 11A:
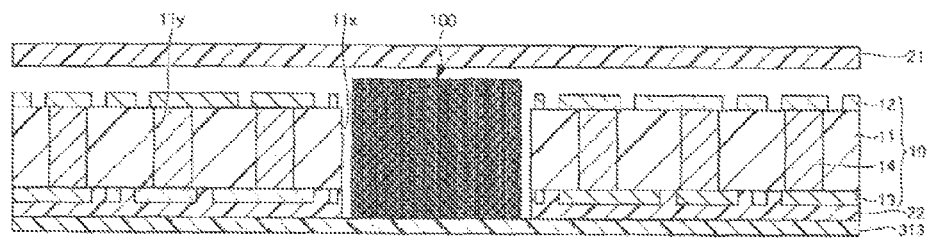
FIGS. 11A to 11D are views illustrating other processes for manufacturing the wiring substrate according to the first embodiment (part 1).

First of all, after executing the same process shown in FIG. 2A, in a process shown in FIG. 11A, an insulating resin provided with an opening portion corresponding to the through-hole 11x is laminated and cured on the lower surface side of the structure shown in FIG. 2A, thereby forming the insulating layer 22. Then, a temporary fixing film 313 serving as a support is laminated on the lower surface side of the insulating layer 22. Subsequently, the buried substrate 100 is fabricated in the same method as in the first embodiment and disposed and temporarily fixed on the upper surface of the temporary fixing film 313 exposing within the through-hole 11x of the core substrate 10. At this time, the buried substrate 100 is disposed in such a manner that its upper surface is protruded from the upper surface of the core substrate 10. Subsequently, a film-like insulating resin serving as the insulating layer 21 is laminated on the upper surface of the core substrate 10 so as to cover the upper surface of the buried substrate 100. It is to be noted that the second embodiment is identical with the first embodiment from the standpoint that an arbitrary number of layers of multi-layered wiring layers including the wiring patterns 12 and 13 may be formed on each of the upper surface and the lower surface of the resin substrate 11.

Subsequently, in a process shown in FIG. 11B, the insulating resin serving as the insulating layer 21 is pushed toward the side of the temporary fixing film 313 while heating. According to this, a part of the insulating resin serving as the insulating layer 21 flows into the periphery of the buried substrate 100 within the through-hole 11x. At this time, the upper surface of the buried substrate 100 is covered by the insulating layer 21. After the insulating layer 21 is cured, the temporary fixing film 313 is exfoliated, thereby exposing the lower surface of the insulating layer 22 and the lower surface of the buried substrate 100. The lower surface of the insulating layer 22 and the lower surface of the buried substrate 100 can be, for example, made flush with each other.

Subsequently, in a process shown in FIG. 11C, the via holes 21x and 22x are formed in the same manner as in the process shown in FIG. 2D, and the via wiring 31 is formed within the via hole 21x in the same manner as in the process shown in FIG. 3A. At this time, only a seed layer 32a is formed on the side of the via hole 22x. The seed layer 32a is formed so as to continuously cover the lower surface of the insulating layer 22, the lower surface of the buried substrate 100, and the inner wall surface and the bottom surface of the via hole 22x.

Figure 11B:
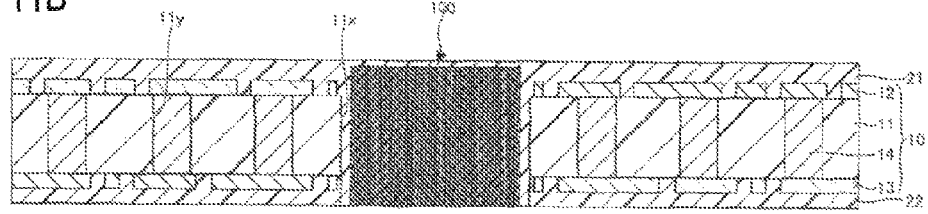
Figure 11C:
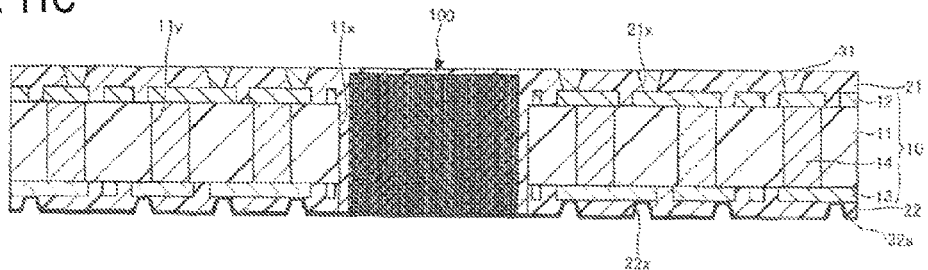

Subsequently, in a process shown in FIG. 11D, the upper surface of the structure shown in FIG. 11C is polished in the same manner as in the process shown in FIG. 3B, thereby exposing the upper surface of the buried substrate 100 from the upper surface of the insulating layer 21. The upper surface of the buried layer 100, the upper surface of the insulating layer 21, and the upper surface of the via wiring 31 can be, for example, made flush with each other.

Figure 3C:
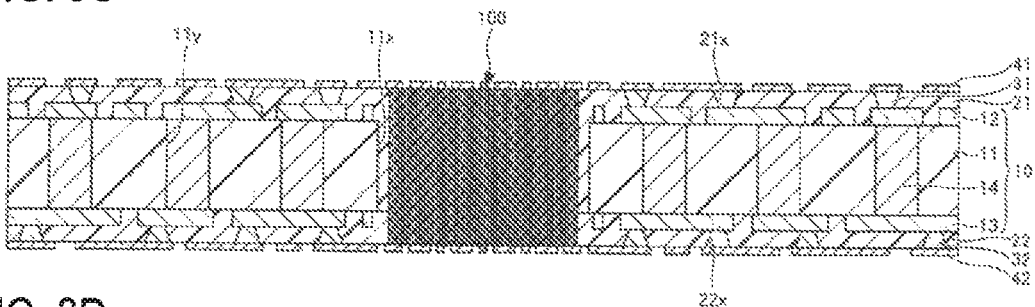
Figure 3D:
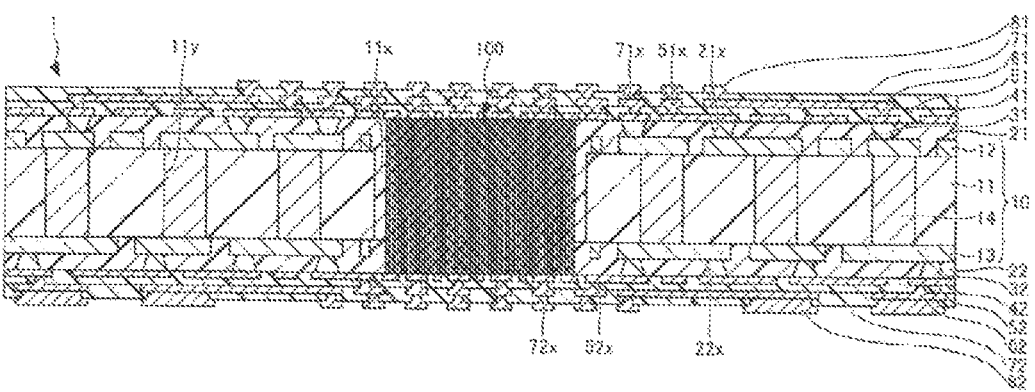
Figure 11D:
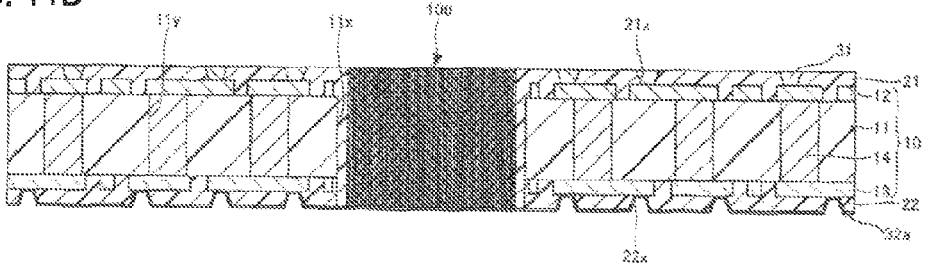

Thereafter, the wiring pattern 41, the insulating layer 51, the wiring layer 61, the insulating layer 71, and the wiring layer 81 are successively provided on the upper side of the structure shown in FIG. 11D in the same manners as in the processes shown in FIGS. 3C and 3D. In addition, the via wiring 32 and the wiring pattern 42 are formed on the lower side of the structure shown in FIG. 11D. On this occasion, the via wiring 32 and the wiring pattern 42 can be integrally formed by an electrolytic plating method using the seed layer 32a as a power supply layer. Thereafter, the insulating layer 52, the wiring layer 62, the insulating layer 72, and the wiring layer 82 are successively provided on the wiring pattern 42. According to the foregoing processes, the wiring substrate 1 shown in FIGS. 1A to 1B is accomplished.

Figure 12A:
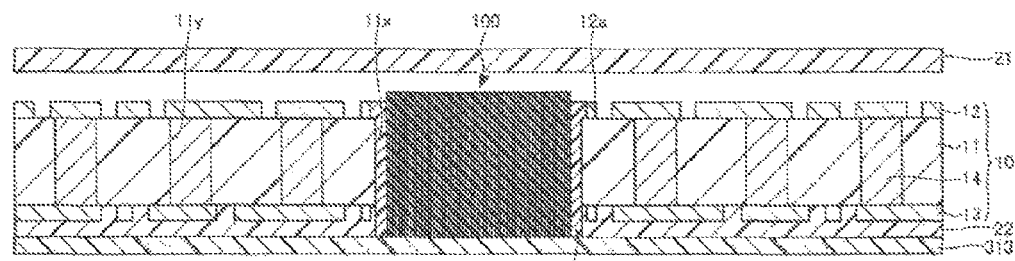
FIGS. 12A to 12B are views illustrating other processes for manufacturing the wiring substrate according to the first embodiment (part 2).
Figure 12B:
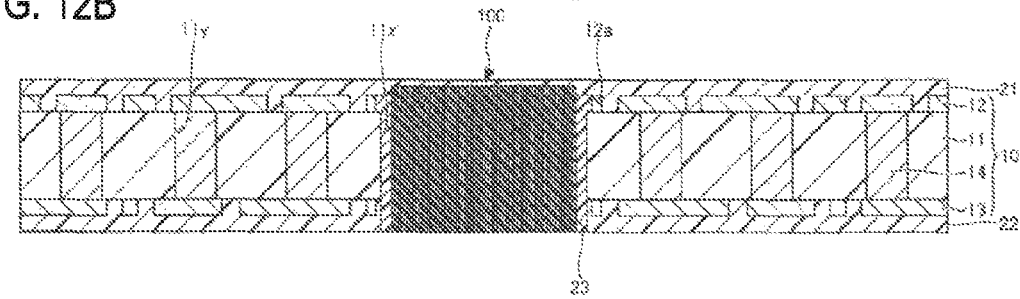

It is to be noted that the processes shown in FIGS. 11A and 11B may be replaced by processes shown in FIGS. 12A and 12B, respectively. FIGS. 12A and 12B are concerned with an example in which an insulating layer 23 having different properties from the insulating layers 21 and 22 is formed so as to bury a gap formed by the side surface of the buried substrate 100 and the inner wall surface of the through-hole 11x.

First of all, in a process shown in FIG. 12A, the buried substrate 100 is disposed and temporarily fixed on the upper surface of the temporary fixing film 313 exposing within the through-hole 11x of the core substrate 10. Then, prior to laminating the film-like insulating resin serving as the insulating layer 21 on the upper surface of the core substrate 10, a liquid insulating resin serving as the insulating layer 23 is filled so as to bury a gap formed by the side surface of the buried substrate 100 and the inner wall surface of the through-hole 11x, followed by curing. Subsequently, the film-like insulating resin serving as the insulating layer 21 is laminated on the upper surface of the core substrate 10 so as cover the upper surface of the buried substrate 100.

Here, when a resin having a lower elastic modulus than the insulating resin serving as the insulating layer 21 is chosen as the liquid insulating resin serving as the insulating layer 23, it is possible to form a stress relaxation layer by the insulating layer 23 on the periphery of the buried substrate 100. It is to be noted that in the wiring pattern 12, when a pattern 12a surrounding the periphery of the through-hole 11x in planar view is fabricated, the pattern 12a functions as a dam on the occasion of filling the liquid insulating resin, and effluence of the liquid insulating resin into an unintended portion can be prevented from occurring, and hence, such is suitable.

Subsequently, in a process shown in FIG. 12B, the insulating resin serving as the insulating layer 21 is pushed toward the side of the temporary fixing film 313 while heating the respective insulating resins serving as the insulating layers 21 and 23, followed by curing. At this time, the upper surface of the buried substrate 100 is covered by the insulating layer 21. Subsequently, the temporary fixing film 313 is exfoliated, thereby exposing the lower surface of the insulating layer 22, the lower layer of the insulating layer 23, and the lower surface of the buried substrate 100. The lower surface of the insulating layer 22, the lower surface of the insulating layer 23, and the lower surface of the buried substrate 100 can be, for example, made flush with each other. From this point forward, processes are the same as the processes shown in FIGS. 11C and 11D.

In this way, in the second embodiment, the number of times of polishing is only one time at which the upper surface of the structure shown in FIG. 11C is polished in the process shown in FIG. 11D. On the other hand, in the first embodiment, the number of times of polishing is two times because the both surfaces of the structure shown in FIG. 3A are polished in the process shown in FIG. 3B. Since the polishing step is high in costs, in the manufacturing processes according to the second embodiment, it is possible to reduce the manufacturing costs of a wiring substrate as compared with the manufacturing processes according to the first embodiment.

Third Embodiment

In a third embodiment, an example of a wiring substrate using a substrate structure capable of being generically used is described. It is to be noted that in the third embodiment, with respect to the same constituent portions as those in the embodiments described already, there may be the case where their explanations are omitted.

[Structure of Wiring Substrate According to Third Embodiment]

Figure 13:
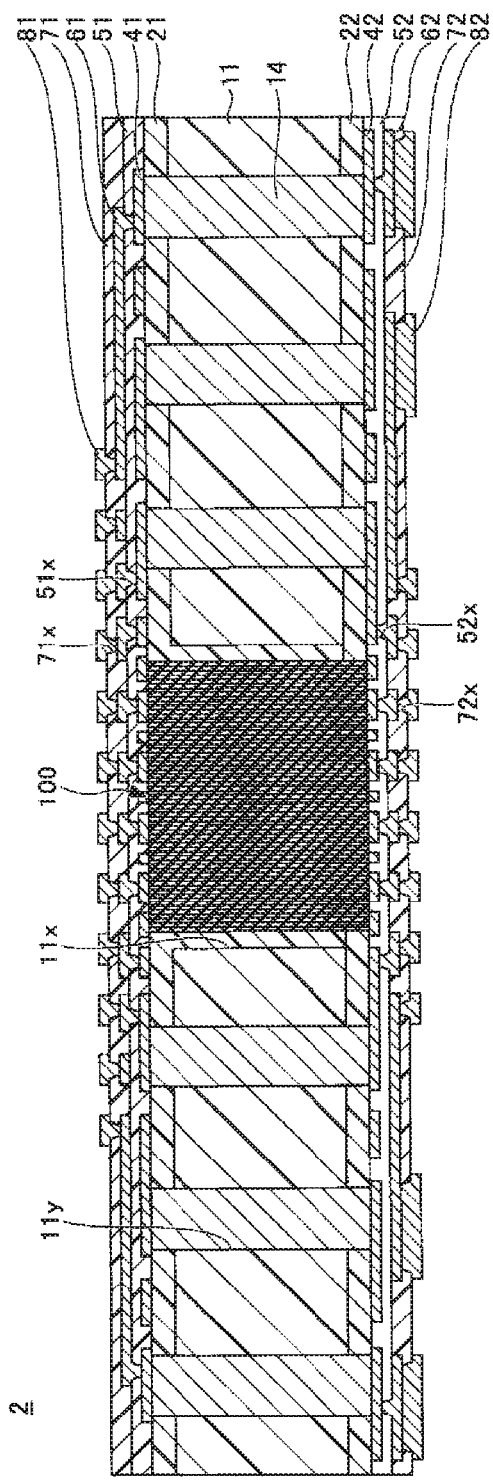
FIG. 13 is a cross-sectional view illustrating a wiring substrate according to a third embodiment.

First of all, a structure of a wiring substrate according to a third embodiment is described. FIG. 13 is a cross-sectional view illustrating a wiring substrate according to the third embodiment.

Reference is made to FIG. 13. A wiring substrate 2 is mainly different from the wiring substrate 1 (see FIGS. 1A to 1B) from the standpoint that a wiring pattern is not formed on each of the upper and lower surfaces of the resin substrate 11.

In the wiring substrate 2, the insulating layer 21 is formed on the upper surface of the resin substrate 11. The insulating layer 21 does not cover the buried substrate 100, and the upper surface of the buried substrate 100 is exposed from the upper layer of the insulating layer 21. The insulating layer 22 is formed on the lower surface of the resin substrate 11. The insulating layer 22 does not cover the buried substrate 100, and the lower surface of the buried substrate 100 is exposed from the lower surface of the insulating layer 22. The through-wiring 14 filling the through-hole 11y continuously penetrating through the insulating layer 21, the resin substrate 11, and the insulating layer 22 is provided.

The insulating layer 21 is filled in a gap formed by the side surface of the buried substrate 100 and the inner wall surface of the through-hole 11x. However, the insulating layer 22 may be filled in the whole or a part of the gap formed by the side surface of the buried substrate 100 and the inner wall surface of the through-hole 11x.

The upper surface of the through-wiring 14, the upper surface of the insulating layer 21, and the upper surface of the buried substrate 100 can be, for example, made flush with each other by polishing. In addition, the lower surface of the through-wiring 14, the lower surface of the insulating layer 22, and the lower surface of the buried substrate 100 can be, for example, made flush with each other by polishing. In this way, by flattening each of the upper surface of the through-wiring 14, the upper surface of the insulating layer 21, and the upper surface of the buried substrate 100 by polishing, a fine pattern can be easily formed on the flattened surface. In addition, by flattening each of the lower surface of the through-wiring 14, the lower surface of the insulating layer 22, and the lower surface of the buried substrate 100 by polishing, a fine pattern can be easily formed on the flattened surface.

The wiring pattern 41 is formed on the flat surface formed by the upper surface of the through-wiring 14, the upper surface of the insulating layer 21, and the upper surface of the buried substrate 100. The wiring pattern 42 is formed on the flat surface formed by the lower surface of the through-wiring 14, the lower surface of the insulating layer 22, and the lower surface of the buried substrate 100. A part of the wiring pattern 42 is electrically connected to the wiring pattern 41 via the through-wiring 14.

The wiring pattern 41 formed on the upper surface of the buried substrate 100 and the wiring pattern 42 formed on the lower surface of the buried substrate 100 are the same as those in the first embodiment. That is, by forming the pad patterns by the wiring patterns 41 and 42 disposed in the opposing positions on the both surfaces of the buried substrate 100, a vertical transmission path can be formed in the buried substrate 100. On this occasion, by forming at least one of the pad patterns on the buried substrate 100 into a coaxial pad pattern to make the vertical transmission path coaxial, it becomes possible to suppress a cross talk, and hence, such is suitable.

[Manufacturing Method of Wiring Substrate According to Third Embodiment]

Figure 14A:
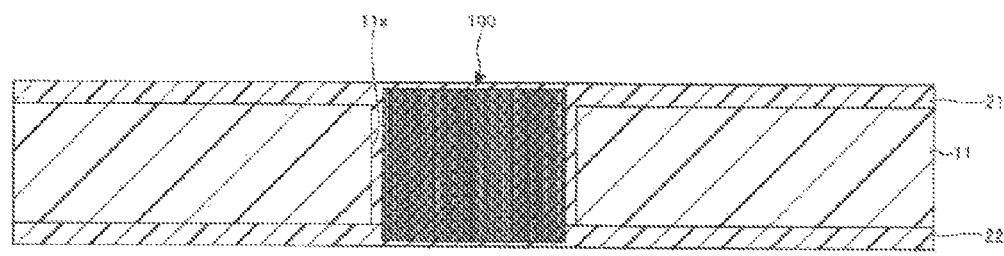
FIGS. 14A to 14C are views illustrating processes for manufacturing a wiring substrate according to a third embodiment.
Figure 14B:
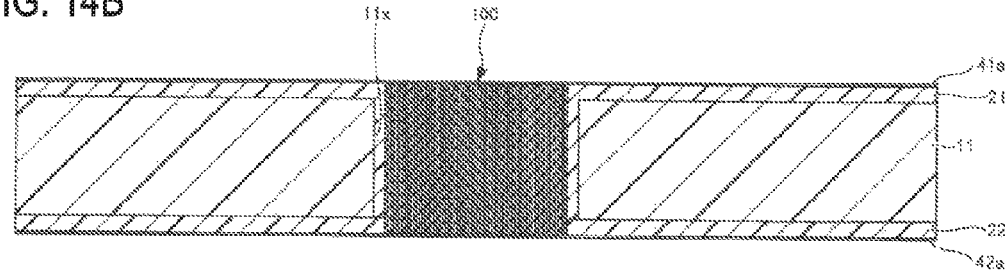
Figure 14C:
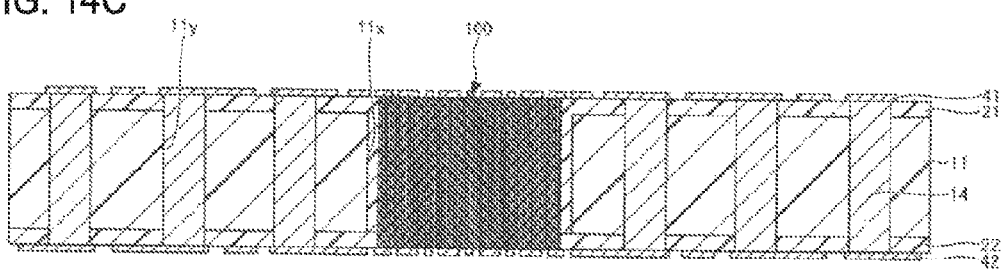

Next, a manufacturing method of the wiring substrate according to the third embodiment is described. FIGS. 14A to 14C are views illustrating processes for manufacturing the wiring substrate according to the third embodiment.

First of all, in a process shown in FIG. 14A, the resin substrate 11 is prepared as a core substrate, and the through-hole 11x is formed in the resin substrate 11 by a mechanical processing method, a laser processing method, or the like. The resin substrate 11 may or may not have a reinforcing member. In the present embodiment, the core substrate is composed of only the resin substrate 11, and a wiring pattern is not formed.

Subsequently, the buried substrate 100 is fabricated in the same manner as in the first embodiment and disposed within the through-hole 11x of the resin substrate 11. The buried substrate 100 is disposed in such a manner that its upper and lower surfaces are protruded from the both surfaces of the core substrate 10, respectively. Then, film-like insulating resins serving as the insulating layers 21 and 22 are laminated on the both surfaces of the resin substrate 11 so as to cover the upper and lower surfaces of the buried substrate 100.

Then, each of the insulating resins serving as the insulating layers 21 and 22 is pushed toward the side of the core substrate 10 while heating. According to this, the insulating resin flows into the periphery of the buried substrate 100 within the through-hole 11x, and the insulating resin is then cured to form the insulating layers 21 and 22, respectively. At this time, the upper surface of the buried substrate 100 is covered by the insulating layer 21, and the lower surface thereof is covered by the insulating layer 22. It is to be noted that the interface between the insulating layer 21 and the insulating layer 22 on the periphery of the buried substrate 100 may be located in any position.

It is to be noted that with respect to the insulating resins constituting the resin substrate 11, the insulating layer 21, and the insulating layer 22, all of them may be the same resin, any only two of them may be the same resin, or the respective resins are different from each other.

Subsequently, in a process shown in FIG. 14B, the both surfaces of the structure shown in FIG. 14A are polished by mechanical polishing, chemical mechanical polishing (CMP), or the like, thereby exposing the upper surface of the buried substrate 100 from the upper surface of the insulating layer 21 and exposing the lower surface of the buried substrate 100 from the lower surface of the insulating layer 22. The upper surface of the buried substrate 100 and the upper layer of the insulating layer 21 can be, for example, made flush with each other. In addition, the lower surface of the buried layer 100 and the lower layer of the insulating layer 22 can be, for example, made flush with each other.

Thereafter, a metal layer 41a continuously covering the upper surface of the buried substrate 100 and the upper surface of the insulating layer 21 is formed. In addition, a metal layer 42a continuously covering the lower surface of the buried substrate 100 and the lower surface of the insulating layer 22 is formed. Each of the metal layers 41a and 42a may be, for example, formed by an electroless plating method or a sputtering method.

As a material of each of the metal layers 41a and 42a, for example, titanium (Ti), titanium nitride (TiN), or the like may be used. A thickness of each of the metal layers 41a and 42a may be, for example, about 1 µm or less.

In addition, each of the metal layers 41a and 42a may be, for example, formed of a multi-layered structure in which a second layer made of copper (Cu) or the like is provided on a first layer made of titanium (Ti), titanium nitride (TiN), or the like. A thickness of the first layer may be, for example, about 1 µm or less. In addition, a thickness of the second layer may be, for example, about several µm. In this case, the first layer functions as a barrier layer for preventing mutual diffusion between the second layer and the linear conductor 120 and an adhesive layer for improving connection reliability between the second layer and the linear conductor 120. In addition, the second layer functions as a seed layer (power supply layer) on the occasion of forming a wiring pattern by an electrolytic plating method.

It is to be noted that the substrate structure shown in FIG. 14B is high in multiplicity of use and may be used in common to various applications. Accordingly, the substrate structure shown in FIG. 14B may be distributed as a product in the market.

Subsequently, in a process shown in FIG. 14C, the through-hole 11y continuously penetrating through the insulating layer 21, the resin substrate 11, and the insulating layer 22 is formed. Then, a conductor of copper (Cu) or the like is filled in the through-hole 11y by a plating method or the like, thereby forming the through-wiring 14. Thereafter, the wiring patterns 41 and 42 made of copper (Cu) or the like are formed on the both surfaces of the resin substrate 11, respectively. The wiring patterns 41 and the wiring pattern 42 are electrically connected to each other via the through-wiring 14.

Each of the wiring patterns 41 and 42 may be, for example, formed by a semi-additive method. For example, a resist layer provided with an opening portion corresponding to the wiring pattern 41 is formed on the metal layer 41a. Then, an electrolytic plating layer made of copper (Cu) or the like is formed on the metal layer 41a exposing within the opening portion of the resist layer is formed by an electrolytic plating method using the metal layer 41a as a power supply layer. Similarly, a resist layer provided with an opening portion corresponding to the wiring pattern 42 is formed on the metal layer 42a. Then, an electrolytic plating layer made of copper (Cu) or the like is formed on the metal layer 42a exposing within the opening portion of the resist layer is formed by an electrolytic plating method using the metal layer 42a as a power supply layer.

Subsequently, after removing the resist layer on the upper surface side of the resin substrate 11, by removing the metal layer 41a not covered by the electrolytic plating layer by etching or the like, the wiring pattern 41 having the electrolytic plating layer provided on the metal layer 41a is formed. Similarly, after removing the resist layer on the lower surface side of the resin substrate 11, by removing the metal layer 42a not covered by the electrolytic plating layer by etching or the like, the wiring pattern 42 having the electrolytic plating layer provided on the metal layer 42a is formed. On the occasion of forming the wiring patterns 41 and 42, the matter that it is suitable to adopt the coaxial pad pattern or the alignment mark forming process by backside power supply plating is the same as in the first embodiment. It is to be noted that in FIG. 14C, the illustration of the metal layers 41a and 42a is omitted.

Thereafter, the insulating layer 51, the wiring layer 61, the insulating layer 71, and the wiring layer 81 are successively provided on the upper side of the structure shown in FIG. 14C in the same manner as in the process shown in FIG. 3D. In addition, the insulating layer 52, the wiring layer 62, the insulating layer 72, and the wiring layer 82 are successively provided on the lower side of the structure shown in FIG. 14C. According to the foregoing processes, the wiring substrate 2 shown in FIG. 13 is accomplished.

Fourth Embodiment

In a fourth embodiment, an example of a wiring substrate which may be manufactured without executing the polishing process is described. It is to be noted that in the fourth embodiment, with respect to the same constituent portions as those in the embodiments described already, there may be the case where their explanations are omitted.

[Structure of Wiring Substrate According to Fourth Embodiment]

Figure 15:
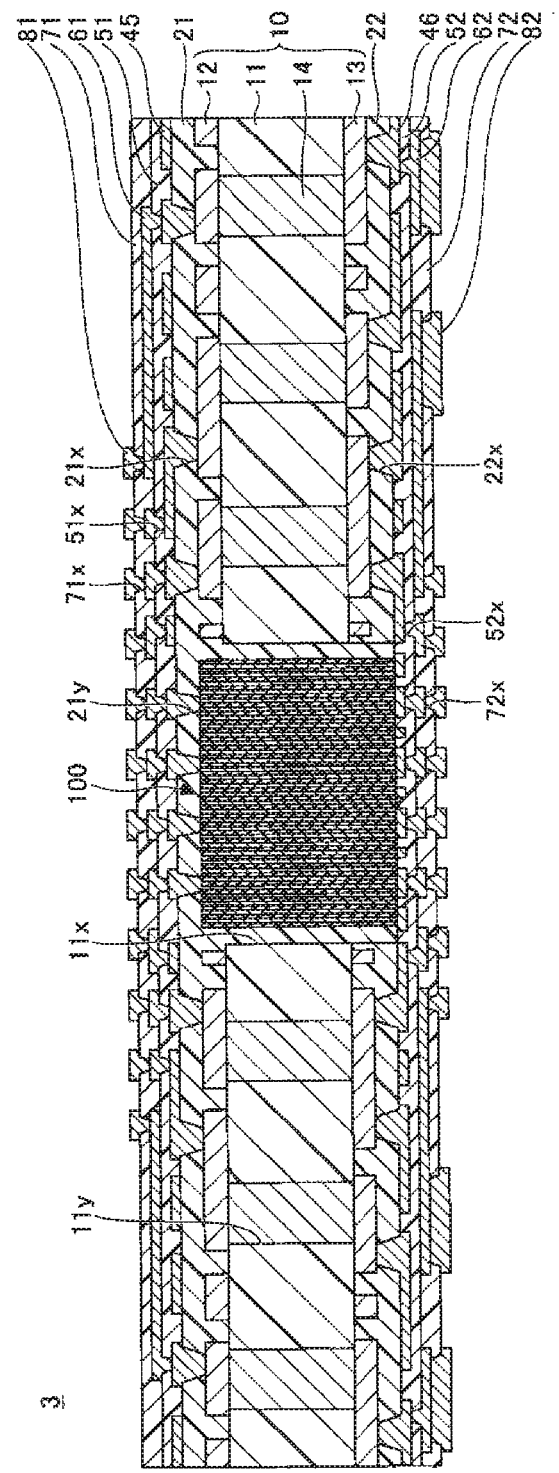
FIG. 15 is a cross-sectional view illustrating a wiring substrate according to a fourth embodiment.

First of all, a structure of a wiring substrate according to a fourth embodiment is described. FIG. 15 is a cross-sectional view illustrating a wiring substrate according to the fourth embodiment.

Reference is made to FIG. 15. A wiring substrate 3 is mainly different from the wiring substrate 1 (see FIGS. 1A to 1B) from the standpoints that the upper surface of the buried substrate 100 and the upper surface of the wiring pattern 12 are substantially flush with each other; and that the upper surface of the buried substrate 100 is covered by the insulating layer 21.

In the wiring substrate 3, the insulating layer 21 continuously covers the upper surface of the resin substrate 11 and the upper surface of the buried substrate 100. Then, the insulating layer 21 formed on the upper surface of the buried substrate 100 is provided with the via hole 21y, and the upper end surfaces of the plural linear conductors 120 are exposed within the via hole 21y.

A wiring layer 45 is formed on the upper side of the insulating layer 21. The wiring layer 45 is configured to include a via wiring filled within the via hole 21x, a via wiring filled within the via hole 21y, and a wiring pattern formed on the upper surface of the insulating layer 21. The wiring layer 45 is electrically connected to the wiring pattern 12 via the via wiring (first via wiring) filled within the via hole 21x. In addition, the wiring layer 45 is electrically connected to the upper end surfaces of the plural linear conductors 120 via the via wiring (second via wiring) filled within the via hole 21y.

A wiring layer 46 is formed on a flat surface formed by the lower surface of the insulating layer 22 and the lower layer of the buried substrate 100. The wiring layer 46 is configured to include a via wiring filled within the via hole 22x, a wiring pattern formed on the lower surface of the insulating layer 22, and a pad pattern formed on the lower surface of the buried substrate 100. The wiring layer 46 is electrically connected to the wiring pattern 13 via the via wiring filled within the via hole 22x. In addition, respective pads constituting the pad pattern of the wiring layer 46 are electrically connected directly to the lower end surfaces of the plural linear conductors 120. The wiring layer 45 is one of representative examples of a first wiring layer according to the present invention, and the wiring layer 46 is one of representative examples of a second wiring pattern according to the present invention.

An end portion on the upper surface side of the buried substrate 100 of the via wiring of the wiring layer 45 formed on the upper surface of the buried substrate 100 becomes a pad pattern (first pad pattern). In addition, a pad pattern (second pad pattern) of the wiring layer 46 formed on the lower surface of the buried substrate 100 can be formed in a position opposing to the first pad pattern via the buried substrate 100. According to this, a vertical transmission path can be formed in the buried substrate 100. On this occasion, by forming the second pad pattern on the lower surface of the buried substrate 100 into a coaxial pad pattern to make the vertical transmission path coaxial, it becomes possible to suppress a cross talk, and hence, such is suitable.

Alternatively, instead of forming the second pad pattern into the coaxial pad pattern, the coaxial structure may also be realized by using a photosensitive resin as the insulating layer 21 to form an insulating layer in a flotation ring shape (annular shape) on the periphery of the via wiring of the wiring layer 45. In that case, in forming the via wiring within the via hole, a pattern of the coaxial shape may be formed on the upper surface of the buried substrate 100, and hence, it is possible to bring an effect for suppressing a cross talk between the respective vertical transmission paths.

It is to be noted that similar to the first embodiment, it is possible to make wirings of different specifications coexistent within the same substrate in such a manner that a wiring suitable for the power source system ((thick wiring pattern)+ (thick insulating layer)) is provided on the core substrate 10, whereas a fine wiring is provided on the buried substrate 100.

[Manufacturing Method of Wiring Substrate According to Fourth Embodiment]

Next, a manufacturing method of the wiring substrate according to the fourth embodiment is described. FIGS. 16A to 16D are views illustrating processes for manufacturing the wiring substrate according to the fourth embodiment.

Figure 16A:
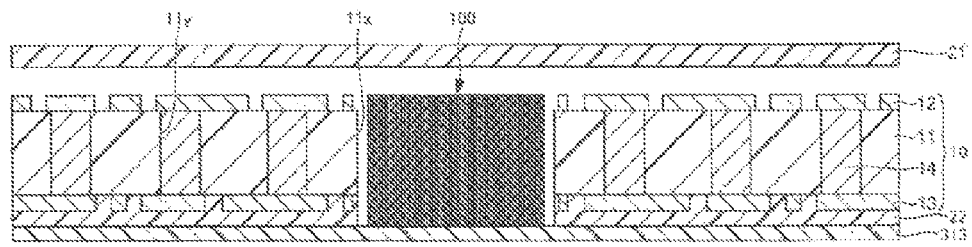
FIGS. 16A to 16D are views illustrating processes for manufacturing the wiring substrate according to the fourth embodiment.

First of all, in a process shown in FIG. 16A, the core substrate 10 is fabricated in the same manner as in the process shown in FIG. 2A, and the buried substrate 100 is fabricated in the same manner as in the process of the first embodiment. Then, the same process as in the process shown in FIG. 11A is executed. However, different from the process shown in FIG. 11A, the thickness of the buried substrate 100 is adjusted in such a manner that the upper surface of the buried substrate 100 and the upper surface of the wiring pattern 12 are substantially flush with each other in a state of being disposed on the temporary fixing film 313. It is to be noted that in the case where a multi-layered wiring layer including the wiring pattern 12 is formed on the upper layer of the resin substrate 11, the thickness of the buried substrate 100 is adjusted in such a manner that the upper surface of the buried substrate 100 and the upper surface of the wiring pattern on the uppermost layer are substantially flush with each other.

Subsequently, a film-like insulating resin serving as the insulating layer 21 is laminated on the upper surface of the core substrate 10 so as to cover the upper surface of the buried substrate 100. Then, the insulating resin is pushed toward the side of the temporary fixing film 313 while heating and cured to form the insulating layer 21. The insulating layer 21 is filled in a gap formed by the side surface of the buried substrate 100 and the inner wall surface of the through-hole 11x, and the upper surface of the buried substrate 100 is covered by the insulating layer 21.

It is to be noted that instead of laminating the film-like insulating resin serving as the insulating layer 21, a liquid-like insulating resin serving as the insulating layer 21 may be applied by a spin coating method or the like and filled in a gap formed by the side surface of the buried substrate 100 and the inner wall surface of the through-hole 11x.

Subsequently, in a process shown in FIG. 16B, the temporary fixing film 313 shown in FIG. 16A is exfoliated, thereby exposing the lower surface of the insulating layer 21 filling the periphery of the buried substrate 100, the lower layer of the insulating layer 22, and the lower surface of the buried substrate 100. The lower surface of the insulating layer 21, the lower surface of the insulating layer 22, and the lower surface of the buried substrate 100 can be, for example, made flush with each other.

Subsequently, in a process shown in FIG. 16C, similar to the process shown in FIG. 2D, the via hole 21x penetrating through the insulating layer 21 and exposing the upper surface of the wiring pattern 12 and the via hole 21y penetrating through the insulating layer 21 and exposing the upper end surfaces of the plural linear conductors 120 are formed in the insulating layer 21. In addition, the via hole 22x penetrating through the insulating layer 22 and exposing the lower surface of the wiring pattern 13 is formed in the insulating layer 22.

Subsequently, in a process shown in FIG. 16D, the wiring layers 45 and 46 are formed on the insulating layers 21 and 22, respectively by a semi-additive method or the like. The wiring layer 45 is configured to include a via wiring filled within the via hole 21x and connected to the wiring pattern 12, a via wiring filled within the via hole 21y and connected to the plural linear conductors 120, and a wiring pattern formed on the upper surface of the insulating layer 21. In addition, the wiring layer 46 is configured to include a via wiring filled within the via hole 22x and connected to the wiring pattern 13, a wiring pattern formed on the lower surface of the insulating layer 22, and a pad pattern formed on the lower surface of the buried substrate 100. It is to be noted that the via wiring filling the via hole 21y and the pad pattern of the wiring layer 46 are disposed in opposing positions to each other via the buried substrate 100. According to this, a vertical transmission path is formed in the buried substrate 100. It is to be noted that on the occasion of forming the wiring layer 46, the matter that it is suitable to adopt the coaxial pad pattern is the same as in the first embodiment.

Figure 16B:
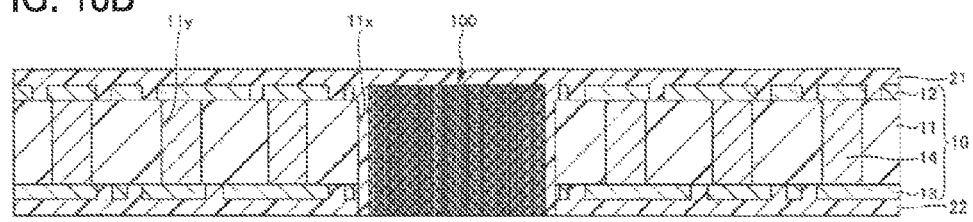
Figure 16C:
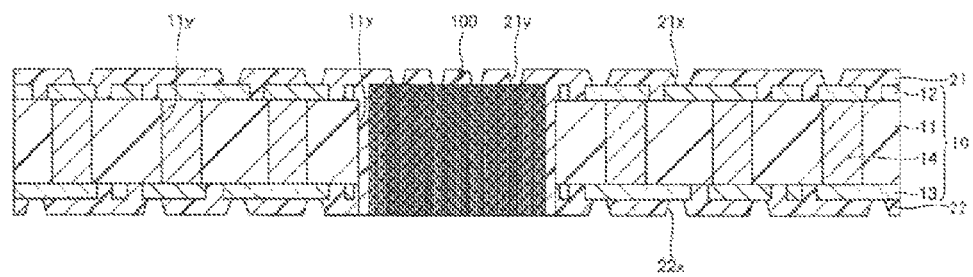
Figure 16D:
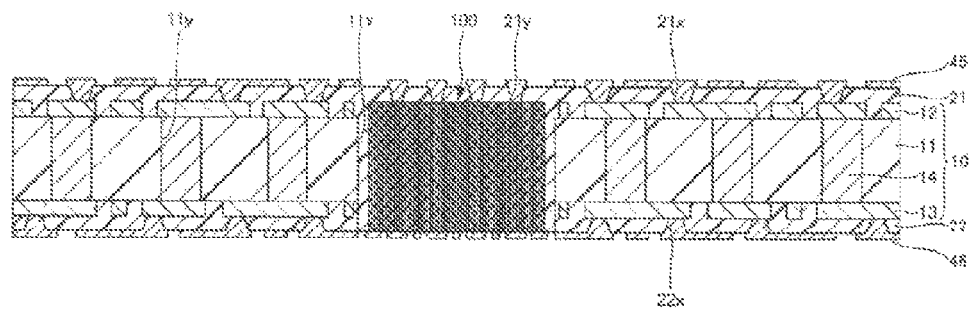

Thereafter, similar to the process shown in FIG. 3D, the insulating layer 51, the wiring layer 61, the insulating layer 71, and the wiring layer 81 are successively provided on one side of the structure shown in FIG. 16D. In addition, the insulating layer 52, the wiring layer 62, the insulating layer 72, and the wiring layer 82 are successively provided on the other side of the structure shown in FIG. 16D. According to the foregoing processes, the wiring substrate 3 shown in FIG. 15 is accomplished.

It is to be noted that the insulating layer 23 serving as a stress relaxation layer may also be formed of an insulating resin having a lower elastic modulus than the insulating resin constituting the insulating layer 21 on the periphery of the buried substrate 100 in the same manner as in the processes shown in FIGS. 12A and 12B in place of the processes shown in FIGS. 16A and 16B.

In this way, in the fourth embodiment, the process of polishing is not existent. On the other hand, as described above, in the first embodiment, the number of times of polishing is two times, whereas in the second embodiment, the number of times of polishing is one time. Since the polishing step is high in costs, in the manufacturing processes according to the fourth embodiment, it is possible to reduce the manufacturing costs of a wiring substrate as compared with the manufacturing processes according to the first and second embodiments.

Fifth Embodiment

In a fifth embodiment, other example of a wiring substrate which may be manufactured without executing the polishing process is described. It is to be noted that in the fifth embodiment, with respect to the same constituent portions as those in the embodiments described already, there may be the case where their explanations are omitted.

[Structure of Wiring Substrate According to Fifth Embodiment]

Figure 17:
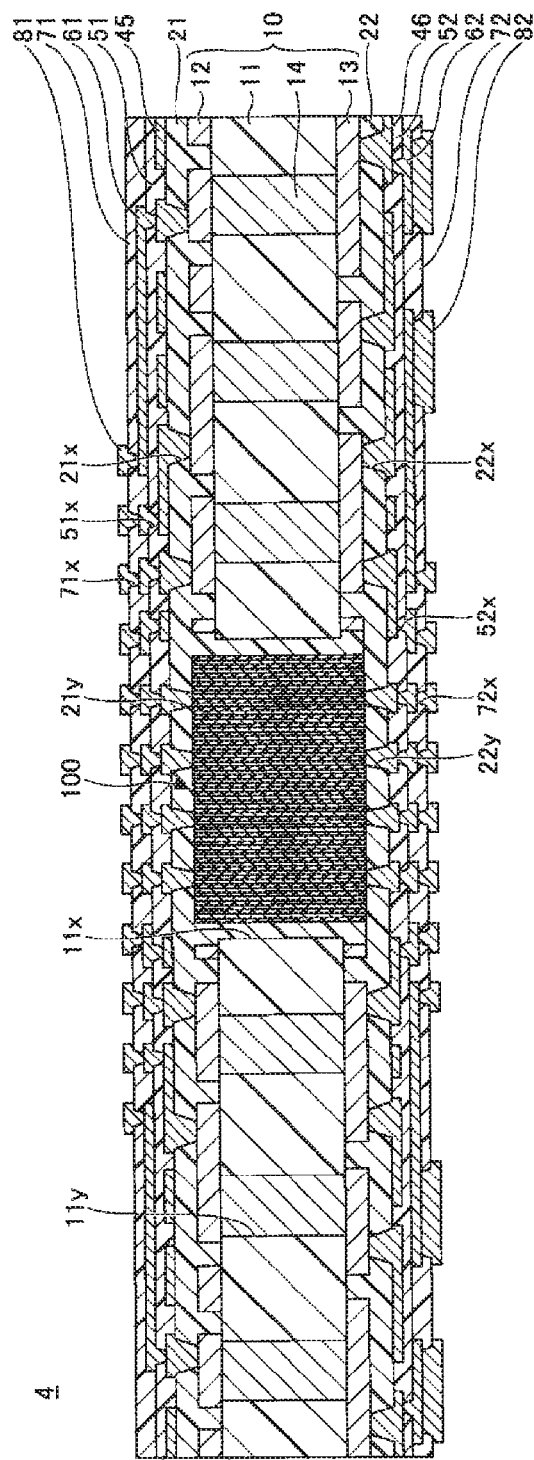
FIG. 17 is a cross-sectional view illustrating a wiring substrate according to a fifth embodiment.

First of all, a structure of a wiring substrate according to a fifth embodiment is described. FIG. 17 is a cross-sectional view illustrating a wiring substrate according to the fifth embodiment.

Reference is made to FIG. 17. A wiring substrate 4 is mainly different from the wiring substrate 1 (see FIGS. 1A to 1B) from the standpoints that the upper surface of the buried substrate 100 and the upper surface of the wiring pattern 12 are substantially flush with each other; and that the upper surface of the buried substrate 100 is covered by the insulating layer 21. In addition, the wiring substrate 4 is mainly different from the wiring substrate 1 (see FIGS. 1A to 1B) from the standpoints that the lower surface of the buried substrate 100 and the lower surface of the wiring pattern 13 are substantially flush with each other; and that the lower surface of the buried substrate 100 is covered by the insulating layer 22.

In the wiring substrate 4, the insulating layer 21 continuously covers the upper surface of the resin substrate 11 and the upper surface of the buried substrate 100. Then, the insulating layer 21 formed on the upper surface of the buried substrate 100 is provided with the via hole 21y, and the upper end surfaces of the plural linear conductors 120 are exposed within the via hole 21y. Similarly, the insulating layer 22 continuously covers the lower surface of the resin substrate 11 and the lower surface of the buried substrate 100. Then, the insulating layer 22 formed on the lower surface of the buried substrate 100 is provided with the via hole 22y, and the lower end surfaces of the plural linear conductors 120 are exposed within the via hole 22y.

The wiring layer 45 is the same as in the fourth embodiment. The wiring layer 46 is formed on the lower side of the insulating layer 22. The wiring layer 46 is configured to include a via wiring filled within the via hole 22x, a via wiring filled within the via hole 22y, and a wiring pattern formed on the lower surface of the insulating layer 22. The wiring layer 46 is electrically connected to the wiring pattern 13 via a via wiring (third via wiring) filled within the via hole 22x. In addition, the wiring layer 46 is electrically connected to the lower end surfaces of the plural linear conductors 120 via a via wiring (fourth via wiring) filled within the via hole 22y.

An end portion on the upper surface side of the buried substrate 100 of the via wiring of the wiring layer 45 formed on the upper surface of the buried substrate 100 becomes a pad pattern (first pad pattern). In addition, an end portion on the lower surface side of the buried substrate 100 of the via wiring of the wiring layer 46 formed on the lower surface of the buried substrate 100 becomes a pad pattern (second pattern). By disposing the first pad pattern and the second pad pattern in opposing positions to each other via the buried substrate 100, a vertical transmission path can be formed in the buried substrate 100.

In addition, a coaxial structure may be realized by using a photosensitive resin as the insulating layers 21 and 22 to form an insulating layer in a flotation ring shape (annular shape) on each of the peripheries of the via wirings of the wiring layers 45 and 46. In that case, in forming the via wiring within the via hole, a pattern of the coaxial shape may be formed on the both surfaces of the buried substrate 100, and hence, it becomes possible to bring an effect for suppressing a cross talk between the respective vertical transmission paths.

It is noted that similar to the first embodiment, it is possible to make wirings of different specifications coexistent within the same substrate in such a manner that a wiring suitable for the power source system ((thick wiring pattern)+(thick insulating layer)) is provided on the core substrate 10, whereas a fine wiring is provided on the buried substrate 100.

[Manufacturing Method of Wiring Substrate According to Fifth Embodiment]

Next, a manufacturing method of the wiring substrate according to the fifth embodiment is described. FIGS. 18A to 18D are views illustrating processes for manufacturing the wiring substrate according to the fifth embodiment.

Figure 18A:
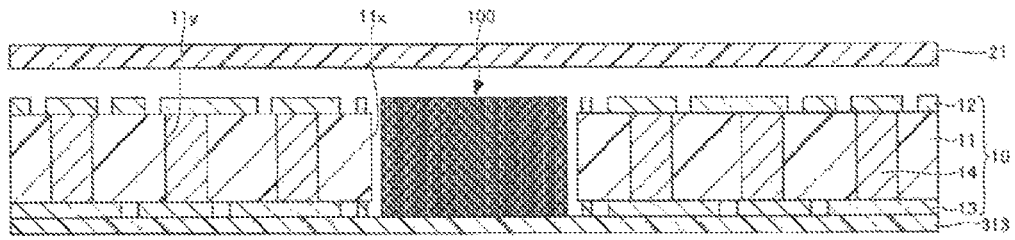
FIGS. 18A to 18D are views illustrating processes for manufacturing the wiring substrate according to the fifth embodiment.

First of all, in a process shown in FIG. 18A, the core substrate 10 is fabricated in the same manner as in the process shown in FIG. 2A, and the buried substrate 100 is fabricated in the same manner as in the process of the first embodiment. Then, the temporary fixing film 313 is laminated on the lower surface side of the core substrate 10, and the buried substrate 100 is disposed on the upper surface of the temporary fixing film 313 exposing within the through-hole 11x of the core substrate 10 and temporarily fixed. At this time, the thickness of the buried substrate 100 is adjusted in such a manner that the upper surface of the buried substrate 100 and the upper surface of the wiring pattern 12 are substantially flush with each other in a state of being disposed on the upper surface of the temporary fixing film 313.

It is to be noted that in the case where a multi-layered wiring layer including the wiring pattern 12 is formed on the upper layer of the resin substrate 11, the thickness of the buried substrate 100 is adjusted in such a manner that the upper surface of the buried substrate 100 and the upper surface of the wiring pattern on the uppermost layer are substantially flush with each other.

Subsequently, a film-like insulating resin serving as the insulating layer 21 is laminated on the upper surface of the core substrate 10 so as to cover the upper surface of the buried substrate 100. Then, the insulating resin is pushed toward the side of the temporary fixing film 313 while heating and cured to form the insulating layer 21. The insulating layer 21 is filled in a gap formed by the side surface of the buried substrate 100 and the inner wall surface of the through-hole 11x, and the upper surface of the buried substrate 100 is covered by the insulating layer 21.

It is to be noted that instead of laminating the film-like insulating resin serving as the insulating layer 21, a liquid-like insulating resin serving as the insulating layer 21 may be applied by a spin coating method or the like and filled in a gap formed by the side surface of the buried substrate 100 and the inner wall surface of the through-hole 11x.

Figure 18B:
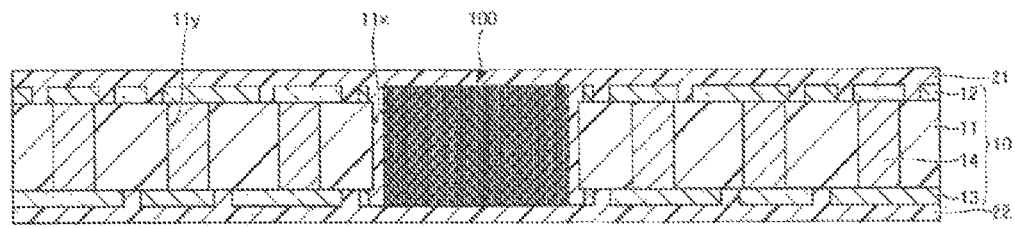

In addition, in the process shown in FIG. 18A, a sticky photosensitive insulating resin film or non-photosensitive insulating resin film serving as the insulating layer 22 may be used in place of the temporary fixing film 313. In this case, the temporary fixation of the buried substrate 100 and the formation of the insulating layer 22 may be carried out at the same time, and hence, such is suitable. In this case, the process shown in FIG. 18B is not necessary.

Subsequently, in a process shown in FIG. 18B, the temporary fixing film 313 shown in FIG. 18A is exfoliated, thereby exposing the lower surface of the core substrate 10 and the lower surface of the buried substrate 100. The lower surface of the core substrate 10 (lower surface of the wiring pattern 13) and the lower surface of the buried substrate 100 can be, for example, made flush with each other. Then, a film-like insulating resin serving as the insulating layer 22 is laminated on the lower surface of the core substrate 10 so as to cover the lower surface of the buried substrate 100. Then, the insulating resin is pushed toward the side of the core substrate 10 while heating and cured to form the insulating layer 22. The lower surface of the buried substrate 100 is covered by the insulating layer 22.

It is to be noted that instead of laminating the film-like insulating resin serving as the insulating layer 22, a liquid-like insulating resin serving as the insulating layer 22 may be applied by a spin coating method or the like.

Figure 18C:
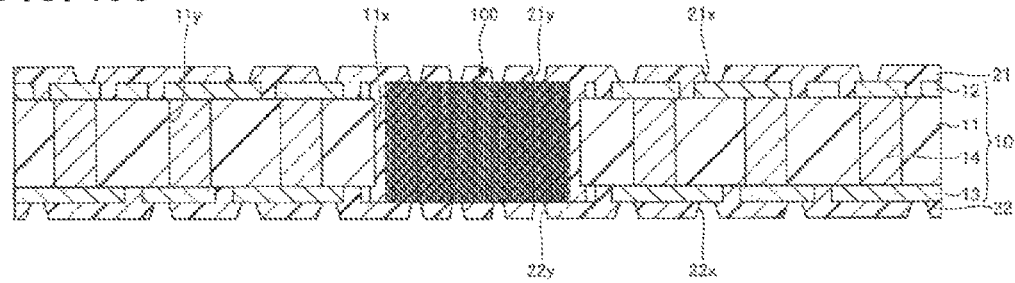

Subsequently, in a process shown in FIG. 18C, similar to the process shown in FIG. 2D, the via hole 21x penetrating through the insulating layer 21 and exposing the upper surface of the wiring pattern 12 and the via hole 21y penetrating through the insulating layer 21 and exposing the upper end surfaces of the plural linear conductors 120 are formed in the insulating layer 21. In addition, the via hole 22x penetrating through the insulating layer 22 and exposing the lower surface of the wiring pattern 13 and the via hole 22y penetrating through the insulating layer 22 and exposing the lower end surfaces of the plural linear conductors 120 are formed in the insulating layer 22. It is to be noted that the via hole 21y and the via hole 22y are disposed in opposing positions to each other via the buried substrate 100. According to this, it becomes possible to form a vertical transmission path in the buried substrate 100.

Subsequently, in a process shown in FIG. 18D, the wiring layers 45 and 46 are formed on the insulating layers 21 and 22, respectively by a semi-additive method or the like. The wiring layer 45 is configured to include a via wiring filled within the via hole 21x and connected to the wiring pattern 12, a via wiring filled within the via hole 21y and connected to the plural linear conductors 120, and a wiring pattern formed on the upper surface of the insulating layer 21. In addition, the wiring layer 46 is configured to include a via wiring filled within the via hole 22x and connected to the wiring pattern 13, a via wiring filled within the via hole 22y and connected to the plural linear conductors, and a wiring pattern formed on the lower surface of the insulating layer 22.

Figure 18D:
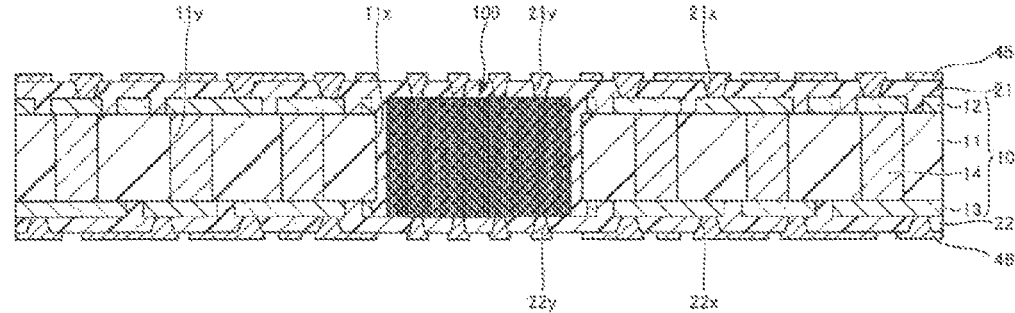

Thereafter, similar to the process shown in FIG. 3D, the insulating layer 51, the wiring layer 61, the insulating layer 71, and the wiring layer 81 are successively provided on one side of the structure shown in FIG. 18D. In addition, the insulating layer 52, the wiring layer 62, the insulating layer 72, and the wiring layer 82 are successively provided on the other side of the structure shown in FIG. 18D. According to the foregoing processes, the wiring substrate 4 shown in FIG. 17 is accomplished.

It is to be noted that the insulating layer 23 serving as a stress relaxation layer may also be formed of an insulating resin having a lower elastic modulus than the insulating resin constituting the insulating layer 21 on the periphery of the buried substrate 100 in the same manner as in the processes shown in FIGS. 12A and 12B in place of the processes shown in FIGS. 18A and 18B.

In this way, in the fifth embodiment, the process of polishing is not existent. On the other hand, as described above, in the first embodiment, the number of times of polishing is two times, whereas in the second embodiment, the number of times of polishing is one time. Since the polishing step is high in costs, in the manufacturing processes according to the fifth embodiment, it is possible to reduce the manufacturing costs of a wiring substrate as compared with the manufacturing processes according to the first and second embodiments.

Sixth Embodiment

In a six embodiment, other example of a wiring substrate which may be manufactured without executing the polishing process is described. It is to be noted that in the sixth embodiment, with respect to the same constituent portions as those in the embodiments described already, there may be the case where their explanations are omitted.

[Structure of Wiring Substrate According to Sixth Embodiment]

Figure 19:
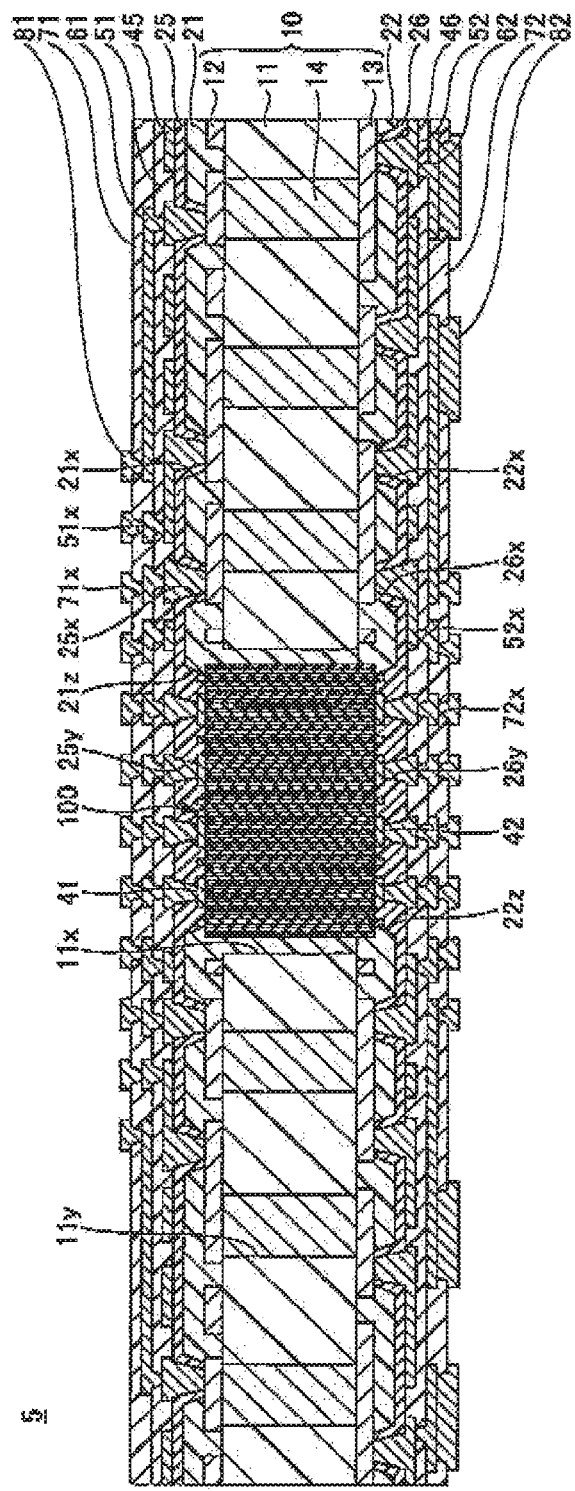
FIG. 19 is a cross-sectional view illustrating a wiring substrate according to a sixth embodiment.

First of all, a structure of a wiring substrate according to a sixth embodiment is described. FIG. 19 is a cross-sectional view illustrating a wiring substrate according to the sixth embodiment.

Reference is made to FIG. 19. A wiring substrate 5 is mainly different from the wiring substrate 1 (see FIGS. 1A to 1B) from the standpoint that the wiring pattern 41 is formed only on the upper surface of the buried substrate 100 and is exposed within an opening portion 21z formed in the insulating layer 21. In addition, the wiring substrate 5 is chiefly different from the wiring substrate 1 (see FIGS. 1A to 1B) from the standpoint that the wiring pattern 42 is formed only on the lower surface of the buried substrate 100 and is exposed within an opening portion 22z formed in the insulating layer 22.

In the wiring substrate 5, the insulating layer 21 continuously covers the upper surface of the resin substrate 11 and the outer periphery of the upper surface of the buried substrate 100. In addition, the insulating layer 21 is provided with the opening portion 21z penetrating through the insulating layer 21 and exposing a region of the upper surface of the buried substrate 100 exclusive of the outer periphery thereof, and the wiring pattern 41 (first pad pattern) formed only on the upper surface of the buried substrate 100 is exposed within the opening portion 21z.

An insulating layer 25 covering the wiring pattern 41 and extending on the insulating layer 21 is formed on the upper side of the insulating layer 21. That is, the insulating layer to be formed on the upper surface of the core substrate 10 is of a two-layered structure in which the insulating layer 25 is provided on the insulating layer 21. The two-layered structure of the insulating layer 21 (first layer) and the insulating layer 25 (second layer) is a representative example of the first insulating layer according to the present invention. The insulating layer 25 is provided with a via hole 25x penetrating through the insulating layer 25 and exposing the upper surface of the wiring pattern 12 and a via hole 25y penetrating through the insulating layer 25 and exposing the upper layer of the wiring pattern 41. The via hole 25x is provided within the via hole 21x.

The insulating layer 22 continuously covers the lower surface of the resin substrate 11 and the outer periphery of the lower surface of the buried substrate 100. In addition, the insulating layer 22 is provided with an opening portion 22z penetrating through the insulating layer 22 and exposing a region of the lower surface of the buried substrate 100 exclusive of the outer periphery thereof, and the wiring pattern 42 (second pad pattern) formed only on the lower surface of the buried substrate 100 is exposed within the opening portion 22z.

An insulating layer 26 covering the wiring pattern 42 and extending on the insulating layer 22 is formed on the lower side of the insulating layer 22. That is, the insulating layer to be formed on the lower surface of the core substrate 10 is of a two-layered structure in which the insulating layer 26 is laminated on the insulating layer 22. The two-layered structure of the insulating layer 22 (third layer) and the insulating layer 26 (fourth layer) is a representative example of the second insulating layer according to the present invention. The insulating layer 26 is provided with a via hole 26x penetrating through the insulating layer 26 and exposing the lower surface of the wiring pattern 13 and a via hole 26y penetrating through the insulating layer 26 and exposing the lower layer of the wiring pattern 42. The via hole 26x is provided within the via hole 22x.

The wiring layer 45 is formed on the upper side of the insulating layer 25. The wiring layer 45 is configured to include a via wiring filled within the via hole 25x, a via wiring filled within the via hole 25y, and a wiring pattern (fifth wiring pattern) formed on the upper surface of the insulating layer 25. The wiring pattern of the wiring layer 45 is electrically connected to the wiring pattern 12 via the via wiring filled within the via hole 25x (namely, via the insulating layers 21 and 25). In addition, the wiring layer 45 is electrically connected to the wiring pattern 41 via the via wiring filled within the via hole 25y (namely, via the insulating layer 25).

The wiring layer 46 is formed on the lower side of the insulating layer 26. The wiring layer 46 is configured to include a via wiring filled within the via hole 26x, a via wiring filled within the via hole 26y, and a wiring pattern (sixth wiring pattern) formed on the lower surface of the insulating layer 26. The wiring pattern of the wiring layer 46 is electrically connected to the wiring pattern 13 via the via wiring filled within the via hole 26x (namely, via the insulating layers 22 and 26). In addition, the wiring layer 46 is electrically connected to the wiring pattern 42 via the via wiring filled within the via hole 26y (namely, via the insulating layer 26).

Similar to the first embodiment, the wiring pattern 41 formed on the upper surface of the buried substrate 100 is connected directly to the upper end portions of the plural linear conductors 120. In addition, the wiring pattern 42 formed on the lower surface of the buried substrate 100 is connected directly to the lower end surfaces of the plural linear conductors 120. By forming pad patterns with the wiring patterns 41 and 42 disposed in the opposing positions on the both surfaces of the buried substrate 100, a vertical transmission path may be formed in the buried substrate 100. On that occasion, when at least one of the pad patterns on the buried substrate 100 is made a coaxial pad pattern to make the vertical transmission path coaxial, it is possible to suppress a cross talk, and hence, such is suitable.

It is to be noted that similar to the first embodiment, it is possible to make wirings of different specifications coexistent within the same substrate in such a manner that a wiring suitable for the power source system ((thick wiring pattern)+ (thick insulating layer)) is provided on the core substrate 10, whereas a fine wiring is provided on the buried substrate 100.

In addition, in the wiring substrate 5, the upper surface of the buried substrate 100 and the upper surface of the wiring pattern 12 may be made substantially flush with each other. In addition, the lower surface of the buried substrate 100 and the lower surface of the wiring pattern 13 may be made substantially flush with each other.

[Manufacturing Method of Wiring Substrate According to Sixth Embodiment]

Next, a method for manufacturing a wiring substrate according to the sixth embodiment is described. FIGS. 20A to 20C and FIGS. 21A to 21C are views illustrating processes for manufacturing a wiring substrate according to the sixth embodiment.

Figure 20A:
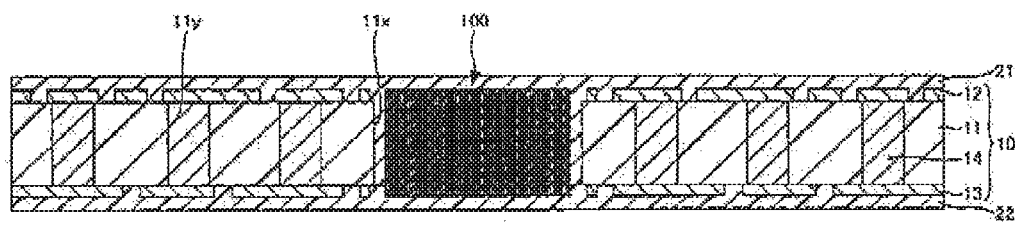
FIGS. 20A to 20C are views illustrating processes for manufacturing the wiring substrate according to the sixth embodiment (part 1).

First of all, in a process shown in FIG. 20A, the insulating layer 21 is formed on the upper surface of the core substrate 10, and the insulating layer 22 is formed on the lower layer of the core substrate 10 in the same manners as in the processes shown in FIGS. 18A and 18B. The insulating layer 21 is filled in a gap formed by the side surface of the buried substrate 100 and the inner wall surface of the through-hole 11x, and the upper surface of the buried substrate 100 is covered by the insulating layer 21. In addition, the lower surface of the buried substrate 100 is covered by the insulating layer 22.

Subsequently, in a process shown in FIG. 20B, the via hole 21x penetrating through the insulating layer 21 and exposing the upper surface of the wiring pattern 12 and the opening portion 21z penetrating through the insulating layer 21 and exposing the region of the upper surface of the buried substrate 100 exclusive of the outer periphery thereof are formed in the insulating layer 21 in the same manner as shown in the process shown in FIG. 2D. The upper end surfaces of the plural linear conductors 120 are exposed within the opening portion 21z. In addition, the via hole 22x penetrating through the insulating 22 and exposing the lower surface of the wiring pattern 13 and the opening portion 22z penetrating through the insulating layer 22 and exposing the region of the lower surface of the buried substrate 100 exclusive of the outer periphery thereof are formed in the insulating layer 22. The lower end surfaces of the plural linear conductors 120 are exposed within the opening portion 22z. It is to be noted that the opening portion 21z exposing the entire region of the upper surface of the buried substrate 100 or the opening portion 22z exposing the entire region of the lower surface of the buried substrate 100 may also be formed.

Subsequently, in a process shown in FIG. 20C, the wiring pattern 41 is formed on the upper surface of the buried substrate 100 exposing within the opening portion 21z. In addition, the wiring pattern 42 is formed on the lower surface of the buried substrate 100 exposing within the opening portion 22z. Each of the wiring patterns 41 and 42 may be, for example, formed by a semi-additive method. It is to be noted that in forming the wiring patterns 41 and 42, the matter that it is suitable to adopt the coaxial pad pattern or the alignment mark forming process by backside power supply plating is the same as in the first embodiment.

Figure 21A:
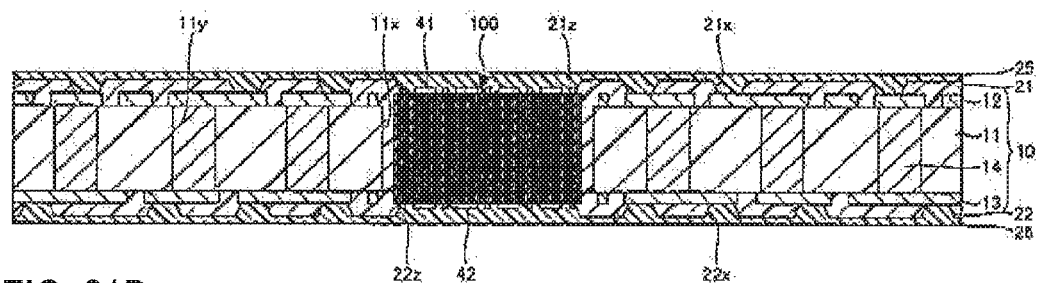
FIGS. 21A to 21C are views illustrating processes for manufacturing the wiring substrate according to the sixth embodiment (part 2).

Subsequently, in a process shown in FIG. 21A, a film-like insulating resin is laminated so as to cover the inside of the via hole 21x, the inside of the opening portion 21z, and the upper surface of the insulating layer 21, followed by heating for curing to form the insulating layer 25. In addition, a film-like insulating resin is laminated so as to cover the inside of the via hole 22x, the inside of the opening portion 22z, and the lower surface of the insulating layer 22, followed by heating for curing to form the insulating layer 26. However, with respect to the formation of the insulating layers 25 and 26, instead of laminating the film-like insulating resin, a liquid-like insulating resin may be spin-coated.

Subsequently, in a process shown in FIG. 21B, the via hole 25x penetrating through the insulating layer 25 and exposing the upper surface of the wiring pattern 12 and the via hole 25y penetrating through the insulating layer 25 and exposing the upper layer of the wiring pattern 41 are formed in the insulating layer 25 in the same manner as in the process shown in FIG. 2D. In addition, the via hole 26x penetrating through the insulating layer 26 and exposing the lower surface of the wiring pattern 13 and the via hole 26y penetrating through the insulating layer 26 and exposing the lower layer of the wiring pattern 42 are formed in the insulating layer 26.

Figure 20B:
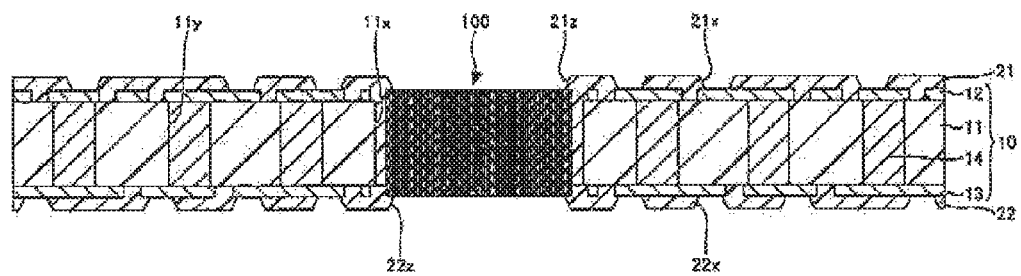
Figure 21B:
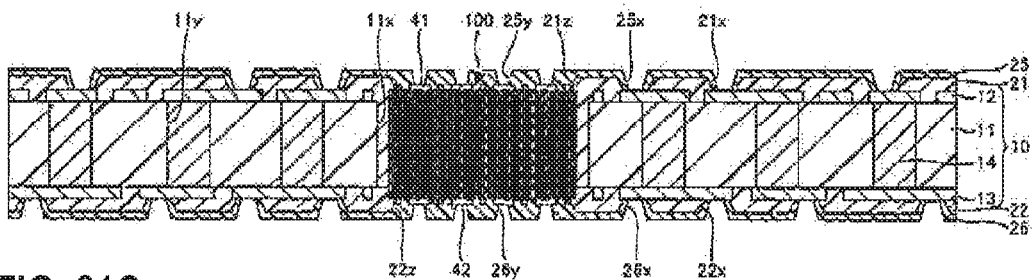

In FIG. 21B, as an example, the via hole 25x is formed within the via hole 21x, and the via hole 26x is formed within the via hole 22x. As other example, the via hole 25x may be formed in a size larger than the via hole 21x so as to include the via hole 21x therein, and the via hole 26x may be formed in a size larger than the via hole 22x so as to include the via hole 22x therein. In addition, the via hole 25x penetrating through the insulating layers 21 and 25 and the via hole 26x penetrating through the insulating layers 22 and 26 may also be formed in the process shown in FIG. 21B without forming the via holes 21x and 22x in the process shown in FIG. 20B.

Subsequently, in a process shown in FIG. 21C, the wiring layers 45 and 46 are formed on the insulating layers 25 and 26, respectively by a semi-additive method or the like. The wiring layer 45 is configured to include a via wiring filled within the via hole 25x and connected to the wiring pattern 12, a via wiring filled within the via hole 25y and connected to the wiring pattern 41 (pad pattern), and a wiring pattern formed on the upper surface of the insulating layer 25. In addition, the wiring layer 46 is configured to include a via wiring filled within the via hole 26x and connected to the wiring pattern 13, a via wiring filled within the via hole 26y and connected to the wiring pattern 42 (pad pattern), and a wiring pattern formed on the lower surface of the insulating layer 26.

Figure 21C:
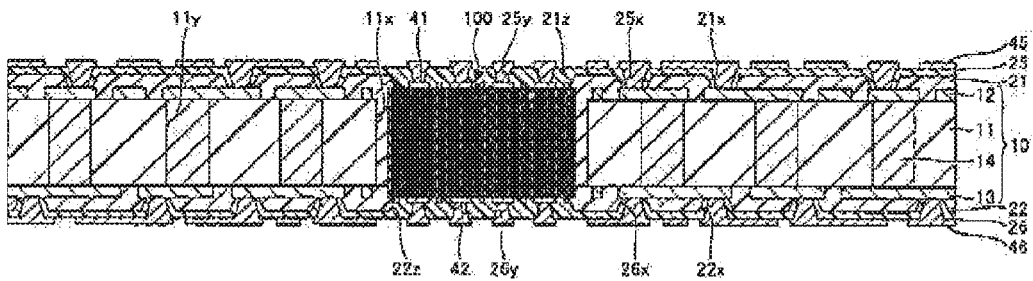

Thereafter, similar to the process shown in FIG. 3D, the insulating layer 51, the wiring layer 61, the insulating layer 71, and the wiring layer 81 are successively laminated on one side of the structure shown in FIG. 21C. In addition, the insulating layer 52, the wiring layer 62, the insulating layer 72, and the wiring layer 82 are successively laminated on the other side of the structure shown in FIG. 21C. According to the foregoing processes, the wiring substrate 5 shown in FIG. 19 is accomplished.

It is to be noted that the insulating layer 23 serving as a stress relaxation layer may also be formed of an insulating resin having a lower elastic modulus than the insulating resin constituting the insulating layer 21 on the periphery of the buried substrate 100 in the same manner as in the processes shown in FIGS. 12A and 12B in place of the process shown in FIG. 20A.

In this way, in the sixth embodiment, the process of polishing is not existent. On the other hand, as described above, in the first embodiment, the number of times of polishing is two times, whereas in the second embodiment, the number of times of polishing is one time. Since the polishing step is high in costs, in the manufacturing processes according to the sixth embodiment, it is possible to reduce the manufacturing costs of a wiring substrate as compared with the manufacturing processes according to the first and second embodiments.

In addition, similar to the first embodiment, in forming the wiring patterns 41 and 42, it is possible to adopt the coaxial pad pattern or the alignment mark forming process by backside power supply plating, and hence, such is suitable.

In addition, in order to expose the upper surface and the lower surface of the buried substrate 100, the opening portions 21z and 22z that are relatively large in size have only to be formed on the insulating layers 21 and 22, respectively, and it is not necessary to form a fine via hole on the insulating layers 21 and 22. For that reason, as the insulating layers 21 and 22, a resin which does not attach importance to resolution or via processability but attaches importance to burying properties may be used. In addition, since the thickness of each of the insulating layers 21 and 22 may be made thick, the filling defect or the like at the time of burying may be suppressed.

In addition, even when irregularities are generated on the insulating layer 21 (insulating layer 22) following the wiring patterns or the like provided in the core substrate 10 and the buried substrate 100, the irregularities may be relieved and increased in flatness by the insulating layer 25 (insulating layer 26) to be formed thereon. According to this, the formability in forming the wiring pattern on the insulating layer 25 (insulating layer 26) may be improved.

In addition, it is also possible to form the insulating layer 21 (insulating layer 22) with a photosensitive resin and to form the insulating layer 25 (insulating layer 26) with a thermosetting resin (non-photosensitive resin). In this case, even if a photosensitive resin having a high coefficient of thermal expansion is used, by further covering it with a thermosetting resin having a low coefficient of thermal expansion, a warp of the core substrate 10 may be adjusted while suppressing the generation of a stress. It is to be noted that it is difficult to adjust the coefficient of thermal expansion with a photosensitive resin. On the other hand, the coefficient of thermal expansion of the thermosetting resin may be, for example, adjusted by the kind or amount of a filler to be contained in the thermosetting resin (the coefficient of thermal expansion may be suppressed low).

In addition, by using a photosensitive resin as the insulating layer (insulating layer 22), the opening portion 21z (opening portion 22z) exposing an area including the upper layer of the buried substrate 100 may be formed by a photolithographic process. Different from the opening method with a laser, this process is suitable from the standpoint that a concern that the buried substrate 100 having relatively low strength is damaged may be reduced.

Seventh Embodiment

In a seventh embodiment, an example of a suitable wiring pattern of a core substrate is described. It is to be noted that in the seventh embodiment, with respect to the same constituent portions as those in the embodiments described already, there may be the case where their explanations are omitted.

[Structure of Core Substrate According to Seventh Embodiment]

Figure 22A:
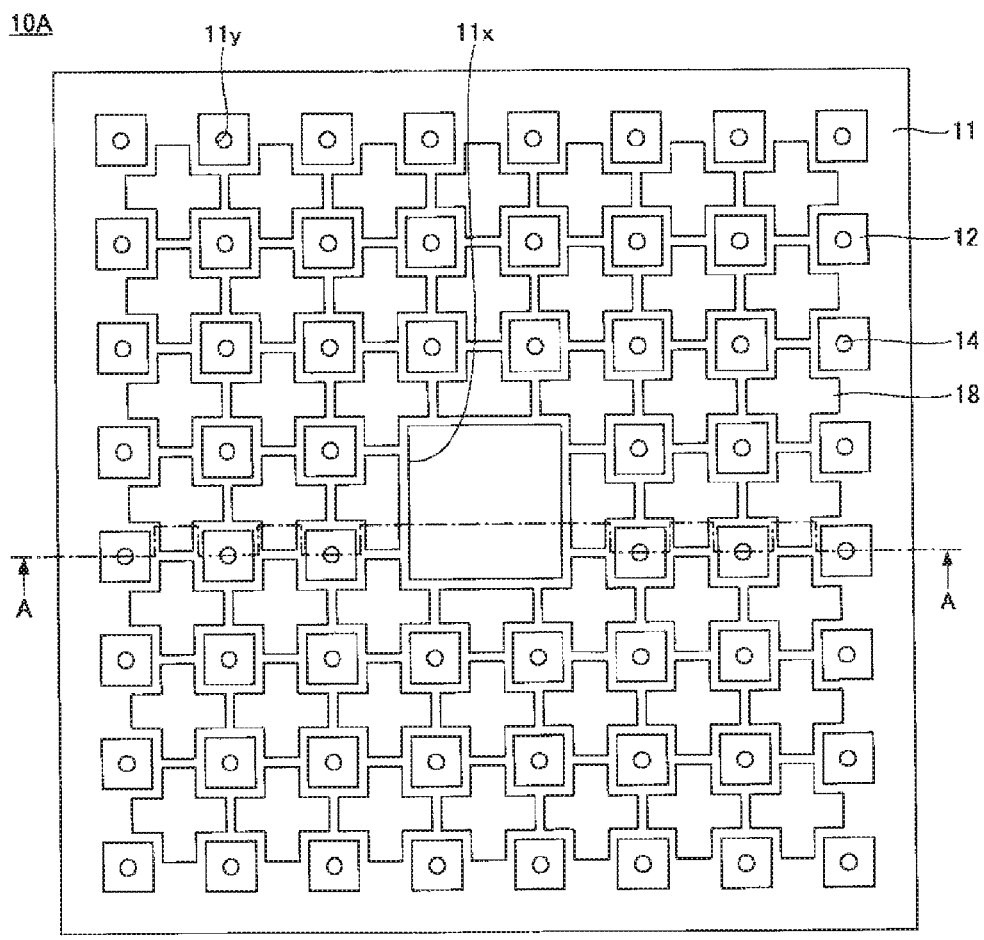
FIGS. 22A to 22B are views illustrating a core substrate according to a seventh embodiment (part 1).
Figure 22B:
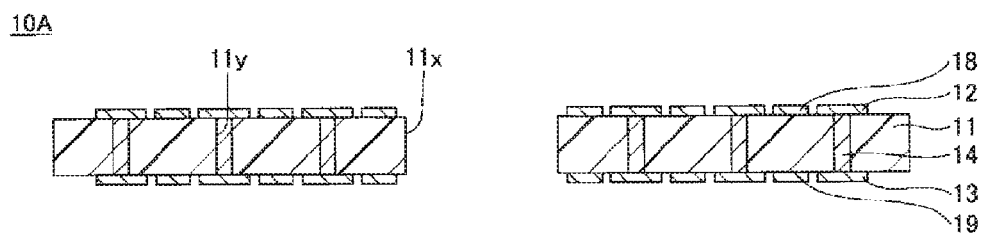

First of all, a structure of a core substrate according to a seventh embodiment is described. FIGS. 22A to 22B are views illustrating a core substrate according to the seventh embodiment (part 1), in which FIG. 22A is a plan view, and FIG. 22B is a cross-sectional view along an A-A line in FIG. 22A.

Reference is made to FIGS. 22A to 22B. In a core substrate 10A, the plural wiring patterns 12 having a rectangular planar shape are disposed periodically on the upper surface of the resin substrate 11. In addition, the plural wiring patterns 13 having a rectangular planar shape are disposed periodically on the lower surface of the resin substrate 11. The position of the each wiring pattern 12 and the position of the each wiring pattern 13 substantially overlap with each other in planar view. It is to be noted that the planar shape of each of the wiring patterns 12 and 13 may also be a polygon other than the rectangle, a circle, or the like.

The wiring pattern 12 and the wiring pattern 13 disposed in a position substantially overlapping with each other in planar view are electrically connected to each other via the through-wiring 14 filling the through-hole 11y. The respective through-holes 11y are formed in a substantially equal pitch. A diameter of the through-hole 11y may be, for example, 100 μm or more, and a pitch of the through-holes 11y may be, for example, 300 μm or more.

In addition, a periodic pattern 18 divided in a length of not more than the pitch of the through-holes 11y is disposed on the upper surface of the resin substrate 11. In addition, a periodic pattern 19 divided in a length of not more than the pitch of the through-holes 11y is disposed on the lower surface of the resin substrate 11. The position of the each pattern 18 and the position of the each pattern 19 substantially overlap with each other in planar view. Each of the patterns 18 and 19 is a floating pattern electrically floating without being connected to any wiring patterns including the wiring patterns 12 and 13. The floating pattern is a pattern for expansion, and when connected to a pattern in which through-holes are existent, it is possible to bring about the same function (e.g., a power source line, a ground line, a signal line, etc.). A planar shape of each of the patterns 18 and 19 may be, for example, a cross shape.

Figure 23A:
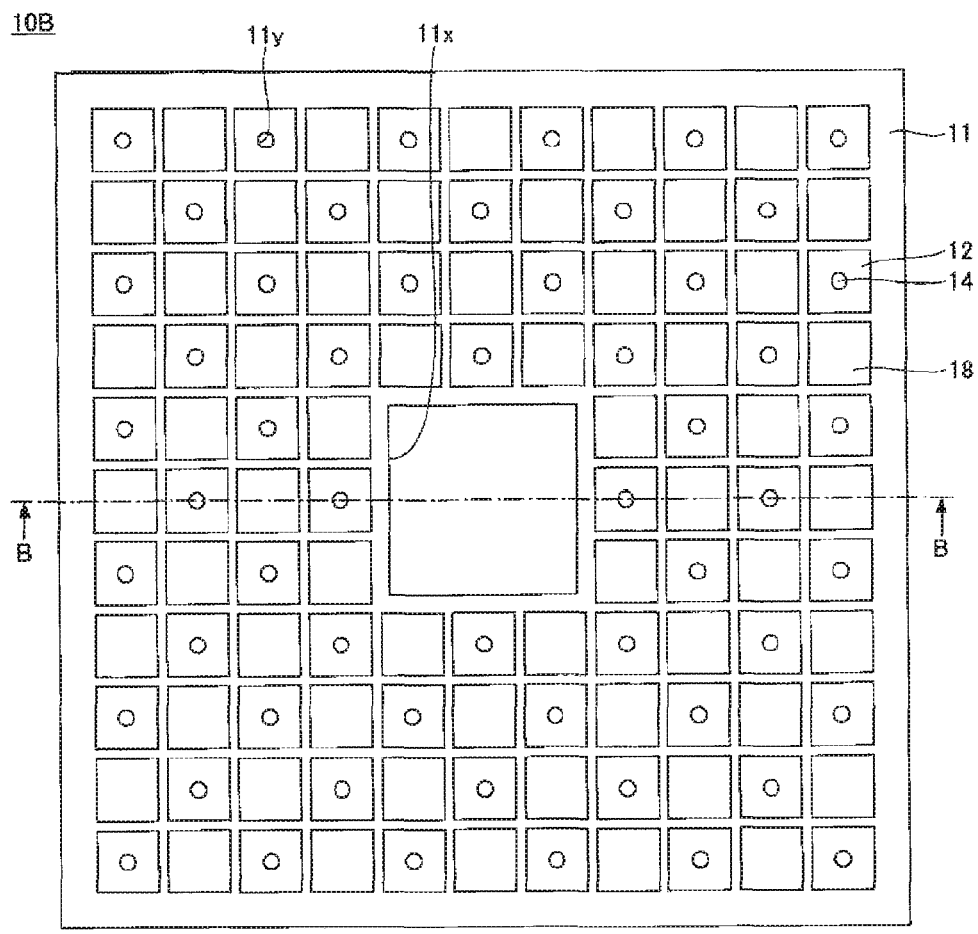
FIGS. 23A to 23B are views illustrating the core substrate according to the seventh embodiment (part 2).
Figure 23B:
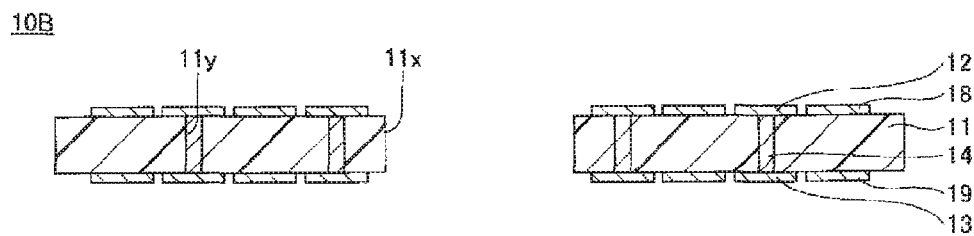

Other example is shown in FIGS. 23A to 23B. FIGS. 23A to 23B are views illustrating a core substrate according to the seventh embodiment (part 2), in which FIG. 23A is a plan view, and FIG. 23B is a cross-sectional view along a B-B line in FIG. 23A.

Reference is made to FIGS. 23A to 23B. In a core substrate 10B, the plural wiring patterns 12 having a rectangular planar shape are disposed periodically (checkerwise) on the upper surface of the resin substrate 11. In addition, the plural wiring patterns 13 having a rectangular planar shape are disposed periodically (checkerwise) on the lower surface of the resin substrate 11. The position of the each wiring pattern 12 and the position of the each wiring pattern 13 substantially overlap with each other in planar view. It is to be noted that the planar shape of each of the wiring patterns 12 and 13 may also be a polygon other than the rectangle, a circle, or the like.

The wiring pattern 12 and the wiring pattern 13 disposed in a position substantially overlapping with each other in planar view are electrically connected to each other via the through-wiring 14 filling the through-hole 11y. The respective through-holes 11y are formed in a substantially equal pitch. A diameter of the through-hole 11y may be, for example, 100 µm or more, and a pitch of the through-holes 11y may be, for example, 300 µm or more.

In addition, the rectangular pattern 18 (having substantially the same shape as in the wiring pattern 12) divided in a length of not more than the pitch of the through-holes 11y is disposed between the adjacent wiring patterns 12 on the upper surface of the resin substrate 11. In addition, the rectangular pattern 19 (having substantially the same shape as in the wiring pattern 13) divided in a length of not more than the pitch of the through-holes 11y is disposed between the adjacent wiring patterns 13 on the lower surface of the resin substrate 11. The position of the each pattern 18 and the position of the each pattern 19 substantially overlap with each other in planar view. Each of the patterns 18 and 19 is a floating pattern electrically floating without being connected to any wiring patterns including the wiring patterns 12 and 13.

Figure 20C:
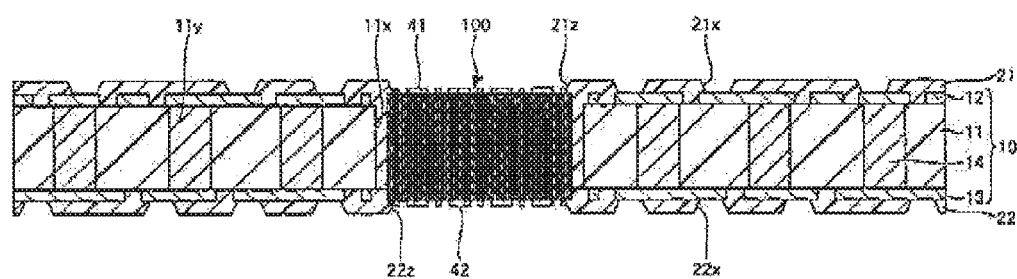
Figure 24A:
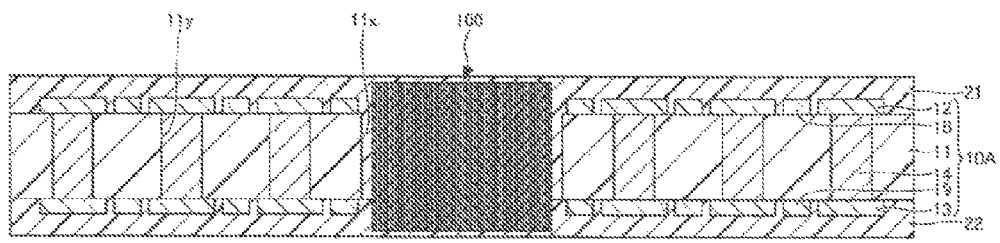
FIGS. 24A to 24C are an example in which the core substrate shown in FIGS. 22A to 22B is applied to the first embodiment.
Figure 24B:
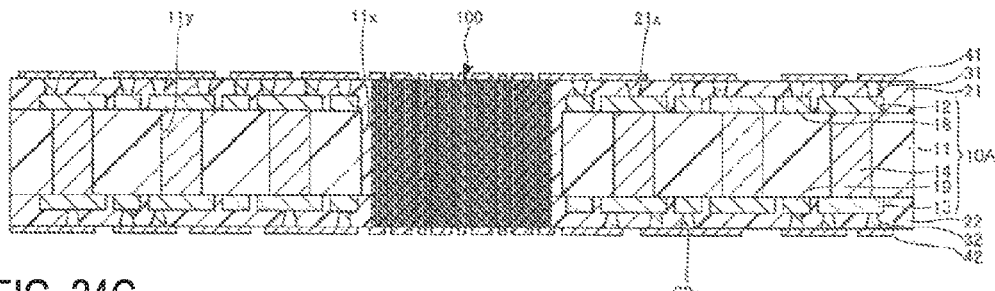
Figure 24C:
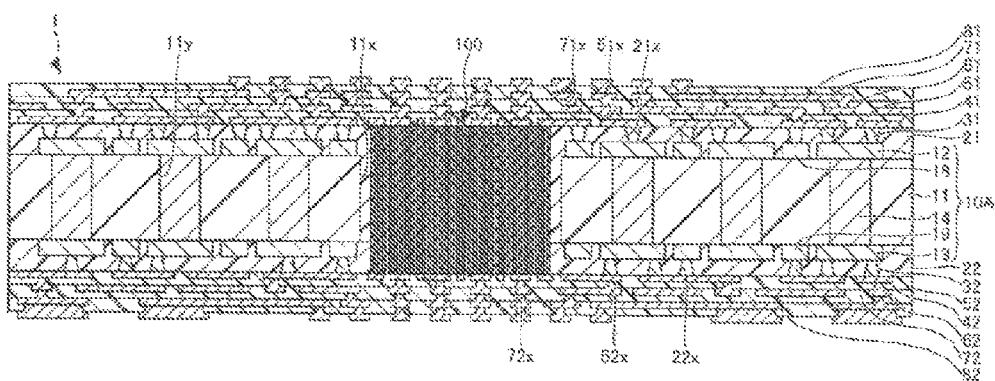

FIGS. 24A to 24C are concerned with an example in which the core substrate 10A shown in FIGS. 20A to 20B is applied to the first embodiment. First of all, in a process shown in FIG. 24A, the core substrate 10A is fabricated in the same manner as in the process shown in FIG. 2A, and the buried substrate 100 is fabricated in the same manner as in the process shown in FIG. 2B. Then, each of the insulating resins serving as the insulating layers 21 and 22 is pushed toward the side of the core substrate 10A while heating in the same manner as in the process shown in FIG. 2C. According to this, the insulating resin flows into the periphery of the buried substrate 100 within the through-hole 11x, and the insulating resin is then cured to form the insulating layers 21 and 22, respectively. At this time, the upper surface of the buried substrate 100 is covered by the insulating layer 21, and the lower surface of the buried substrate 100 is covered by the insulating layer 22. It is to be noted that an interface between the insulating layer 21 and the insulating layer 22 on the periphery of the buried substrate 100 may be located in any position.

Subsequently, in a process shown in FIG. 24B, the wiring pattern 41 is formed on the upper surface of the insulating layer 21 and the upper surface of the buried substrate 100 in the same manner as in the processes shown in FIG. 2D to FIG. 3C. In addition, the wiring pattern 42 is formed on the lower surface of the insulating layer 22 and the lower surface of thee buried substrate 100.

Subsequently, in a process shown in FIG. 24C, similar to the process shown in FIG. 3D, the insulating layer 51, the wiring layer 61, the insulating layer 71, and the wiring layer 81 are successively provided on one side of the structure shown in FIG. 24B. In addition, the insulating layer 52, the wiring layer 62, the insulating layer 72, and the wiring layer 82 are successively provided on the other side of the structure shown in FIG. 24B. According to the foregoing processes, the wiring substrate 1 shown in FIGS. 1A to 1B is accomplished.

In this way, by allowing the through-holes and wiring patterns to be formed on the core substrate to have unified and regular shape and disposition, it is possible to increase the multiplicity of use of the core substrate. That is, in conformity with the design of a wiring substrate, it is possible to choose a through-hole located in an optimum position and a wiring pattern among the through-holes formed in equal gaps over the entirety of the core substrate and to connect them to each other. All of the wiring patterns of the core substrate are independent upon each other; however, by electrically connecting the wiring patterns to each other via a wiring layer to be formed thereon, it is also possible to form a wide power source line or ground line.

The buried substrate 100 is a substrate having a high flexibility of design such that a narrow-pitched vertical transmission path may be formed in an arbitrary position. However, since it is not easy to change the wiring pattern of the core substrate on the periphery of the buried substrate 100, the properties of the buried substrate 100 may not be thoroughly brought out. Namely, the structure capable of being formed by the wiring pattern of the core substrate on the outer periphery of the buried substrate 100 is limited.

However, by taking the structure of the core substrate as shown in FIGS. 22A to 22B or FIGS. 23A to 23B, the portion of the core substrate may also be dealt as in the buried substrate 100 in which the pitch of the vertical transmission path is very large. By using different combinations for different purposes in such a manner that the buried substrate 100 is applied to a portion where a fine vertical transmission path or an accurate layout adjustment is required, whereas the core substrate 10A or 10B is applied to a portion where no problem is generated even in a large vertical transmission path or a rough layout adjustment, a very high flexibility of design may be obtained. Namely, the structure as shown in FIGS. 22A to 22B or FIGS. 23A to 23B may be used as a core substrate for wiring substrates having various applications or designs, and hence, it becomes possible to commoditize the core substrate.

In addition, according to the structure as shown in FIGS. 22A to 22B or FIGS. 23A to 23B, the through-holes and the wiring patterns are uniformly distributed with good symmetry on the upper and lower surfaces and within the plane, and hence, a warp is suppressed. In addition, the through-holes 11y (through-wirings 14) are formed over the entire surface, and hence, they also act as a heat conduction path, so that the heat dissipation of the core substrate can be increased.

In addition, in general, through-holes or portions of thick wiring patterns on the upper and lower surfaces are also large in elongation at the time of heating. Therefore, when the pattern shape or distribution varies for every product, the shrinkage of the substrate varies largely. However, in the case of the structure of the core substrate as shown in FIGS. 22A to 22B or FIGS. 23A to 23B, all of the through-holes or wiring patterns are the same in terms of the shape and distribution, and hence, even when the product changes, the change of shrinkage can be minimized. Accordingly, the core substrate as shown in FIGS. 22A to 22B or FIGS. 23A to 23B may be suitably used as a general-purpose core substrate when combined with the buried substrate 100.

In addition, in the case of the structure of the core substrate as shown in FIGS. 22A to 22B or FIGS. 23A to 23B, the entire surface of the core substrate has a periodically identical pattern. For that reason, even when the buried substrate 100 is buried in any position, the pattern shape and disposition on the periphery of the buried substrate 100 are always constant, so that it is free from any limitation with respect to the burying position.

Eighth Embodiment

In an eighth embodiment, an example in which a core substrate is a flexible substrate is described. It is to be noted that in the eighth embodiment, with respect to the same constituent portions as those in the embodiments described already, there may be the case where their explanations are omitted.

[Structure of Core Substrate According to Eighth Embodiment]

Figure 25:
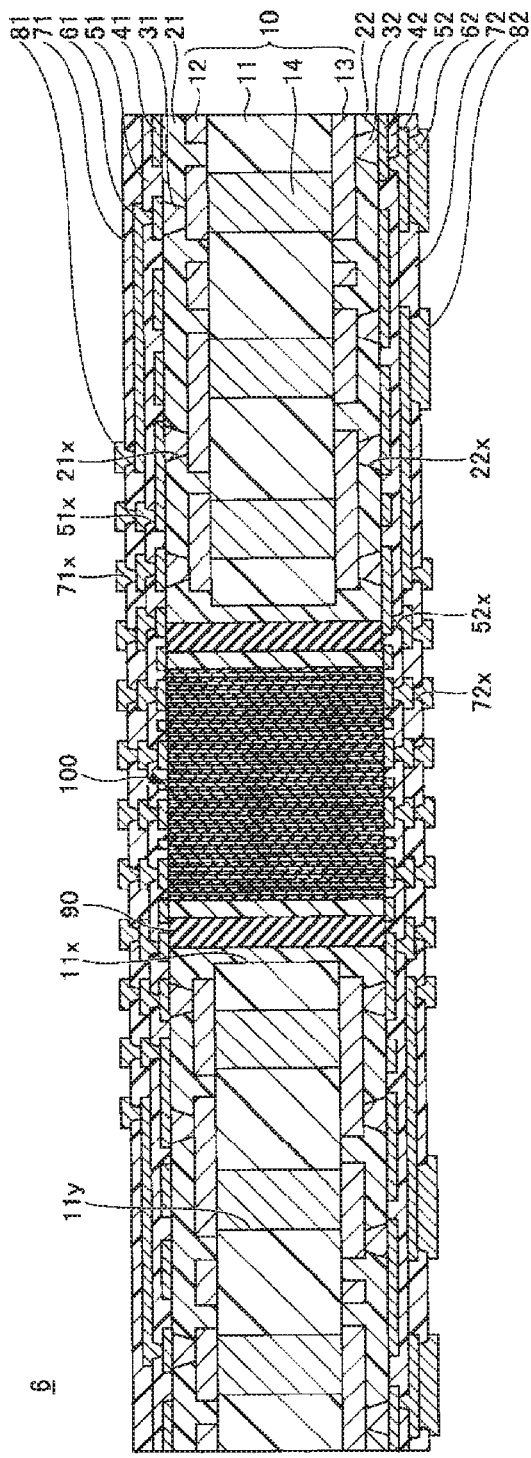
FIG. 25 is a cross-sectional view illustrating a wiring substrate according to an eighth embodiment.

First of all, a structure of a wiring substrate according to an eighth embodiment is described. FIG. 25 is a cross-sectional view illustrating a wiring substrate according to the eighth embodiment.

Reference is made to FIG. 25. A wiring substrate 6 is mainly different from the wiring substrate 1 (see FIGS. 1A to 1B) from the standpoints that a flexible resin, such as a polyimide-based resin, is used as a material of the resin substrate 11; and that a rigid frame material 90 is provided on the periphery of the buried substrate 100. For example, a resin (e.g., an epoxy-based resin, etc.) having higher rigidity than the resin constituting the resin substrate 11 may be used as the frame material 90. A frame-like wiring substrate provided with a through-electrode may also be used as the frame material 90.

[Manufacturing Method of Wiring Substrate According to Eighth Embodiment]

Figure 26A:
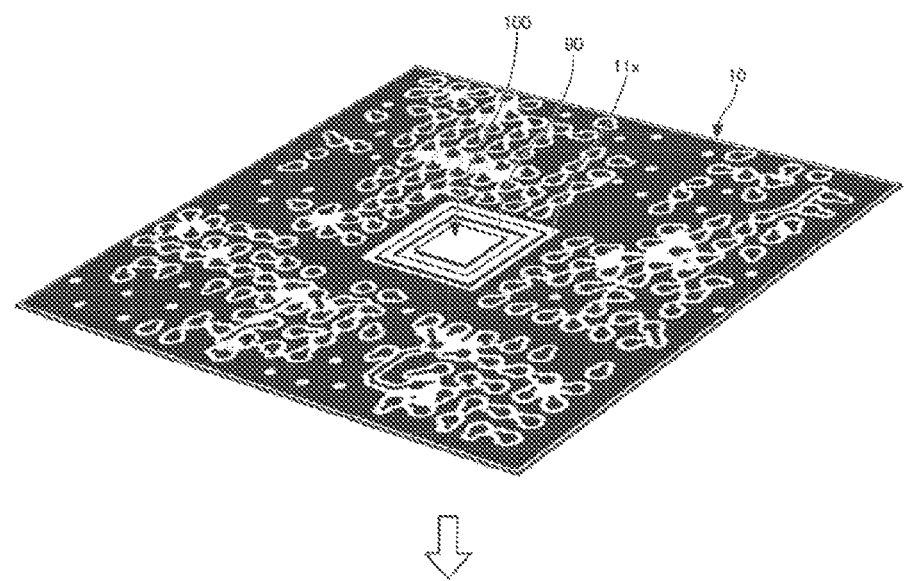
FIGS. 26A to 26B are views illustrating processes for manufacturing the wiring substrate according to the eighth embodiment.
Figure 26B:
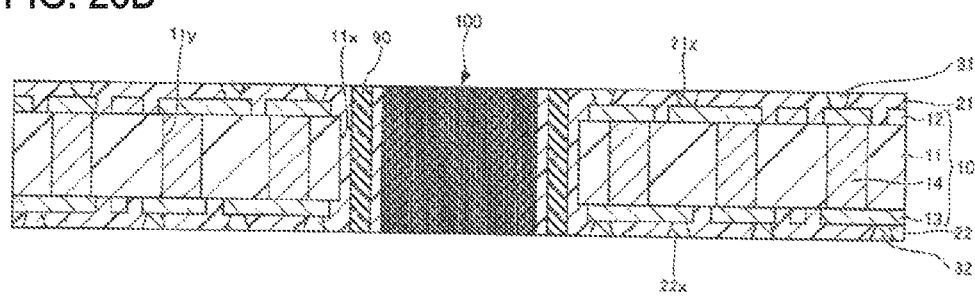

Next, a manufacturing method of the wiring substrate according to the eighth embodiment is described. FIGS. 26A to 26B are views illustrating processes for manufacturing the wiring substrate according to the eighth embodiment.

First of all, in a process shown in FIG. 26A, the flexible core substrate 10 is fabricated using a flexible resin, such as a polyimide-based resin, as the resin substrate 11 in the same manner as in the process shown in FIG. 2A. In addition, the buried substrate 100 is fabricated in the same manner as in the process of the first embodiment. Then, the buried substrate 100 and the frame material 90 surrounding the periphery thereof are disposed within the through-hole 11x of the core substrate 10. Thereafter, film-like insulating resins (flexible resins, such as a polyimide-based resin) serving as the insulating layers 21 and 22 are laminated on the both surfaces of the core substrate 10 so as to cover the upper and lower surfaces of the buried substrate 100.

Then, each of the insulating resins serving as the insulating layers 21 and 22 is pushed toward the side of the core substrate 10 while heating. According to this, the insulating resin flows into the periphery of the buried substrate 100 within the through-hole 11x and the periphery of the frame material 90, and the insulating resin is then cured to form the insulating layers 21 and 22, respectively. At this time, the upper surface of the buried substrate 100 is covered by the insulating layer 21, and the lower surface of the buried substrate 100 is covered by the insulating layer 22. It is to be noted that an interface between the insulating layer 21 and the insulating layer 22 on the periphery of the buried substrate 100 may be located in any position.

Subsequently, in a process shown in FIG. 26B, the same processes as those shown in FIG. 2D to FIG. 3D are executed. According to this, the upper surface of the buried substrate 100 and the upper surface of the frame material 90 are exposed from the upper surface of the insulating layer 21, and the lower surface of the buried substrate 100 and the lower surface of the frame material 90 are exposed from the lower surface of the insulating layer 22. The upper surface of the buried substrate 100, the upper surface of the frame material 90, the upper surface of the insulating layer 21, and the upper surface of the via wiring 31 can be, for example, made flush with each other. In addition, the lower surface of the buried substrate 100, the lower surface of the frame material 90, the lower surface of the insulating layer 22, and the lower surface of the via wiring 32 can be, for example, made flush with each other.

Thereafter, the wiring substrate 6 shown in FIG. 25 is accomplished the processes as those shown in FIGS. 3C and 3D.

In this way, in the eighth embodiment, the flexible resin, such as a polyimide-based resin, is used as the material of the resin substrate 11, and hence, the flexible wiring substrate 6 which is suitable for a wearable terminal or the like can be realized. In addition, the wiring substrate 6 has the buried substrate 100 provided with the high-density linear conductors built-in, and hence, it is possible to provide a high-density connection comparable to a silicon interposer.

Furthermore, in view of the fact that the high-rigidity frame material 90 is disposed on the periphery of the buried substrate 100, when the wiring substrate 6 is bent, a stress applying to the buried substrate 100 is relieved, and a concern that the buried substrate 100 is broken can be reduced.

It is to be noted that in the case where the thickness of the buried substrate 100 is made thin to such extent that the buried substrate 100 itself is flexibly bent, or in the case where the size of the buried substrate 100 is small against a curvature to be assumed at the time of using the wiring substrate 6, it is also possible to eliminate the frame material 90.

Modified Example 1

In Modified Example 1, an example of a wiring substrate in which the lower surface of the buried substrate and the lower surface of the wiring pattern of the core substrate are not flush with each other, and the lower surface of the buried substrate is covered by the insulating layer is described. It is to be noted that in Modified Example 1, with respect to the same constituent portions as those in the embodiments described already, there may be the case where their explanations are omitted.

Figure 27:
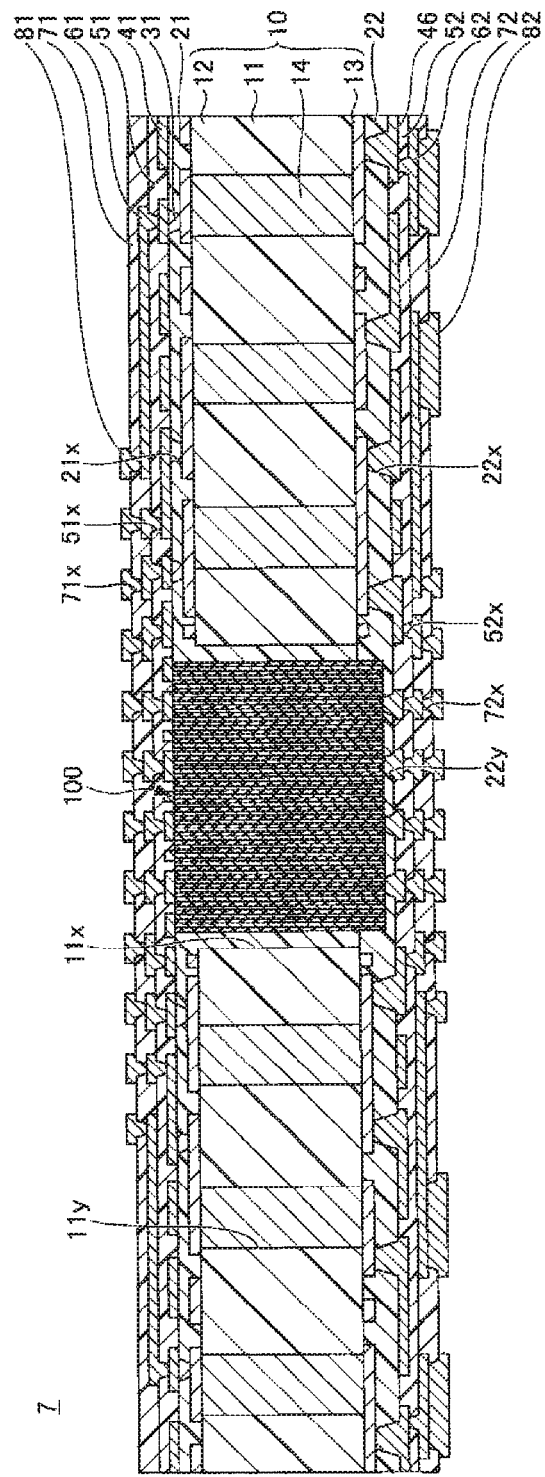
FIG. 27 is a cross-sectional view illustrating a wiring substrate according to Modified Example 1.

FIG. 27 is a cross-sectional view illustrating a wiring substrate according to Modified Example 1. Reference is made to FIG. 27. A wiring substrate 7 is mainly different from the wiring substrate 1 (see FIGS. 1A to 1B) from the standpoints that the lower surface of the buried substrate 100 and the upper surface of a wiring pattern of the wiring layer 46 are not flush with each other; and that the lower surface of the buried substrate 100 is covered by the insulating layer 22.

It is to be noted that similar to the first embodiment, it is possible to make wirings of different specifications coexistent within the same substrate in such a manner that a wiring suitable for the power source system ((thick wiring pattern)+

(thick insulating layer)) is provided on the core substrate 10, whereas a fine wiring is provided on the buried substrate 100.

Modified Example 2

In Modified Example 2, an example of a wiring substrate in which the wiring pattern of the buried substrate and the wiring pattern of the core substrate are directly connected to each other is described. It is to be noted that in Modified Example 2, with respect to the same constituent portions as those in the embodiments described already, there may be the case where their explanations are omitted.

[Structure of Wiring Substrate According to Modified Example 2]

Figure 28:
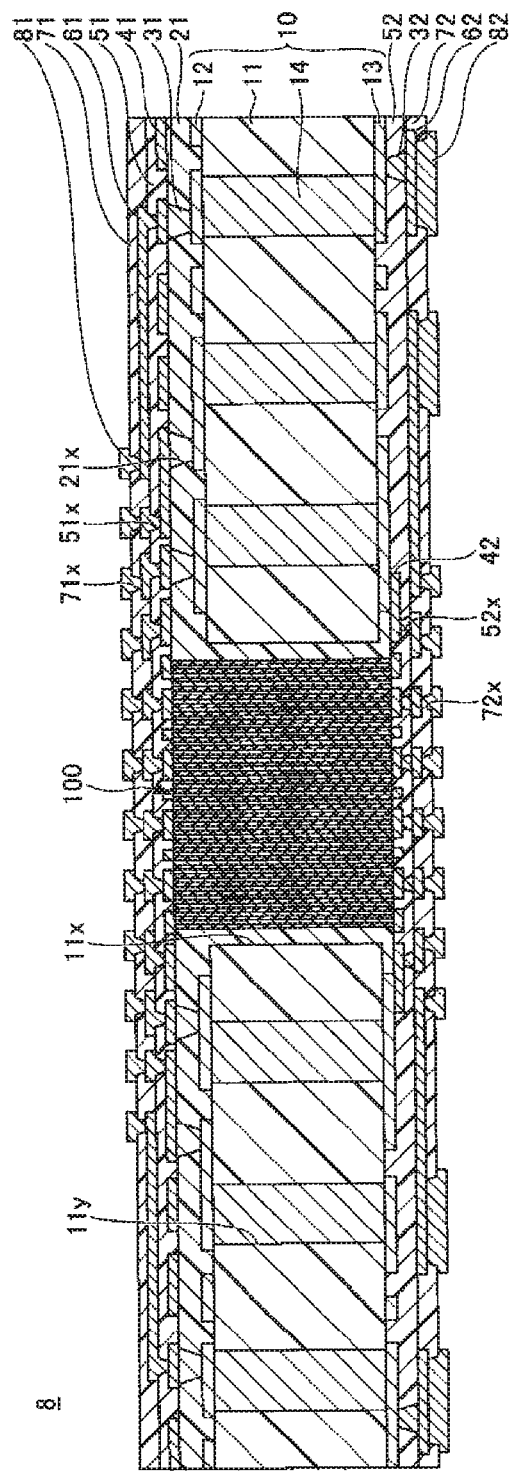
FIG. 28 is a cross-sectional view illustrating a wiring substrate according to Modified Example 2.

First of all, a structure of a wiring substrate according to Modified Example 2 is described. FIG. 28 is a cross-sectional view illustrating a wiring substrate according to Modified Example 2.

Reference is made to FIG. 28. A wiring substrate 8 is mainly different from the wiring substrate 1 (see FIGS. 1A to 1B) from the standpoint that the upper surface of the wiring pattern 42 formed on the lower surface of the buried substrate 100 and the lower surface of the wiring pattern 13 formed on the lower surface of the resin substrate 11 are directly connected to each other without via a via wiring or the like. In addition, the insulating layer 22 is not provided, and a difference in level is generated between the wiring pattern 13 formed on the lower surface of the resin substrate 11 and the wiring pattern 42 formed on the lower surface of the buried substrate 100.

It is to be noted that similar to the first embodiment, it is possible to make wirings of different specifications coexistent within the same substrate in such a manner that a wiring suitable for the power source system ((thick wiring pattern)+(thick insulating layer)) is provided on the core substrate 10, whereas a fine wiring is provided on the buried substrate 100.

[Manufacturing Method of Wiring Substrate According to Modified Example 2]

Figure 29A:
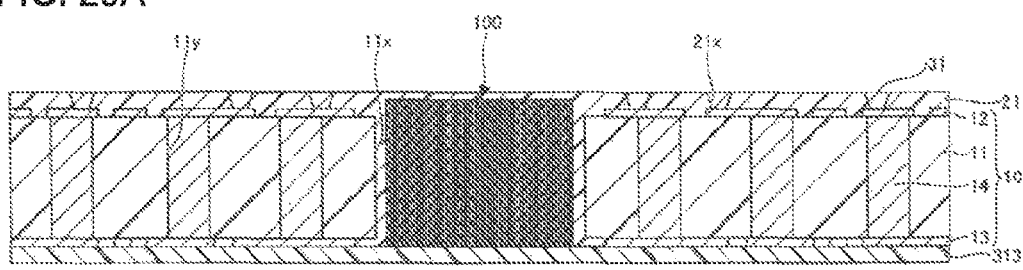
FIGS. 29A to 29C are views illustrating processes for manufacturing the wiring substrate according to Modified Example 2.
Figure 29B:
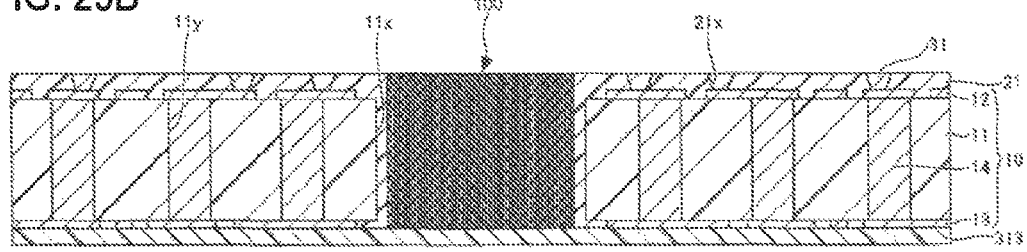
Figure 29C:
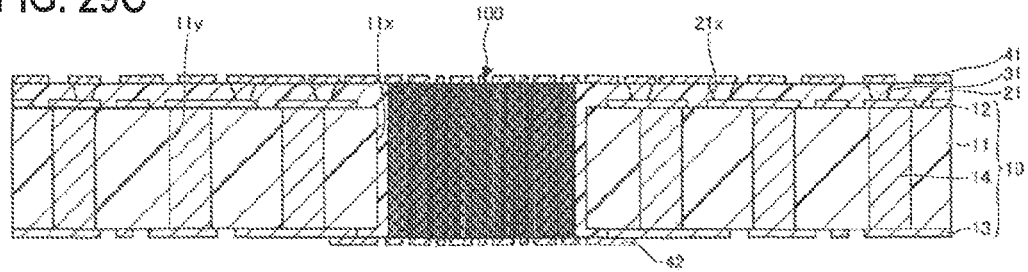

Next, a manufacturing method the wiring substrate according to Modified Example 2 is described. FIGS. 29A to 29C are views illustrating processes for manufacturing the wiring substrate according to Modified Example 2.

First of all, in a process shown in FIG. 29A, after executing the same process shown in FIG. 18A, the via hole 21x penetrating through the insulating layer 21 and exposing the upper surface of the wiring pattern 12 is formed in the insulating layer 21. Then, copper (Cu) or the like is filled within the via hole 21x by a plating method or the like in the same manner as in the process shown in FIG. 3A, thereby forming the via wiring 31. The via wiring 31 is electrically connected to the wiring pattern 12.

Subsequently, in a process shown in FIG. 29B, the upper surface of the structure shown in FIG. 29A is polished in the same manner as in the process shown in FIG. 3B, thereby exposing the upper surface of the buried substrate 100 from the upper surface of the insulating layer 21. The upper surface of the buried layer 100, the upper surface of the insulating layer 21, and the upper surface of the via wiring 31 can be, for example, made flush with each other.

Subsequently, in a process shown in FIG. 29C, after removing the temporary fixing film 313, the wiring patterns 41 and 42 are formed. The wiring patterns 41 and 42 may be, for example, formed by a semi-additive method. The wiring pattern 42 is formed directly on the lower surface of the wiring pattern 13 and the lower surface of the buried substrate 100 without via a via wiring. It is to be noted that on the occasion of forming the wiring patterns 41 and 42, the matter that it is suitable to adopt the coaxial pad pattern or the alignment mark forming process by backside power supply plating is the same as in the first embodiment.

Thereafter, similar to the process shown in FIG. 3D, the insulating layer 51, the wiring layer 61, the insulating layer 71, and the wiring layer 81 are successively provided on one side of the structure shown in FIG. 29C. In addition, the insulating layer 52, the wiring layer 62, the insulating layer 72, and the wiring layer 82 are successively provided on the other side of the structure shown in FIG. 29C. According to the foregoing processes, the wiring substrate 8 shown in FIG. 28 is accomplished.

In this way, in Modified Example 2, the number of times of polishing is only one time for polishing the upper surface of the structure shown in FIG. 29A in the process shown in FIG. 29B. On the other hand, in the first embodiment, since the both surface of the structure shown in FIG. 3A are polished, the number of times of polishing is two times. Since the polishing step is high in costs, in the manufacturing processes according to Modified Example 2, it is possible to reduce the manufacturing costs of a wiring substrate as compared with the manufacturing processes according to the first embodiment.

In addition, though a difference in level is generated between the wiring pattern 13 on the lower surface of the resin substrate 11 and the wiring pattern 42 on the lower surface of the buried substrate 100, it becomes possible to superpose the wiring pattern 42 directly on the wiring pattern 13. According to this, the wiring pattern 13 of the core substrate 10 and the wiring pattern 42 of the buried substrate 100 can be continuously linked to each other. In this structure, since it is not needed to cover one surface of the core substrate 10 by the insulating layer, the manufacture of the wiring substrate 8 becomes simple.

Application Example 1

In Application Example 1, other example of a suitable wiring pattern of a core substrate is described. It is to be noted that in Application Example 1, with respect to the same constituent portions as those in the embodiments described already, there may be the case where their explanations are omitted.

[Structure of Wiring Substrate According to Application Example 1]

Figure 30A:
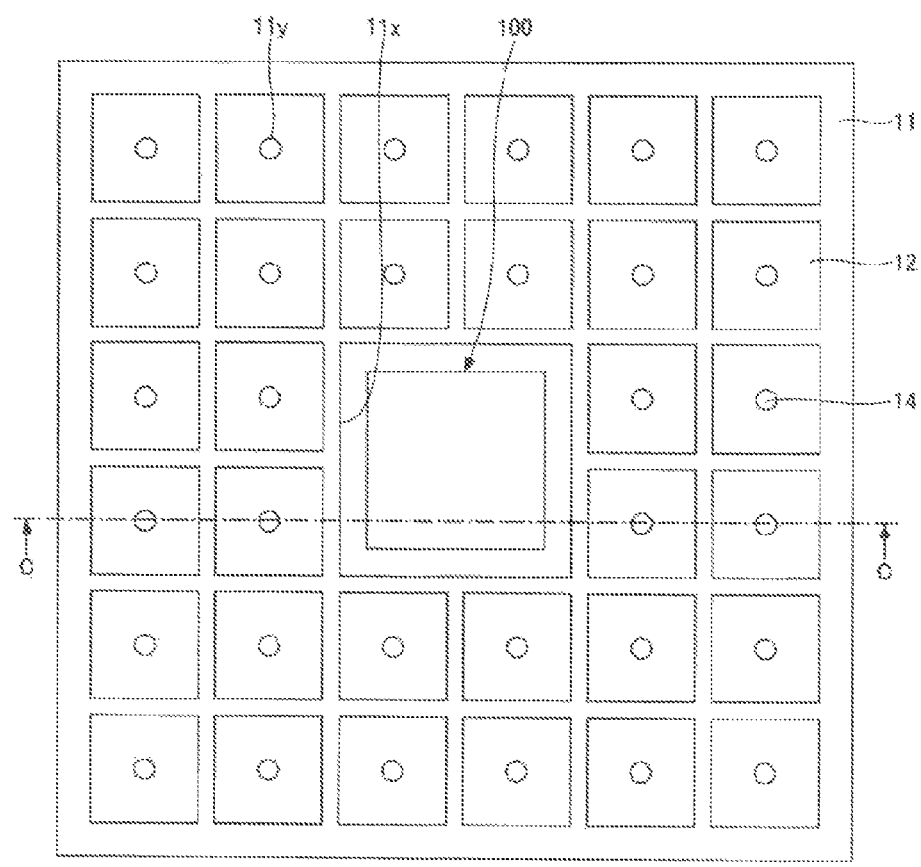
FIGS. 30A to 30B are cross-sectional views illustrating a wiring substrate according to Application Example 1.
Figure 30B:
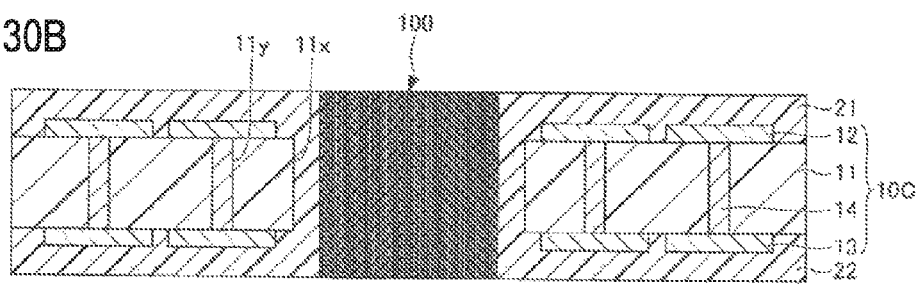

First of all, a structure of the wiring substrate according to Application Example 1 is described. FIGS. 30A to 30B are cross-sectional views illustrating the wiring substrate according to Application Example 1, in which FIG. 30A is a plan view, and FIG. 30B is a cross-sectional view along a C-C line in FIG. 30A. It is to be noted that in FIG. 30A, illustration of the insulating layer 21 is omitted.

Reference is made to FIGS. 30A to 30B. In a core substrate 10C of the wiring substrate according to Application Example 1, the through-holes 11y are formed in a fixed pitch over the entire surface, and the through-wiring 14 is filled in each of the through-holes 11y. A diameter of the through-hole 11y may be, for example, 100 μm or more, and a pitch of the through-holes 11y may be, for example, 300 μm or more.

In the core substrate 10C, the plural wiring patterns 12 having a rectangular planar shape, which are divided in a size smaller than the pitch of the through-holes 11y, are periodically disposed on the upper surface of the resin substrate 11. In addition, the plural wiring patterns 13 having a rectangular planar shape, which are divided in a size smaller than the pitch of the through-holes 11y, are periodically disposed on the lower surface of the resin substrate 11.

The position of the each wiring pattern 12 and the position of the each wiring pattern 13 substantially overlap with each other in planar view. It is to be noted that the planar shape of each of the wiring patterns 12 and 13 may also be a polygon other than the rectangle, a circle, or the like. The wiring pattern 12 and the wiring pattern 13 disposed in a position overlapping with each other in planar view are electrically connected to each other via the through-wiring 14 filling the through-hole 11y.

The insulating layer 21 is formed on the upper surface of the resin substrate 11 and covers the wiring pattern 12. The insulating layer 21 does not cover the buried substrate 100, and the upper surface of the buried substrate 100 is exposed from the upper surface of the insulating layer 21. The upper surface of the insulating layer 21 and the upper surface of the buried substrate 100 can be, for example, made flush with each other by polishing. The insulating layer 22 is formed on the lower surface of the resin substrate 11 and covers the wiring pattern 13. The insulating layer 22 does not cover the buried substrate 100, and the lower surface of the buried substrate 100 is exposed from the lower surface of the insulating layer 22. The lower surface of the insulating layer 22 and the lower surface of the buried substrate 100 can be, for example, made flush with each other by polishing.

The insulating layer 21 is filled in a gap formed by the side surface of the buried substrate 100 and the inner wall surface of the through-hole 11x. However, the insulating layer 22 may be filled in the whole or a part of the gap formed by the side surface of the buried substrate 100 and the inner wall surface of the through-hole 11x. The core substrate 10C is a substrate having high multiplicity of use and may be, for example, used as shown in FIGS. 31A to 31B.

Figure 31A:
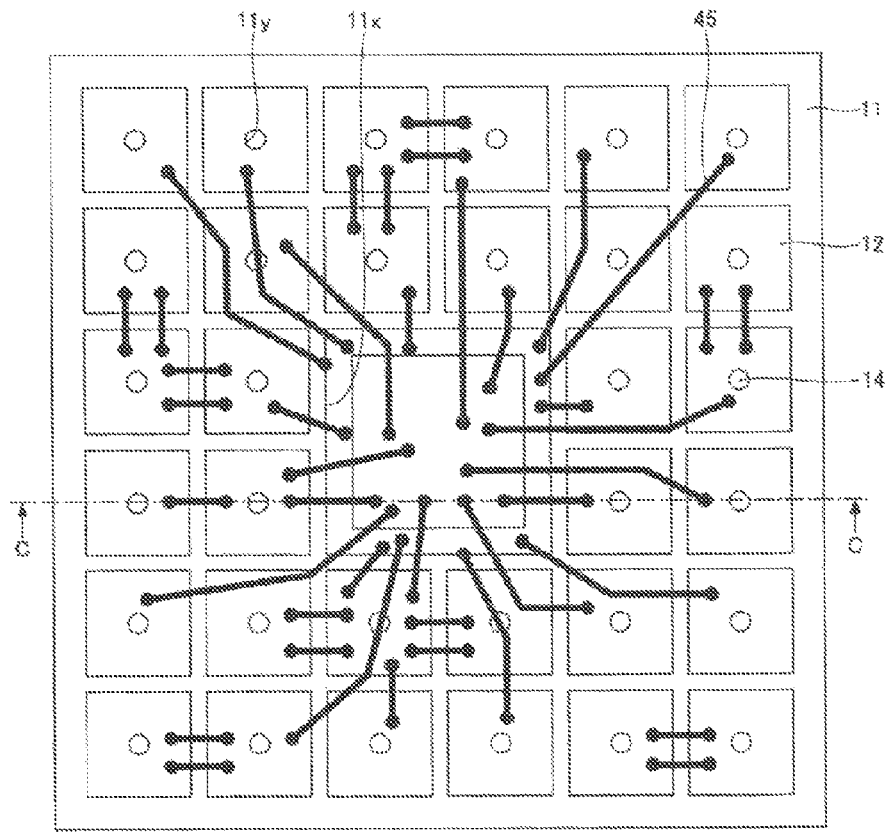
FIGS. 31A to 31B are views explaining a wiring method of an upper layer of the wiring substrate according to Application Example 1.
Figure 31B:
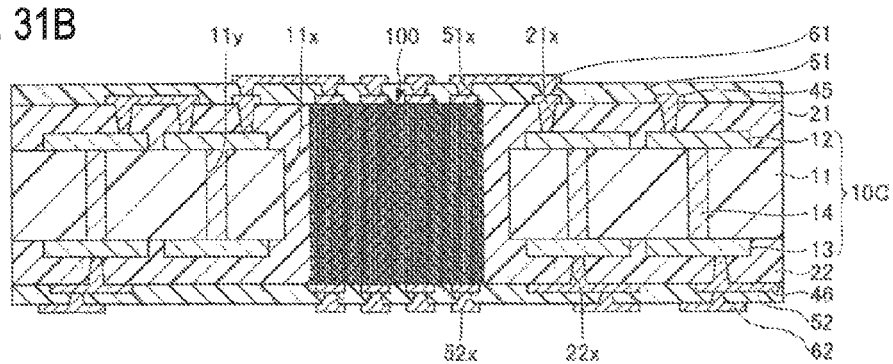

FIGS. 31A to 31B are views explaining a wiring method of an upper layer of the wiring substrate according to Application Example 1, in which FIG. 31A is a plan view, and FIG. 31B is a cross-sectional view along the C-C line in FIG. 31A. It is to be noted that in FIG. 31A, illustration of the insulating layers 21 and 51 is omitted.

Reference is made to FIGS. 31A to 31B. In the wiring layers 45 and 46 serving as upper layers of the insulating layers 21 and 22, respectively, by properly choosing the wiring patterns 12 and 13 and connecting them to each other, it is possible to arbitrarily form a wide power source or ground line, an I/O line, or the like.

In this way, by using the core substrate 10C, via holes and upper wiring layers are formed in the insulating layers 21 and 22 to freely connect the wiring patterns 12 and 13 to each other, whereby various wiring shapes can be realized. On that occasion, a laser processing machine and an LDI (laser direct imaging) exposing apparatus may be used, so that the flexibility at the time of processing can be increased.

In addition, in the core substrate 10C, the through-hole may be formed in any position, and the buried substrate 100 having a high flexibility of design is provided. Therefore, the core substrate 10C becomes a substrate having higher multiplicity of use and can easily cope with the high-mix low-volume production.

In addition, in the core substrate 10C, the through-holes fly (through-wirings 14) formed over the entire surface also act as a heat conduction path, so that the heat dissipation of the wiring substrate can be increased.

In the related-art substrates, the through-hole position, the shape of the thick wiring pattern for power source, and the like vary depending upon the kinds thereof, and hence, the deformation (shrinkage) of the substrate is also variable for every kind. On the other hand, in the core substrate 10C, the shapes of the through-holes 11y (through-wirings 14) and the wiring patterns 12 and 13 are common in all kinds, and its framework has a structure having the same and high multiplicity of use. Therefore, the amount of deformation of the substrate can be made substantially fixed. According to this, even in the case where the kind is changed, it becomes possible to manufacture a wiring substrate at the same shrinkage and design rule, and it becomes possible to commoditize the core substrate as bases of various wiring substrates. According to this, a time for design correction or adjustment of manufacturing conditions which are required every time when the kind is changed can be minimized, and thus, it becomes possible to realize low costs of the manufacturing process.

Application Example 2

In Application Example 2, an example of a semiconductor package having a semiconductor chip mounted in the wiring substrate according to the first embodiment. It is to be noted that in Application Example 2, with respect to the same constituent portions as those in the embodiments described already, there may be the case where their explanations are omitted.

Figure 32:
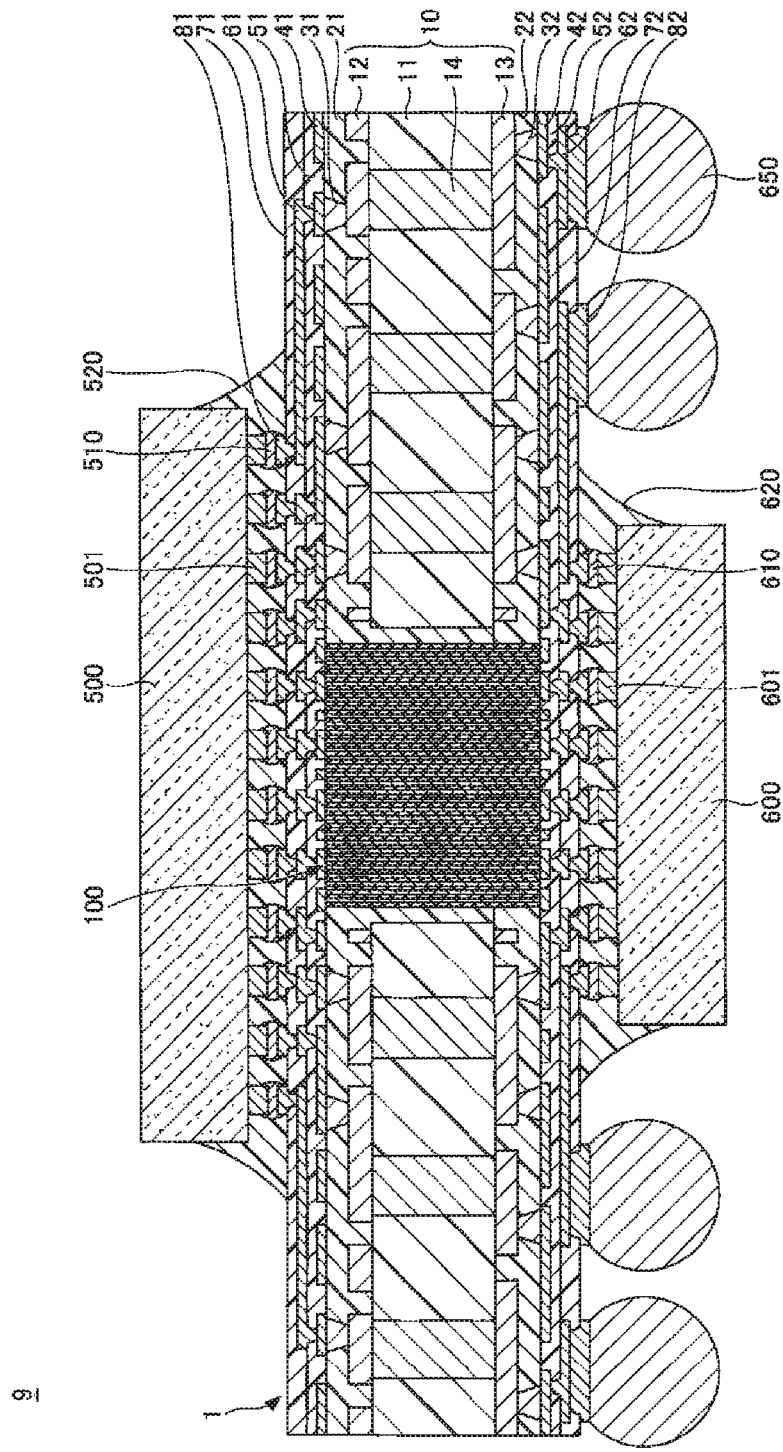
FIG. 32 is a cross-sectional view illustrating a semiconductor package according to Application Example 2.

FIG. 32 is a cross-sectional view illustrating a semiconductor package according to Application Example 2. Reference is made to FIG. 32. A semiconductor package 9 includes the wiring substrate 1, semiconductor chips 500 and 600, bumps 510 and 610, underfill resins 520 and 620, and external connection terminals 650.

The semiconductor chip 500 is mounted on one side of the wiring substrate 1, and an electrode pad 501 of the semiconductor chip 500 is electrically connected to a wiring layer 81 of the wiring substrate 1 via the bump 510. The underfill resin 520 is filled between the semiconductor chip 500 and the insulating layer 71 of the wiring substrate 1.

The semiconductor chip 600 is mounted on the other side of the wiring substrate 1, and an electrode pad 601 of the semiconductor chip 600 is electrically connected to a wiring layer 82 disposed on the side of the center of the wiring substrate 1 via the bump 610. The underfill resin 620 is filled between the semiconductor chip 600 and the insulating layer 72 of the wiring substrate 1. The external connection terminals 650 are formed in the wiring layer 82 disposed on the outer peripheral side of the wiring substrate 1.

As the bumps 510 and 610 and the external connection terminals 650, for example, a solder ball or the like may be used. As a material of the solder ball, for example, an alloy containing Pb, an alloy of Sn and Cu, an alloy of Sn and Sb, an alloy of Sn and Ag, an alloy of Sn, Ag, and Cu, and the like may be used.

In this way, by mounting the semiconductor chips 500 and 600 on the wiring substrate 1, the semiconductor package 9 can be realized. Here, the buried substrate 100 has only to be connected to only necessary portions of the semiconductor chip 500 and the semiconductor chip 600, and hence, the buried substrate 100 may have a size smaller than the planar shape of each of the semiconductor chips 500 and 600. However, the planar shape of the buried substrate 100 may be larger than the planar shape of one or both of the semiconductor chip 500 and the semiconductor chip 600. In this case, the flexibility of disposition of a semiconductor chip having a smaller planar shape than the buried substrate 100 can be improved. In addition, the buried substrate 100 is not always required to be disposed in the center of the core substrate 10 but has only to be disposed in a position suitable for the connection. In addition, a plurality of the buried substrates 100 may be buried in the core substrate 10.

It is to be noted that the semiconductor chips 500 and 600 may have the same shape or may have a different shape from each other. In addition, the semiconductor chips 500 and 600 may have the same function or may have a different function from each other. In addition, a plurality of the semiconductor chips may be mounted on one side or the other side, or the both sides of the wiring substrate 1. In addition, the semiconductor chip may be mounted on only one side of the wiring substrate 1. In addition, the wiring substrates 2 to 8 may also be used in place of the wiring substrate 1.

The present invention has been described in detail with reference to the preferred embodiments and the like. However, it should be construed that the present invention is not limited to foregoing embodiments and the like, and various modifications and substitutions can be applied to the foregoing embodiments and the like without departing from the scope described in the claims.

What is claimed is:

1. A wiring substrate comprising:
a core layer including a resin substrate and a through-hole penetrating through the resin substrate in a thickness direction;
a buried substrate including a plate-like body and a plurality of linear conductors penetrating the plate-like body in the thickness direction, the buried substrate being disposed within the through-hole of the core layer;
a first insulating layer covering a first surface of the resin substrate;
a first pad pattern formed on a first surface of the buried substrate; and
a third wiring pattern formed on the first surface of the resin substrate and covered by the first insulating layer, wherein
in the plurality of linear conductors, a gap between the adjacent linear conductors is smaller than a diameter of each of the linear conductors,
a thickness of the third wiring pattern is greater than a thickness of the first pad pattern,
the first insulating layer comprises a first layer covering the first surface of the resin substrate and an outer peripheral portion of the first surface of the buried substrate, and exposing the first pad pattern and an inner portion of the first surface of the buried substrate, the inner portion of the first surface of the buried substrate being disposed within the outer peripheral portion of the first surface of the buried substrate, and a second layer covering the first pad pattern and extending on the first layer,
the wiring substrate further comprises: a fifth wiring pattern formed on the second layer, the fifth wiring pattern connected to the first pad pattern and connected to the third wiring pattern, and
the first layer is disposed in a space between an inner wall surface of the through-hole and a side wall of the buried substrate, and covers side surfaces of the buried substrate.

2. The wiring substrate according to claim 1, wherein the third wiring pattern is exposed within an opening portion formed at the first layer, and the second layer is formed so that it is filled within the opening portion, and the wiring substrate further comprises:
a via formed in a via hole penetrating through the second layer filled within the opening portion, the via connecting the third wiring pattern and the fifth wiring pattern.

3. The wiring substrate according to claim 1, wherein the first layer is made of a photosensitive insulating resin.

4. The wiring substrate according to claim 1, comprising:
a second insulating layer covering a second surface of the resin substrate;
a second pad pattern formed on a second surface of the buried substrate; and
a fourth wiring pattern formed on the second surface of the resin substrate and covered by the second insulating layer, wherein
the first pad pattern and the second pad pattern are disposed opposite to each other via the buried substrate and are connected to each other via the plurality of linear conductors.

5. The wiring substrate according to claim 4, further comprising:
a second wiring layer including a second wiring pattern formed on a second surface of the second insulating layer.

6. The wiring substrate according to claim 4, wherein:
the second insulating layer comprises a third layer covering the second surface of the resin substrate and an outer peripheral portion of the second surface of the buried substrate, and exposing the second pad pattern and an inner portion of the second surface of the buried substrate, the inner portion of the second surface of the buried substrate being disposed within the outer peripheral portion of the second surface of the buried substrate, and a fourth layer covering the second pad pattern and extending on the third layer, and
the wiring substrate further comprises:
a sixth wiring pattern formed on the fourth layer, the sixth wiring pattern being connected to the second pad pattern through a via extending through the fourth layer and connected to the fourth wiring pattern through a via extending through the third layer and the fourth layer.

7. A semiconductor package comprising:
the wiring substrate according to claim 1; and
a semiconductor chip electrically connecting to an outermost wiring layer in the wiring substrate.

8. The wiring substrate according to claim 4, wherein the first insulating layer and the second insulating layer are made of different resins.

9. The wiring substrate according to claim 1, wherein the inner portion of the first surface of the buried substrate is a continuous region exposed from the first layer, and disposed within the outer peripheral portion of the first surface of the buried substrate covered by the first layer, and a surface area of the inner portion of the first surface of the buried substrate is greater than a surface area of the outer peripheral portion of the first surface of the buried substrate.

10. The wiring substrate according to claim 6, wherein the inner portions of the first surface and the second surface of the buried substrate are continuous regions respectively exposed from the first layer and the second layer, and are disposed within respective outer peripheral portions of the first surface and the second surface of the buried substrate respectively covered by the first layer and the second layer, and a surface area of each of the inner portions of the first and second surfaces of the buried substrate is greater than a surface area of each of the respective outer peripheral portions of the first surface and the second surface of the buried substrate.

\* \* \* \* \*